United States Patent [19]
Ogura et al.

[11] Patent Number: 6,114,727
[45] Date of Patent: Sep. 5, 2000

[54] SEMICONDUCTOR DEVICE

[75] Inventors: Tsuneo Ogura, Kamakura; Masakazu Yamaguchi, Kawasaki, both of Japan

[73] Assignee: Kabushiki Kaisha Toshiba, Kawasaki, Japan

[21] Appl. No.: 09/003,829

[22] Filed: Jan. 7, 1998

[30] Foreign Application Priority Data

Jan. 9, 1997 [JP] Japan ................................. 9-001765
Aug. 18, 1997 [JP] Japan ................................. 9-270367

[51] Int. Cl.[7] .......................... H01L 29/739; H01L 29/94
[52] U.S. Cl. .......................... 257/342; 257/212; 257/330; 257/331
[58] Field of Search ................................. 257/212, 330, 257/331, 342, 339

[56] References Cited

U.S. PATENT DOCUMENTS

| | | | |
|---|---|---|---|
| 4,543,596 | 9/1985 | Strack et al. | 257/342 |
| 4,584,593 | 4/1986 | Tihanyi | 257/342 |
| 4,630,084 | 12/1986 | Tihanyi | 257/342 |
| 4,641,163 | 2/1987 | Tihanyi | 257/342 X |
| 4,743,952 | 5/1988 | Baliga | 257/342 |
| 5,329,142 | 7/1994 | Kitagawa et al. | |
| 5,381,026 | 1/1995 | Shinohe et al. | |
| 5,623,151 | 4/1997 | Ajit | 257/212 |

FOREIGN PATENT DOCUMENTS 6-252408 9/1994 Japan.
8-78670 3/1996 Japan.

*Primary Examiner*—John Guay
*Attorney, Agent, or Firm*—Oblon, Spivak, McClelland, Maier & Neustadt, P.C.

[57] ABSTRACT

A semiconductor device comprises a high-resistance n type base layer, an n type drain layer formed on one surface of the n type base layer, p type base layers selectively formed at the other surface of the n type base layer, n type source layers selectively formed at surfaces of the p type base layers, p type injection layers selectively formed at the other surface of the n type base layer in regions different from regions where the n type source layers and p type base layers are formed, a trench selectively formed to extend from a surface of each n type source layer through the p type base layer into the n type base layer, a first gate electrode buried in the trench with an insulating film interposed, a drain electrode formed on the n type drain layer, a source electrode formed on the n type source layer, and a second gate electrode formed on the p type injection layer.

10 Claims, 75 Drawing Sheets n+ CHANNEL  n−  p+
SOURCE      BASE  EMITTER
LAYER16     LAYER11  LAYER12

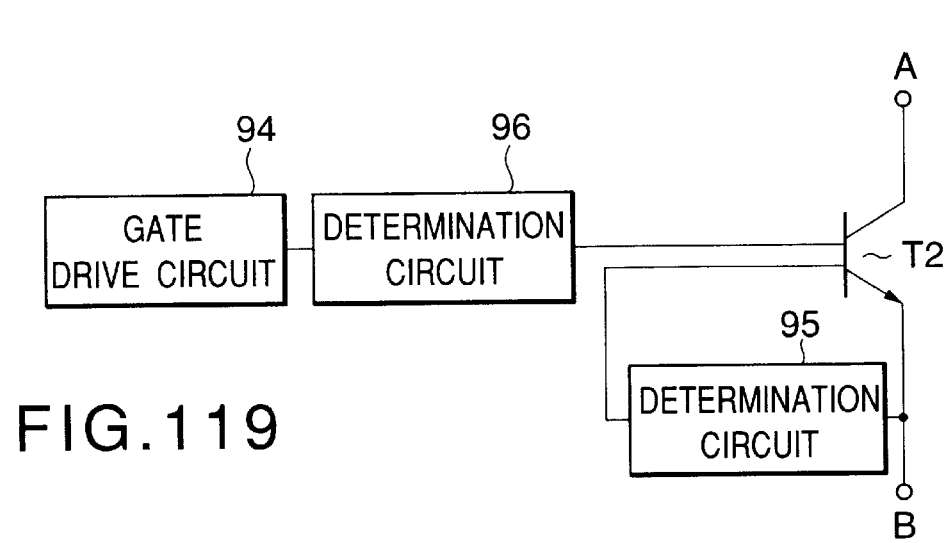
FIG.118
FIG.119
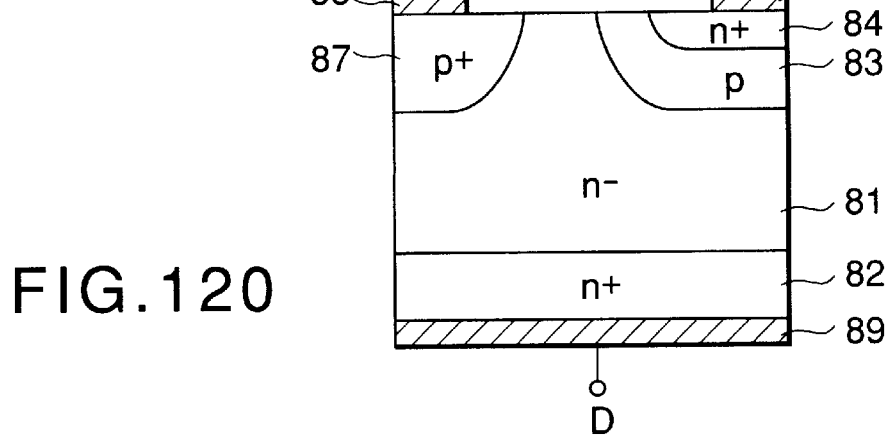
FIG.120

94 GATE DRIVE CIRCUIT

SEMICONDUCTOR DEVICE

BACKGROUND OF THE INVENTION

The present invention relates generally to semiconductor devices, and more particularly to bipolar semiconductor devices suitable as power switching elements.

Power MOSFETs have conventionally been used as power semiconductor devices having breakdown voltages of about 1,000 V or less.

Two types of these power MOSFETs have been widely known; one having a planar structure with a plate-shaped gate, and the other having a trench structure with a gate buried in a trench. It is generally thought that the trench structure is more advantageous than the planar structure in that the channel resistance can be easily reduced and the amount carriers to be injected in one chip can be easily increased.

FIG. 1 is a cross-sectional view showing a structure of a power MOSFET having this kind of trench structure. In this MOSFET, a low-concentration n− type base layer 2 and a p type base layer 3 are formed on a high-concentration n+ type drain layer 1. An n+ type source layer 4 is selectively formed on the p type base layer 3. A trench 5 is formed to extend from the n+ type source layer 4 through the p type base layer 3 into the n− type base layer 2. A gate electrode 7, surrounded by an insulating film 6, is formed in the trench 5.

On the other hand, a drain electrode 8 is formed on that surface of the n+ type drain layer 1, which is opposite to the surface thereof facing the n− type base layer 2. A source electrode 9 is formed on the n+ type source layer 4 and p type base layer 3 so as to be in contact with both layers 4 and 3.

The power MOSFET operates as follows.

When a positive voltage is applied to the drain electrode 8 and a negative voltage is applied to the source electrode 9, if a voltage which is positive relative to the source electrode is applied to the gate electrode 7, the conductivity of the surface of the p type base layer 3, which is in contact with the gate electrode 7, is inverted to the n-type, and electrons e are injected from the n+ type source layer into the n− type base layer 2 through the layer with inverted conductivity, and flow into the n+ type drain layer 1. Thus, the device is rendered conductive.

This power MOSFET is a so-called simple injection device using only the flow of current, and there is problem in that the resistance (on-resistance) in the turn-on state is high. The on-resistance results in a loss in the turn-on state of the device. The on-resistance is a very important characteristic which determines the conversion efficiency of a power electronics device, and therefore the on-resistance should be sufficiently low.

A description will now be given of an IGBT (Insulated Gate Bipolar Transistor) which can solve the above problem and is used as a power semiconductor device with a breakdown voltage of about 2,000 V or less.

FIG. 2 is a cross-sectional view showing the structure of the IGBT. In the IGBT, the n+ type drain layer 1 shown in FIG. 1 is replaced with a p+ type drain layer 10.

If a positive voltage is applied to the gate electrode 7, as with the above-described case, electrons e are injected into the n− type base layer 2 and reach the p+ type drain layer 10. As a result, holes h are injected from the p+ type drain layer 10 into the n− type base layer 2. Thus, both electrons e and holes h are injected in the n− type base layer 2, and a conductivity modulation occurs. Accordingly, the on-voltage can be reduced.

However, in the conductive state of the IGBT, the electrons e and holes h have to pass through a barrier of a built-in voltage provided between the n− type base layer 2 and p+ type drain layer 10. Consequently, the on-resistance, in particular, at the time of turn-on, cannot fully be reduced.

In brief, as shown in a current/voltage characteristic graph of FIG. 3, the power MOSFET has a problem in that the on-resistance is generally high as the inclination of on-current is gentle. The IGBT, on the other hand, has a problem in that the on-resistance is increased due to the built-in voltage of about 0.7 V at the time of turn-on.

In the field of modern power electronics technology, there is a demand for smaller sizes and higher performances of the power devices. Accordingly, power semiconductor devices have been required to have higher breakdown voltage, higher current, lower loss, and higher operation speed. In particular, in order to reduce the loss of the semiconductor device, it is necessary to reduce the above-mentioned on-voltage (constant loss) and turn-off loss. For this purpose, various device structures have been researched and developed.

Among others, there is known a semiconductor device with a feature of low on-voltage, which has a structure described, for example, in H. R. Chang et al., "MOS Trench Gate Field Controlled Thyristor", IEDM 89, pp. 293–296, 1989. This semiconductor device is an electrostatic induction thyristor having a buried insulated gate structure, for example, as shown in FIG. 4.

In FIG. 4, a high-concentration p+ type emitter layer 12 is formed on a surface of a high-resistance n− type base layer 11, and a plurality of striped trenches 13 are selectively are formed in the other surface of the base layer 11. An insulated gate electrode 15 is buried in each of the trenches 13, with a gate insulating film 14 interposed. An n+ type source layer 16 is formed on a surface of the n− type base layer 11 between the trenches 13 so as to be in contact with side surfaces of the trenches 13. A p type layer 17 is formed on a surface of the n− type base layer 11 in a peripheral region of an end of each trench 13 so as to be in contact with each trench and the n+ type source layer 16.

A drain electrode 18 is formed on that surface of the p+ type emitter layer 12, which is opposite to the surface thereof facing the n− type base layer 11.

A source electrode (not shown) is provided on the n+ type source layer 16 and p type layer 17 so as to be in contact with both layers 16 and 17.

FIG. 5 shows a potential distribution along line A–A' extending from the n+ type source layer 16 of this electrostatic induction thyristor through the center of an inter-trench region 19 to the drain electrode 18.

In the on-state of this semiconductor device, a zero potential, which is zero relative to the source, is applied to the insulated gate electrode 15. At this time, as shown in FIG. 5B, this semiconductor device operates as a p+nn+ diode, and the inter-trench region 19 functions as current path. Specifically, electrons e are injected from the n+ type source layer 16 via the inter-trench region 19 (n− region lying between the trenches) into the n− type base layer 11, and the holes h matching with the electrons e are injected from the p+ type emitter layer 12 into the n− type base layer 11. Thus, the n− type base layer 11 is filled with a great amount of accumulated carriers.

Thus, the semiconductor device is operable with a low on-voltage. This semiconductor device is of a normally-on type wherein the device is turned on when no voltage is applied to the insulated gate electrode 15.

On the other hand, in a turn-off operation, a negative voltage, which is negative relative to the source, is applied to the insulated gate electrode 15. Thereby, a depletion layer is formed in the inter-trench region 19 near the side surfaces of the trenches 13 and, as shown in FIG. 5A, a potential barrier against the electrons e is formed by pinching-off and the injection of electrons is stopped. Besides, part of the holes h in the n− type base layer 11 is discharged to the source electrode via the p type layer 17, and the other part of holes h is recombined with the electrons e and extinguished. Thus, the semiconductor device is turned off.

Even in this type of semiconductor device, however, there is a problem in that the on-voltage cannot be decreased to a built-in voltage VB or less. The reason is that a pn junction is formed by the p+ type emitter layer 12 and n− type base layer 11 and the built-in voltage VB of the pn junction is included in the on-voltage≠(VN+VB) of the device. The symbol VN denotes a voltage drop in the n− type base layer 11.

This semiconductor device has another problem in that the turn-off performance is low. This problem arises due to the absence of a mechanism for positively discharging the great amount of accumulated carriers in the n− type base layer 11 at the time of turn-off. In particular, if discharge of holes h is delayed, no depletion layer is formed in the inter-trench region 19. Consequently, injection of electrons e from the n+ type source layer 16 does not stop, and injection of holes h from the p+ type emitter layer 12 is continued. Thus, the semiconductor device cannot be turned off.

The above description relates to the power semiconductor device having the trench structure. Next, a description will be given of a planar-structure power transistor which is a typical medium capacity device most widely used at present in various fields.

FIG. 6 is a cross-sectional view showing the structure of an npn power transistor. In this power transistor, a high-concentration n− type collector layer 1a is formed on a surface of a high-resistance n type base layer 2a. A p type base layer 3a is formed on the other surface of the n− type base layer 2a. An n+ type emitter layer 4a is selectively formed on a surface of the p type base layer 3a. A base electrode 7a is formed on that region of the surface of the p type base layer 3a, which differs from the region where the n+ type emitter layer 4a is formed. A collector electrode 8a is provided on the n+ type collector layer 1a, and an emitter electrode 9a is provided on the n+ type emitter layer 4a.

This power transistor operates as follows.

Suppose a positive potential is applied to the collector electrode 8a and a zero voltage is applied to the emitter electrode 9a. At the time of turn-on, the base electrode 7a is supplied with a positive potential which is higher than a built-in voltage of a pn junction formed by the p type base layer 3a and n+ type emitter layer 4a.

Thus, as shown in FIG. 7, holes are injected into the n+ type emitter layer 4a from the base electrode 7a through the p type base layer 3a, and electrons e are injected from the n+ type emitter layer 4a into the p type base layer 3a. Part of the electrons e is recombined with the holes h in the p type base layer 3a and extinguished. However, since the p type base layer 3a is very thin and the collector electrode 8a is biased to a positive potential, most of the electrons e is injected from the p type base layer 3a into the n− type base layer 2a and then flows to the collector electrode 8a through the n+ type collector layer 1a. If the electrons e are injected in the n− type base layer 2a, the holes h are injected in the n− type base layer 2a as well, so as to meet the condition of charge neutralization. Thereby, conductivity modulation occurs and the power transistor is rendered conductive.

On the other hand, at the time of turn-off, the base electrode 7a is supplied with a negative potential which is lower than a breakdown voltage of the pn junction formed by the p type base layer 3a and n+ type emitter layer 4a. Thereby, the base/emitter path is reversely biased, and injection of electrons from the n+ type emitter layer 4a is stopped. In addition, the holes h accumulated in the n− type base layer 2a are discharged from the base electrode 7a, and the device is turned off.

This power transistor is characterized in that the holes h are injected from the p type base layer 3a into the n− type base layer 2a and thus the conductivity modulation occurs in the n− type base layer 2a, whereby the on-voltage can be reduced and a large current can be controlled.

However, in the conventional power transistor, most of the hole current injected from the base electrode 7a in the turn-on state does not flow to the n− type base layer 2a but flows directly to the n+ type emitter layer 4a through the p type base layer 3a. Consequently, a large base current is required and a current gain (DC amplification factor: $h_{FE}$=IC/IB) is low.

Moreover, at the time of turn-off, a negative voltage exceeding a base/emitter breakdown voltage cannot be applied to the base electrode 7a. Thus, the turn-off performance is low.

In the meantime, in the case where the above-described power semiconductor device is applied to a switching circuit for an inverter circuit or a chopper circuit, a demand for a smaller size and a higher performance of the power semiconductor device has increased more and more.

In the case of the inverter circuit, a load has an inductance component like a motor control. When the power transistor serving as a switching element is turned off, energy accumulated in the inductance of the load needs to be discharged. In order to circulate this electric energy, the inverter circuit, as shown in FIG. 8, comprises circulation diodes (freewheel diodes) D1 to D4 which are connected in reverse-parallel to power transistors T1 to T4. Base signals $I_{B1}$ to $I_{B4}$ are applied to the bases of power transistors T1 to T4 by driver circuits (not shown).

For example, if base signals $I_{B1}$ to $I_{B4}$ are applied to the power transistors T1 to T4, as shown in FIG. 9, an output voltage $V_{inv}$ is applied to a load. Specifically, a dead time for switching is considered, and the base signals $I_{B1}$ to $I_{B2}$ are not simultaneously turned on/off, as shown in FIG. 10. The output voltage $V_{inv}$ corresponds to the base signal $I_{B1}$, and a freewheel current $I_{D1}$ of the freewheel diode D1 is inverse to the base signal $I_{B1}$. The actual output voltage $V_{inv}$ corresponds to the base signal subjected to pulse width modulation (PWM), as shown in the waveform of FIG. 11.

In this inverter circuit, a breakdown voltage higher than the power supply voltage is achieved by the power transistors T1 to T4 and freewheel diodes D1 to D4. Thus, a junction end region of a predetermined area or more is required in the semiconductor chip.

Accordingly, reduction in chip area is difficult, and high current density cannot be achieved.

When this inverter circuit is constructed as modules, the freewheel diodes D1 to D4 are externally connected to the power transistors T1 to T4. The power transistor chip and the freewheel chip are mounted on a single substrate, and electrodes on the chips are connected to external led-out electrodes by means of wiring. Owing to an inductance of connection wiring, a high-speed operation is difficult.

As has been described above, the conventional semiconductor device has the problems in that the on-voltage cannot be lowered to the built-in voltage or less, and the turn-off performance is low.

Furthermore, there are the problem of low current gain and the problem of low turn-off performance.

Besides, there is the problem in that the freewheel diodes D1 to D4 are connected in inverse-parallel to the power transistors T1 to T4 and consequently high current density cannot be achieved and high-speed operation cannot be performed due to inductance in the connection wiring.

BRIEF SUMMARY OF THE INVENTION

An object of the present invention is to provide a semiconductor device capable of achieving a low on-voltage and a high turn-off performance at the same time.

Another object of the invention is to increase a current gain and a turn-off performance more than in the prior art.

Still another object of the invention is to provide a semiconductor device having a smaller size and a higher performance with simple structure.

In order to achieve the objects, according to a first aspect of the present invention, there is provided a semiconductor device comprising:

a high-resistance first-conductivity-type base layer;

a first-conductivity-type drain layer formed on one surface of the first-conductivity-type base layer;

a first-conductivity-type source layer formed at the other surface of the first-conductivity-type base layer;

a second-conductivity-type injection layer formed at the other surface of the first-conductivity-type base layer in a region different from a region where the first-conductivity-type source layer is formed;

a barrier layer formed at the other surface of the first-conductivity-type base layer between the first-conductivity-type source layer and the second-conductivity-type injection layer;

a first main electrode formed on the first-conductivity-type drain layer;

a second main electrode formed on the first-conductivity-type source layer; and a gate electrode formed on the second-conductivity-type injection layer.

In the on-state, a major carrier path is formed to connect at least the second main electrode, first-conductivity-type source layer, first-conductivity-type base layer, first-conductivity-type drain layer and first main electrode. Accordingly, there is no built-in voltage due to a pn junction in the major carrier path. Minor carriers are injected from the second-conductivity-type injection layer provided away from the major carrier path and are accumulated in the first-conductivity-type base layer by virtue of the barrier layer. Thus, a conductivity modulation occurs and an on-resistance can be reduced. At the time of turn-off, the polarity of the gate electrode is reversed, and minor carriers are positively discharged from the second-conductivity-type injection layer. Therefore, a low on-voltage and a high turn-off performance can be achieved at the same time.

According to a second aspect of the invention, there is provided a semiconductor device comprising:

a high-resistance first-conductivity-type base layer;

a first-conductivity-type drain layer formed on one surface of the first-conductivity-type base layer;

a first-conductivity-type source layer formed at the other surface of the first-conductivity-type base layer;

a second-conductivity-type injection layer formed at the other surface of the first-conductivity-type base layer in a region different from a region where the first-conductivity-type source layer is formed;

a trench formed at the other surface of the first-conductivity-type base layer between the first-conductivity-type source layer and the second-conductivity-type injection layer;

a first main electrode formed on the first-conductivity-type drain layer;

a second main electrode formed on the first-conductivity-type source layer; and a gate electrode formed on the second-conductivity-type injection layer.

Accordingly, the barrier layer according to the first aspect of the invention can be realized by using the trench.

According to a third aspect of the invention, there is provided a semiconductor device comprising:

a high-resistance first-conductivity-type base layer;

a first-conductivity-type drain layer formed on one surface of the first-conductivity-type base layer;

a second-conductivity-type base layer formed at the other surface of the first-conductivity-type base layer;

a first-conductivity-type source layer formed at one surface of the second-conductivity-type base layer;

a second-conductivity-type injection layer formed at the other surface of the first-conductivity-type base layer in a region different from a region where the second-conductivity-type base layer is formed;

a trench formed at the other surface of the first-conductivity-type base layer between the second-conductivity-type base layer and the second-conductivity-type injection layer so as to extend from a surface of the first-conductivity-type source layer through the second-conductivity-type base layer into the first-conductivity-type base layer, the trench serving as a carrier barrier between the second-conductivity-type injection layer and the first-conductivity-type source layer;

a first gate electrode buried in the trench with an insulating film interposed;

a first main electrode formed on the first-conductivity-type drain layer;

a second main electrode formed on the first-conductivity-type source layer; and a second gate electrode formed on the second-conductivity-type injection layer.

Accordingly, the major carrier path includes a second-conductivity-type base layer between the first-conductivity-type source layer and the first-conductivity-type base layer, and the barrier layer according to the first aspect of the invention is realized by the first gate electrode buried in the trench with the insulating film interposed. Thus, a MOS structure wherein an inversion layer can be formed at a surface portion of the second-conductivity-type base layer with a voltage of the first gate electrode can be obtained. Therefore, the reduction in channel resistance, which is an advantage of the trench structure, and the increase in amount of injected carriers per unit area can be achieved. Furthermore, advantageous effects corresponding to both the first and second aspects of the invention, can be attained.

According to a fourth aspect of the invention, there is provided a semiconductor device comprising:

a high-resistance first-conductivity-type base layer;

a first-conductivity-type drain layer formed on one surface of the first-conductivity-type base layer;

a first-conductivity-type source layer formed at the other surface of the first-conductivity-type base layer;

a second-conductivity-type injection layer formed at the other surface of the first-conductivity-type base layer in a region different from a region where the first-conductivity-type source layer is formed;

a trench formed at the other surface of the first-conductivity-type base layer between the first-conductivity-type source layer and the second-conductivity-type injection layer so as to extend into the first-conductivity-type base layer and to sandwich at least the first-conductivity-type source layer, the trench serving as a carrier barrier between the second-conductivity-type injection layer and the first-conductivity-type source layer;

a first gate electrode buried in the trench with an insulating film interposed;

a first main electrode formed on the first-conductivity-type drain layer;

a second main electrode formed on the first-conductivity-type source layer; and a second gate electrode formed on the second-conductivity-type injection layer.

In the above structure, the first gate electrode buried in the trench, which serves as the barrier layer according to the first aspect of the invention, with an insulating film interposed, is formed to be in contact with the first-conductivity-type source layer and first-conductivity-type base layer of the major carrier path. Thus, a normally-on type device wherein a depletion layer can be formed at a surface portion of the first-conductivity-type base layer by a voltage of the first gate electrode can be realized. In addition, the reduction in channel resistance, which is an advantage of the trench structure, and the increase in amount of injected carriers per unit area can be achieved. Furthermore, advantageous effects corresponding to both the first and second aspects of the invention, can be attained.

According to a fifth aspect of the invention, the first and second gate electrodes in the third or fourth aspect of the invention are electrically connected to each other in the third and fourth aspects of the invention.

Since the first and second gate electrodes are electrically connected to each other, the following advantage is attained in addition to the advantageous effects of the third and fourth aspects of the invention. That is, the first gate electrode for turning on/off the major carrier path and the second gate electrode for injecting/discharging minor carriers can be controlled at the same time, and the gate drive control is made easier.

According to a sixth aspect of the invention, there is provided a semiconductor device comprising:

a high-resistance first-conductivity-type base layer;

a first-conductivity-type drain layer formed on one surface of the first-conductivity-type base layer;

a second-conductivity-type base layer formed at the other surface of the first-conductivity-type base layer;

a first-conductivity-type source layer formed at one surface of the second-conductivity-type base layer;

a first gate electrode formed at the second-conductivity-type base layer between the first-conductivity-type base layer and the first-conductivity-type source layer, with a gate insulating film interposed;

a second-conductivity-type injection layer formed at the other surface of the first-conductivity-type base layer in a region spaced apart from the second-conductivity-type base layer by a predetermined distance;

a first main electrode formed on the first-conductivity-type drain layer;

a second main electrode formed on the first-conductivity-type source layer; and a second gate electrode formed on the second-conductivity-type injection layer.

In the above structure, a second gate electrode for injecting/discharging minor carriers is provided separately from the first gate electrode for turning on/off major carriers. In the on-state, since the entire hole current injected from the second gate flows into the first-conductivity-type base layer, a gate current can be reduced and a high current gain can be attained. In addition, at the time of turn-off, a negative voltage exceeding a base-emitter breakdown voltage can be applied to the second gate electrode, and a high turn-off performance can be achieved.

According to a seventh aspect of the invention, the first gate electrode in the sixth aspect of the invention is buried in a trench extending from a surface of the first-conductivity-type source layer through the second-conductivity-type base layer into the first-conductivity-type base layer, with the gate insulating film interposed.

Thus, a semiconductor device with a trench structure, which can bring about the advantages of the sixth aspect of the invention, can be realized.

According to an eighth aspect of the invention, the first gate electrode in the sixth aspect of the invention is provided on the second-conductivity-type base layer and the first-conductivity-type base layer between the first-conductivity-type source layer and the second-conductivity-type injection layer, with the gate insulating film interposed.

At the time of turn-on, a channel is formed by a positive voltage of the first gate electrode at a surface portion of the second-conductivity-type base layer. At the time of turn-off, a potential of the second-conductivity-type base layer is fixed at a negative potential level by a negative voltage of the first and second gate electrodes through the channel region below the second gate electrode and the second-conductivity-type injection layer. Thus, an erroneous trigger due to noise can be prevented.

According to a ninth aspect of the invention, a semiconductor device comprising:

a high-resistance first-conductivity-type base layer;

a first-conductivity-type drain layer formed on one surface of the first-conductivity-type base layer;

a second-conductivity-type base layer formed at the other surface of the first-conductivity-type base layer;

a first-conductivity-type source layer formed at one surface of the second-conductivity-type base layer;

a first second-conductivity-type injection layer formed at the other surface of the first-conductivity-type base layer in a region different from a region where the second-conductivity-type base layer is formed;

a second second-conductivity-type injection layer formed at the other surface of the first-conductivity-type base layer in a region different from a region where the first second-conductivity-type injection layer is formed;

a first main electrode formed on the first-conductivity-type drain layer;

a second main electrode formed on the first-conductivity-type source layer;

a first gate electrode formed at the first second-conductivity-type injection layer;

a second gate electrode formed at the second second-conductivity-type injection layer; and one of a diode and a MOSFET inserted between the first main electrode and the second gate electrode.

In the above structure, the function of the reverse-parallel freewheel diode is built in the device. The device has the switching function by the injection of second-conductivity carriers from the first first-conductivity-type injection layer due to the positive voltage of the first gate electrode in the forward current direction. The device also has the conduction characteristics by the injection of second-conductivity-type carriers from the second second-conductivity-type injection layer due to the reverse voltage of the second gate electrode received from the second main electrode through the diode in the reverse current direction. Accordingly, if the reverse electromotive force due to an induction load occurs, the semiconductor device is automatically turned on. In the case of a MOSFET, the MOSFET has conduction characteristics due to the injection of the second-conductivity-type carriers if the channel of the MOSFET is rendered conductive. As with the case of the diode, if the reverse electromotive force occurs due to the induction load, the semiconductor device is automatically turned on in the reverse current direction. Accordingly, the reverse-parallel freewheel diode is dispensed with, and thus a higher current density and a higher operation speed are achieved. Moreover, a reduction in size and enhancement of performance can be achieved.

Additional description will now be given of the above semiconductor device.

The trenches (or barrier layers) may be formed to have cyclic-striped plan-view shapes or mesh-like plan-view shapes. First inter-trench regions having first-conductivity-type source layers at their surfaces and second inter-trench regions having second-conductivity-type injection layers at their surfaces may be arranged among the trenches, with a predetermined ratio between the first and second inter-trench regions. This ratio may be, for example, 1:1, 2:1, 3:1, or a desired one. For example, when the ratio is 2:1, two first inter-trench regions and one second inter-trench region are alternately arranged.

In consideration of the accumulation of injected second-conductivity-type carriers in the first-conductivity-type base layer, it is preferable that the width of the first inter-trench region be less than the width of the second inter-trench region.

In the devices according to the first to ninth aspects of the invention, the drain structure may be modified such that a second-conductivity type layer is selectively formed in a surface portion of the first-conductivity type drain layer, which is in contact with the drain electrode. With this modification, the breakdown voltage can be increased, in addition to the advantages of the first to ninth aspects of the invention.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 118 is a circuit block diagram showing a function of the semiconductor device according to the present invention;

FIG. 119 is a circuit block diagram showing a function of the semiconductor device according to the present invention;

FIG. 120 is a cross-sectional view showing a basic structure of a semiconductor device according to the present invention, which is applied to a main switching element;

FIG. 123 is a view showing a basic structure of a gate drive circuit applicable to the circuit block shown in FIG. 122;

FIG. 124 shows a basic structure of a gate drive circuit suitably applied to the circuit block shown in FIG. 122;

FIG. 125 is a cross-sectional view showing the structure of a semiconductor device according to a 55th embodiment of the invention;

FIG. 126 is a timing chart for describing the operation of the 55th embodiment;

FIG. 127 is a graph showing on-characteristics in forward and reverse current directions in the semiconductor device shown in FIG. 125;

FIG. 128 shows a carrier distribution in the on-state in forward current direction in the 55th embodiment;

FIG. 129 shows a carrier distribution in the on-state in reverse current direction in the 55th embodiment;

FIG. 130 is a cross-sectional view showing the structure of a semiconductor device according to a 56th embodiment of the invention;

FIG. 131 is a cross-sectional view showing the structure of a semiconductor device according to a 57th embodiment of the invention;

FIG. 132 is a cross-sectional view showing the structure of a semiconductor device according to a 58th embodiment of the invention;

FIG. 133 is a cross-sectional view showing the structure of a semiconductor device according to a 59th embodiment of the invention;

FIG. 134 is a cross-sectional view showing the structure of a semiconductor device according to a 60th embodiment of the invention;

Figure 135:
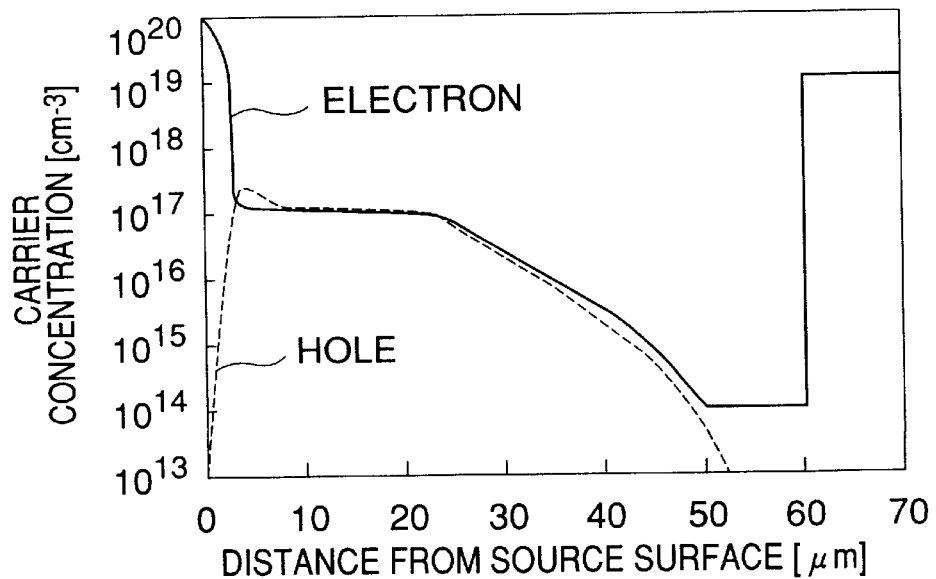
Figure 136:
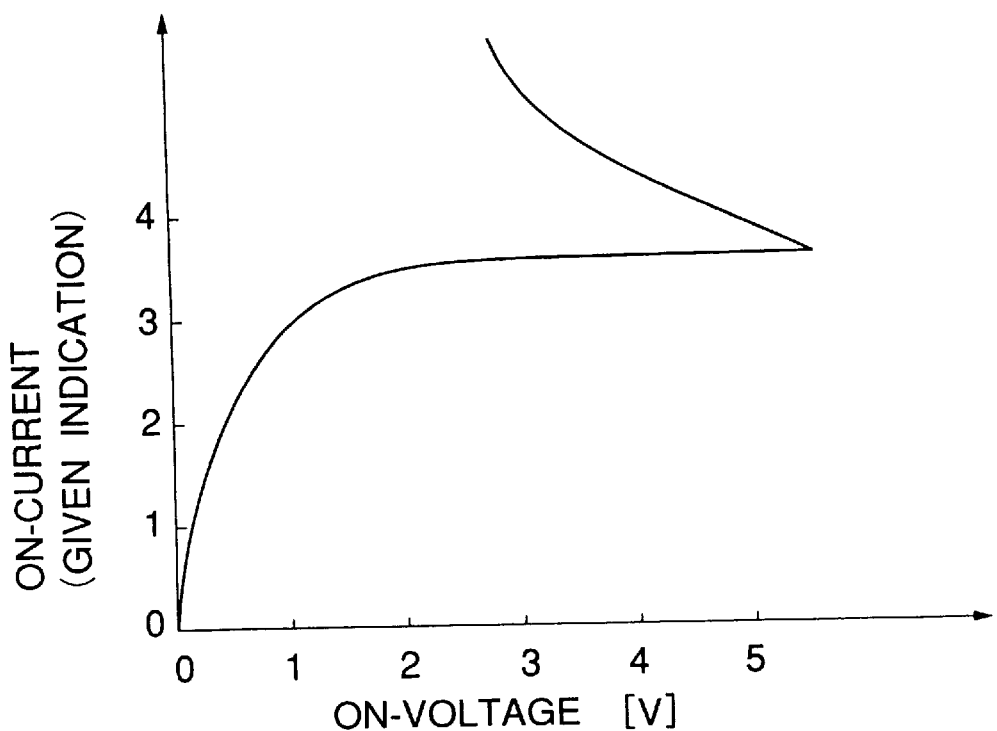
Figure 137:
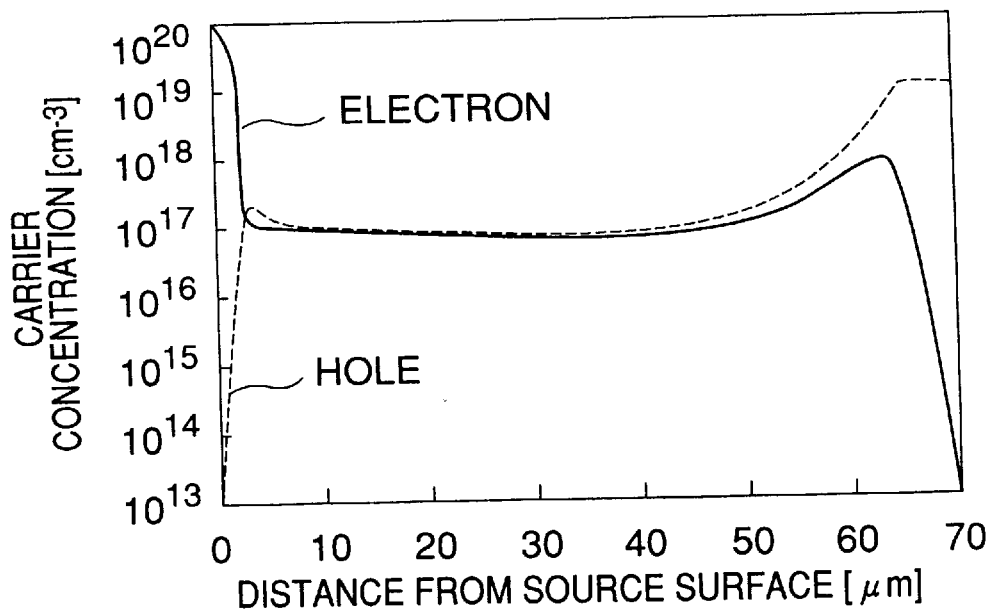

FIG. 135 shows a carrier concentration distribution in the on-state of the first embodiment in the 60th embodiment;

FIG. 136 shows the current/voltage characteristics of the first embodiment in the 60th embodiment; and FIG. 137 shows a carrier concentration distribution in the on-state in forward current direction in the 60th embodiment.

DETAILED DESCRIPTION OF THE INVENTION

Embodiments of the present invention will now be described with reference to the accompanying drawings.

(First Embodiment)

Figure 1:
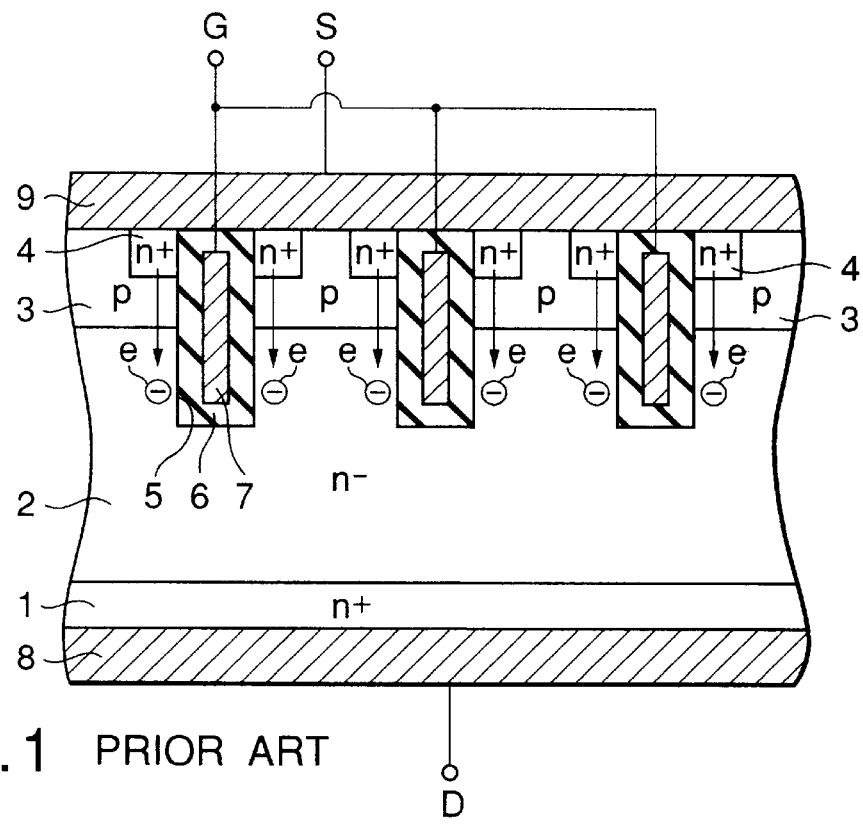
FIG. 1 is a cross-sectional view showing the structure of a power MOSFET having a conventional trench structure.
Figure 2:
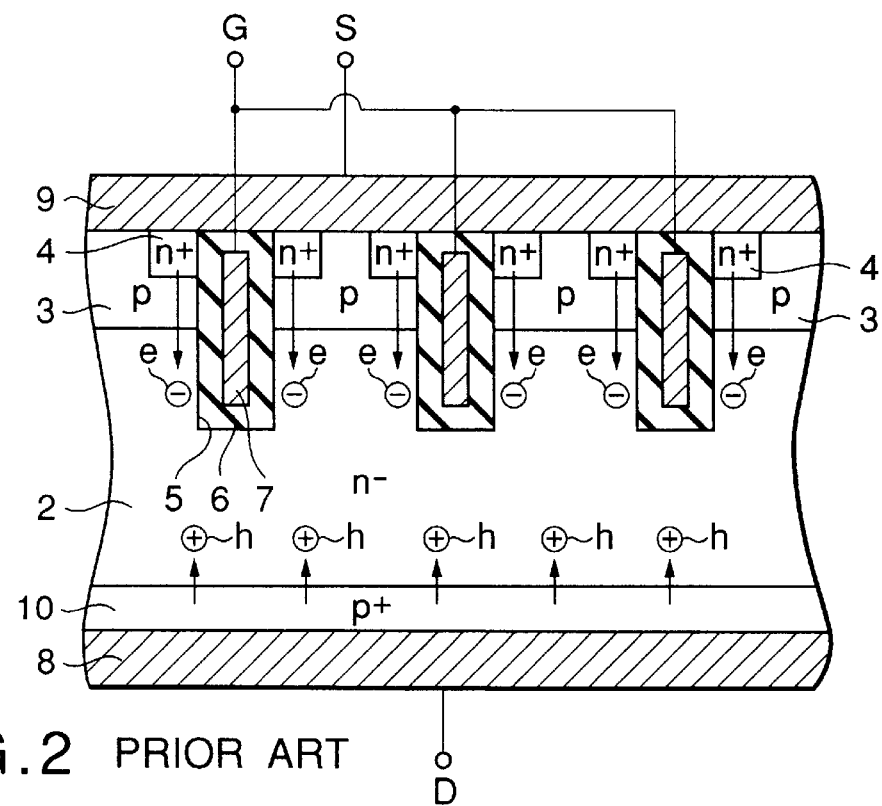
FIG. 2 is a cross-sectional view showing the structure of a conventional IGBT.
Figure 3:
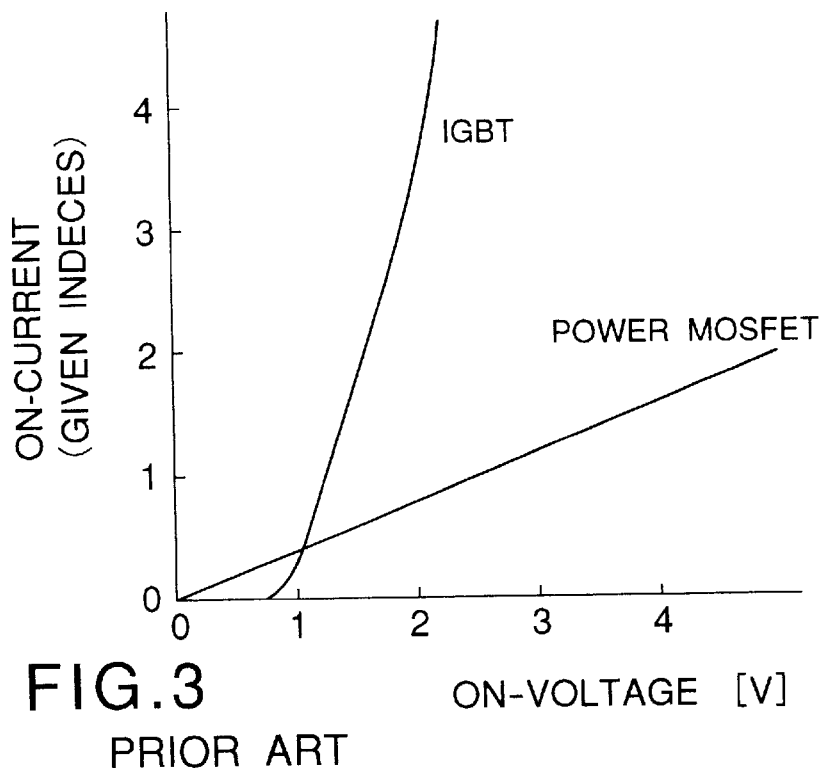
FIG. 3 is a graph showing current/voltage characteristics of the conventional IGBT and power MOSFET.
Figure 4:
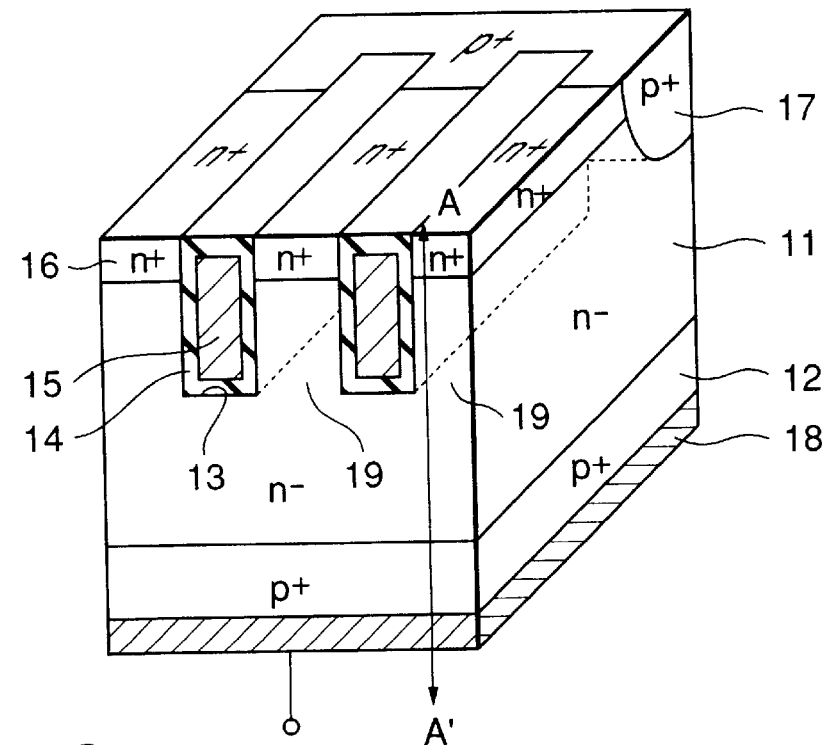
FIG. 4 is a cross-sectional view showing the structure of a conventional electrostatic induction thyristor.
Figure 5A:
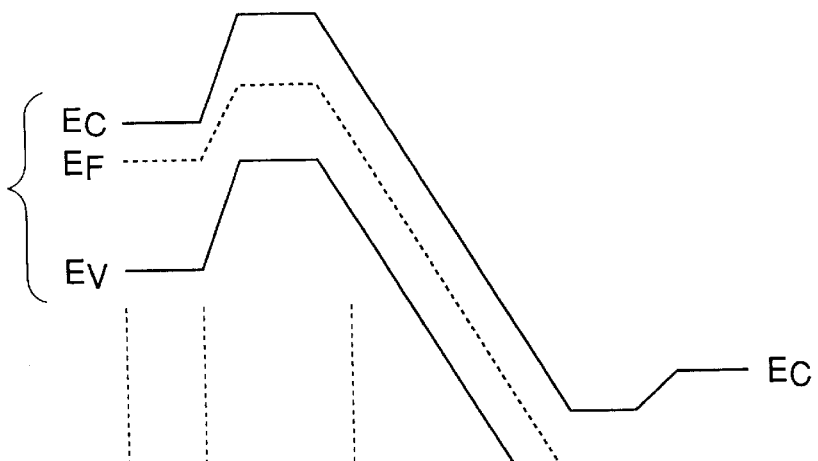
FIGS. 5A and 5B show potential distributions along a main carrier path of the conventional electrostatic induction thyristor.
Figure 5B:
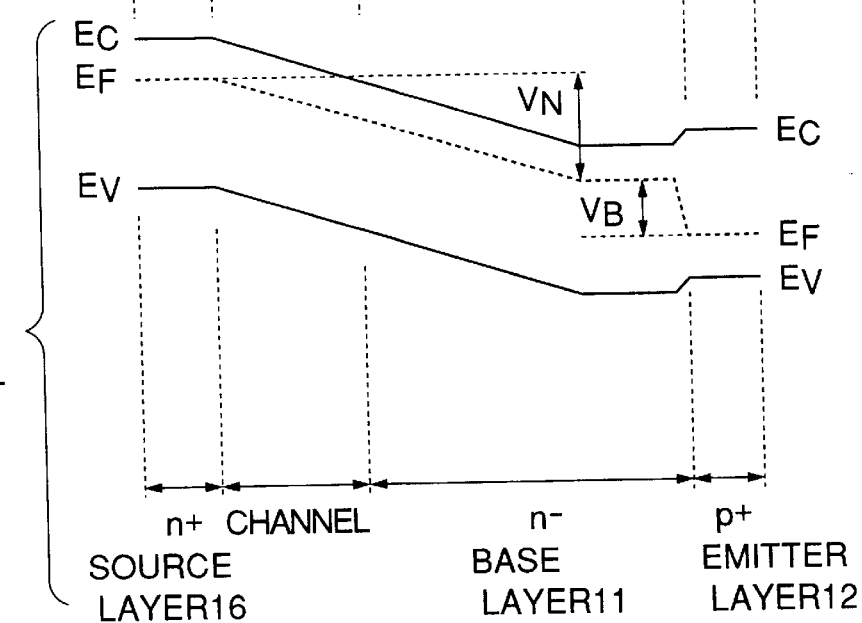
Figure 6:
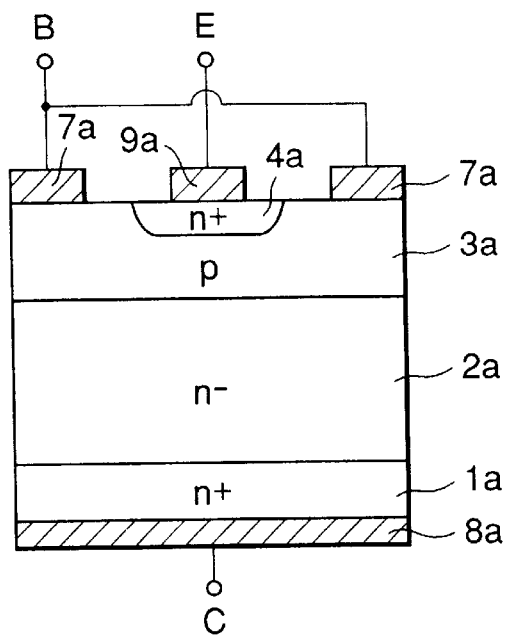
FIG. 6 is a cross-sectional view showing the structure of a conventional npn power transistor.
Figure 7:
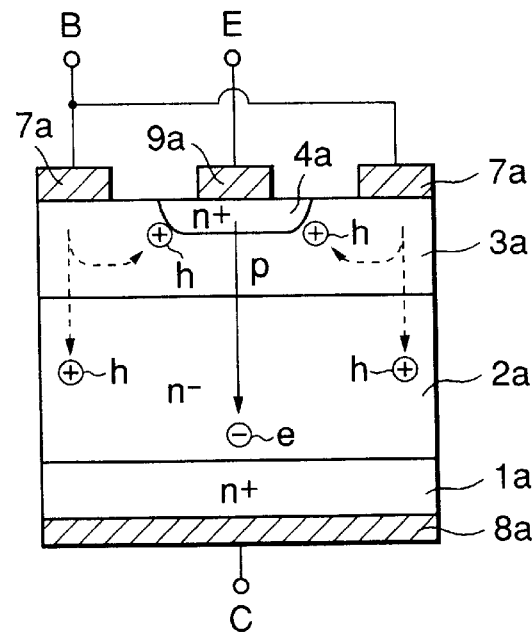
FIG. 7 shows a flow of carriers in the conventional npn power transistor.
Figure 8:
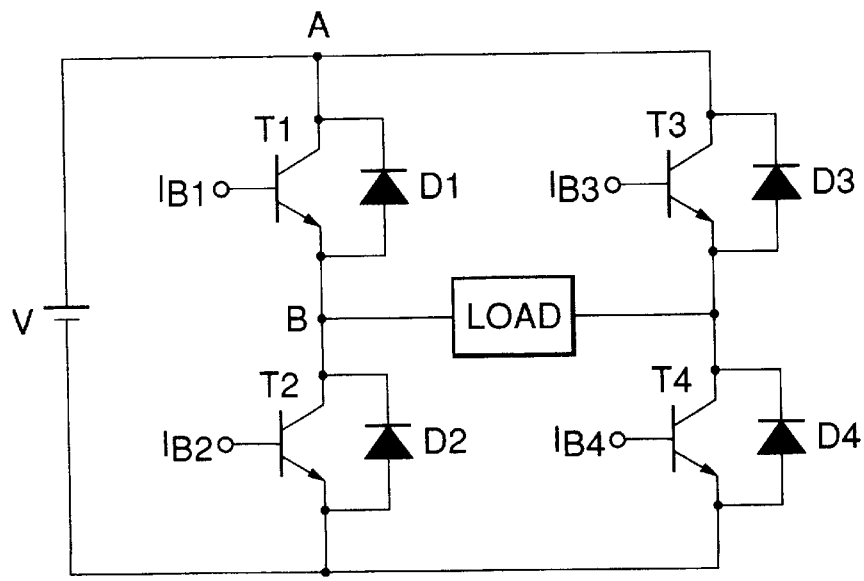
FIG. 8 is a circuit diagram showing a general inverter circuit.
Figure 9:
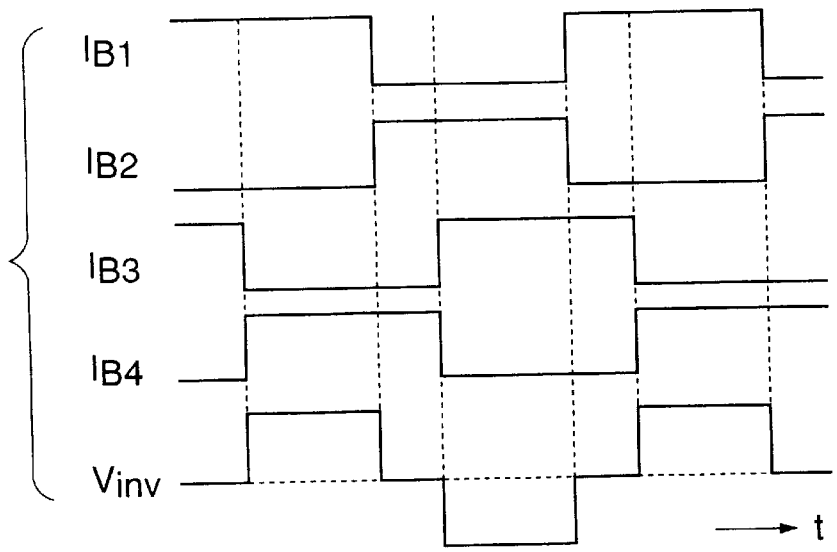
FIG. 9 is a timing chart illustrating the operation of the general inverter circuit.
Figure 10:
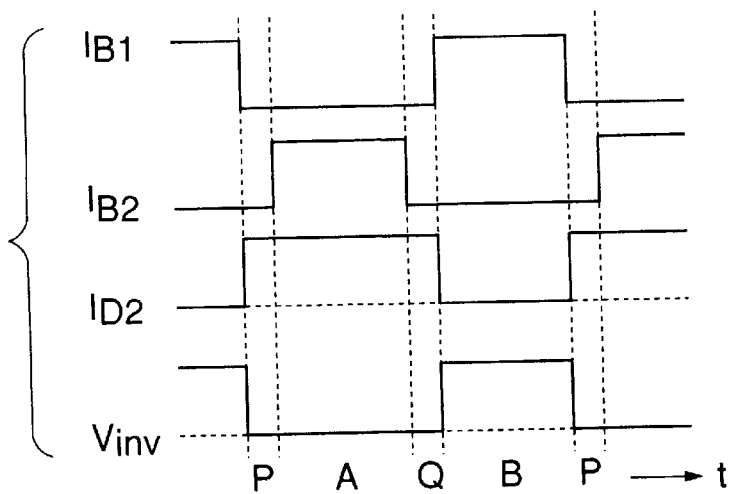
FIG. 10 is a timing chart illustrating the operation of the general inverter circuit.
Figure 11:
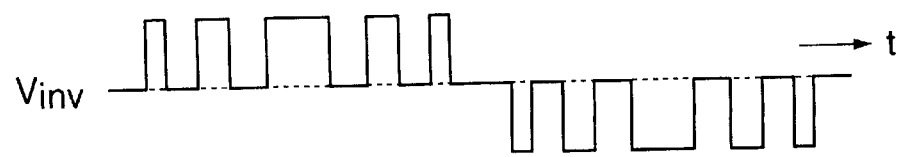
FIG. 11 is a timing chart showing a PWM-controlled output voltage waveform of the general inverter circuit.
Figure 12:
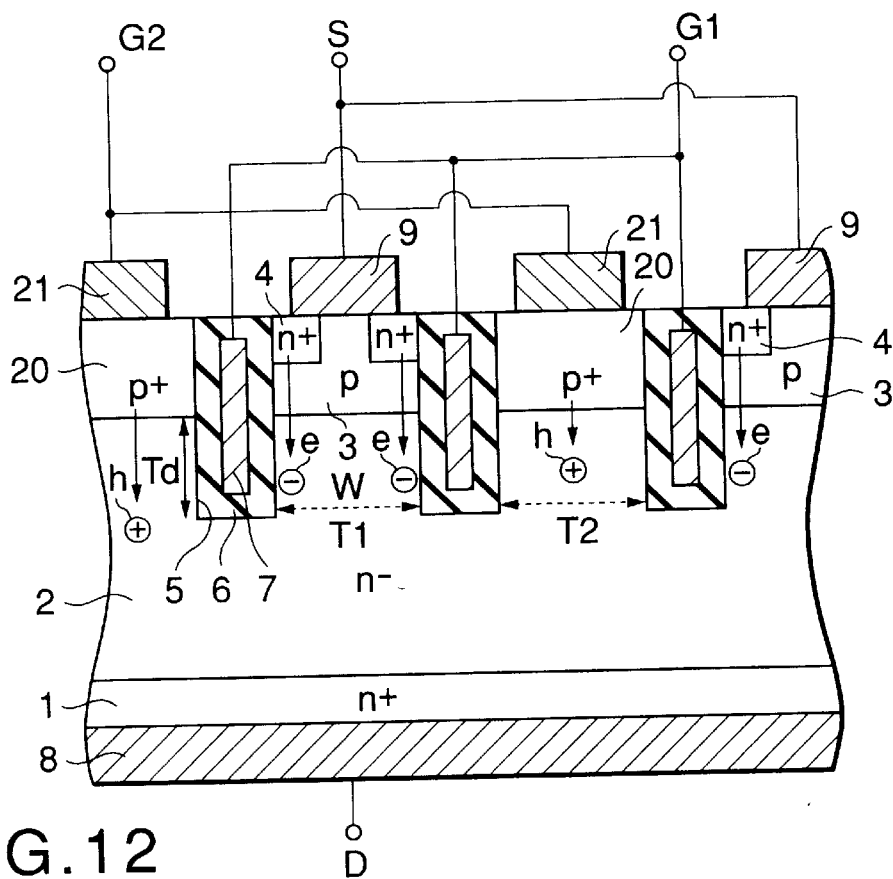
FIG. 12 is a cross-sectional view showing the structure of a semiconductor device according to a first embodiment of the present invention.

FIG. 12 is a cross-sectional view showing the structure of a semiconductor device according to a first embodiment of the present invention. The structural elements common to those in FIG. 2 are denoted by like reference numerals, and a detailed description thereof is omitted. Only different parts will be described. Throughout the following descriptions, like reference numerals denote like structural elements.

This semiconductor device is designed to achieve conductivity modulation by injection of holes and to eliminate a built-in voltage due to a pn junction. Specifically, as shown in FIG. 12, a first inter-trench region Ti having a first surface structure comprising a p type base layer 3 and n+ type source layer 4, like prior art, and a second inter-trench region T2 having a second surface structure comprising a p+ type injection layer 20 formed in a surface portion of an n– type base layer 2 are alternately arranged.

A hole injecting gate electrode (hereinafter referred to as "second gate electrode") 21 is provided on a surface of the p+ type injection layer 20. For the purpose of clearer understanding, the aforementioned channel forming gate electrode 7 (i.e. insulated gate electrode buried in the trench) is hereinafter referred to as "first gate electrode 7."

This semiconductor device operates as follows.

In the state in which a positive voltage is applied to the drain electrode 8 and a negative voltage is applied to the source electrode 9, if a positive voltage which is positive relative to the source electrode 9 is applied to the first gate electrode 7 and second gate electrode 21, the conductivity type of that portion of the p type base layer 3, which interfaces with the insulating layer 6, is inverted to an n-type, and becomes an inversion layer (channel). Electrons e are injected from the n+ type source layer 4 into the n– type base layer 2 through the inversion layer, and flow to the n+ type drain layer 1.

At this time, holes h are injected from the p+ type injection layer 20 into the n– type base layer 2 by the positive voltage of the second gate electrode 21 and are accumulated in this n– type base layer 2. Thus, a conductivity modulation occurs in the n– type base layer 2 and the on-resistance is reduced.

Figure 13:
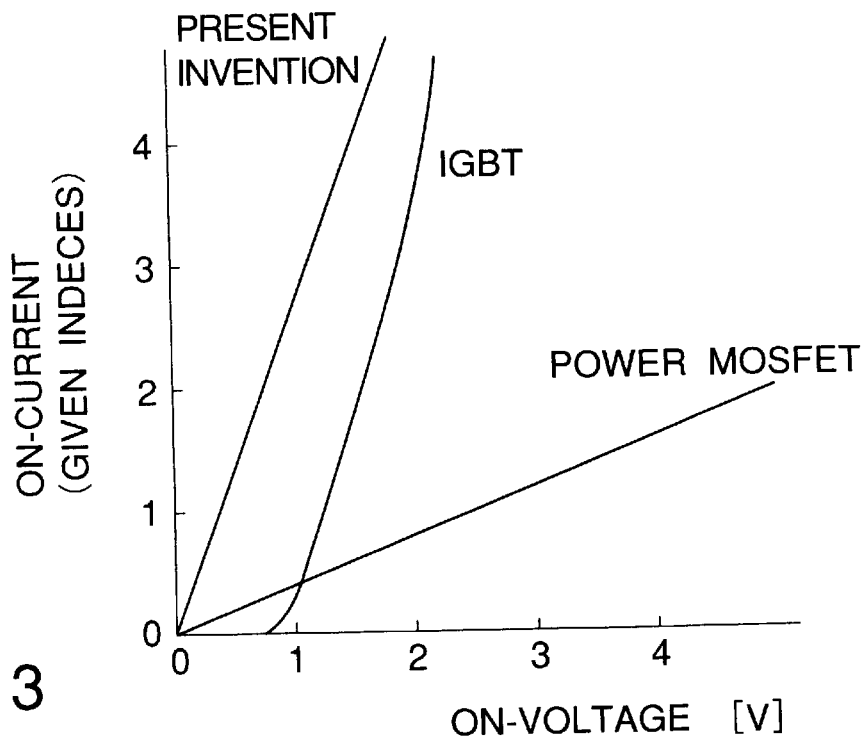
FIG. 13 is a graph comparing the current/voltage characteristics of the semiconductor device according to the first embodiment and those of the conventional IGBT and power MOSFET.

In the above case, there is no pn junction in a main current path (connecting the n+ type source layer 4, inversion layer, n– type base layer 2 and n+ type drain layer 1). Thus, an increase in on-resistance due to a built-in voltage can be prevented. Thus, as shown in FIG. 13, the semiconductor device having a lower on-resistance than the IGBT can be obtained.

Figure 14A:
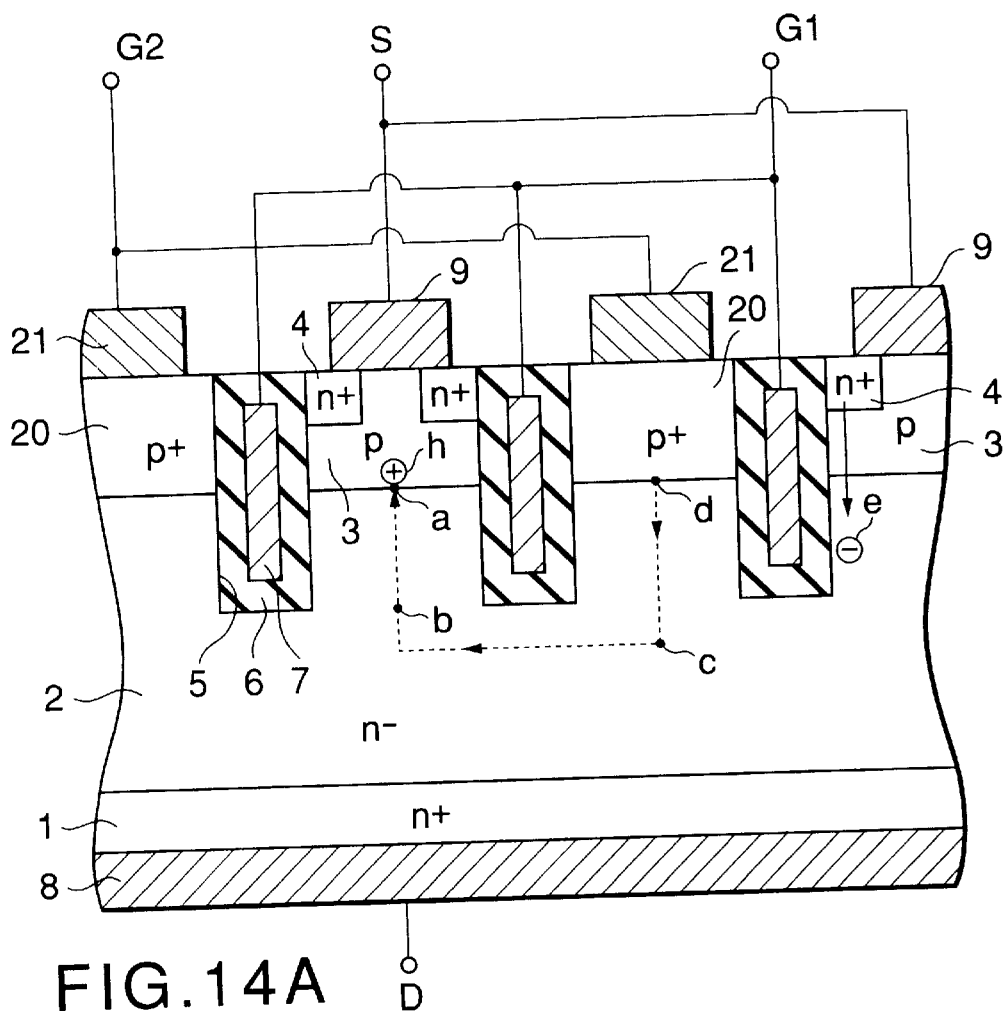
FIGS. 14A and 14B show a distribution of hole density along a hole current path in the first embodiment.
Figure 14B:
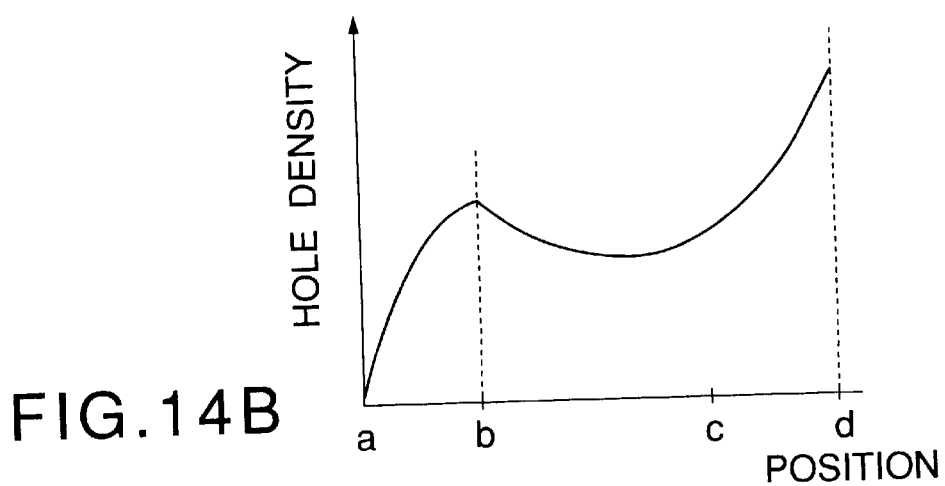

The holes h injected from the p+ type injection layer 20, as shown in FIG. 14A, circumvent the trench gate and reach the p type base layer 3, and then flow to the source electrode 9. Specifically, since the holes are accumulated in a bottom portion of the first inter-trench region T1, a hole density distribution along the path of hole current has a maximum value at the bottom portion of the first inter-trench region T1, as shown in FIG. 14B.

In this case, in order to accumulate the holes h, it is important that the injected holes h flow deep into the n– type base layer 2 by the presence of the trench gate, and the first inter-trench region T1 is so narrow as to prevent smooth flow of holes h into the p type base layer. For example, a trench interval W in the first inter-trench region T1 should preferably be 4 µm or less. In addition, in order to increase a hole discharge resistance and accumulate carriers, it is desirable that the width of the first inter-trench region T1 be less than the width of the second inter-trench region.

Moreover, in order to make it difficult for holes h to reach the p type base layer 3, the depth Td of the trench 3 projecting from the p+ type injection layer 20, like the trench interval w, is important. Specifically, it is preferable that the trench depth Td be about 3 to 20 µm.

The present invention is characterized in that the above-described structure can be easily achieved in combination with the trench structure.

On the other hand, in order to turn off this semiconductor device, a negative voltage which is negative relative to the source electrode is applied to the first gate electrode 7 and second gate electrode 21. Injection of electrons e is stopped by the negative voltage of the first gate electrode 7. In addition, the injected holes h are discharged to the source electrode 9 and second gate electrode 21 by the negative voltage of the source electrode 9 and second gate electrode 21. Thereby the semiconductor device is turned off.

According to the first embodiment, as described above, in the on-state the path of electrons e runs through the source electrode 9, n+ type source layer 4, inversion layer, n– type base layer 2, n+ type drain layer 1 and drain electrode 8. Accordingly, the built-in voltage VB caused by a pn junction is not present in the path of electrons e. In addition, holes h are injected from the p+ type injection layer 20 provided outside the path of electrons e, and the conductivity modulation is caused to lower the on-resistance. Since the p+ type injection layer 20 having a higher impurity concentration than that of the p type base layer 3 is used as an inject ion layer, an injection efficiency of holes is increased.

Besides, the holes h are accumulated in the n– type base layer 2 at the bottom portion of the first inter-trench region T1 by the resistance of the first inter-trench region T1. Therefore, the emitter injection efficiency can be enhanced.

Because of these, a low on-voltage is obtained. In particular, an on-voltage not higher than the built-in voltage can be obtained.

At the time of turn-off, the polarity of the second gate electrode 21 is reversed and holes h are positively discharged from the p+ type injection layer 20. Thus, a high turn-off performance can be achieved. Moreover, the high turn-off performance can be achieved along with the aforementioned low on-voltage.

A decrease in channel resistance and an increase in carrier injection amount per unit area, which are advantages of the trench structure, can be achieved. Since the MOS structure is adopted, this semiconductor device can be easily manufactured by using conventional device manufacturing techniques.

(Second Embodiment)

A semiconductor device according to a second embodiment of the present invention will now be described.

Figure 15:
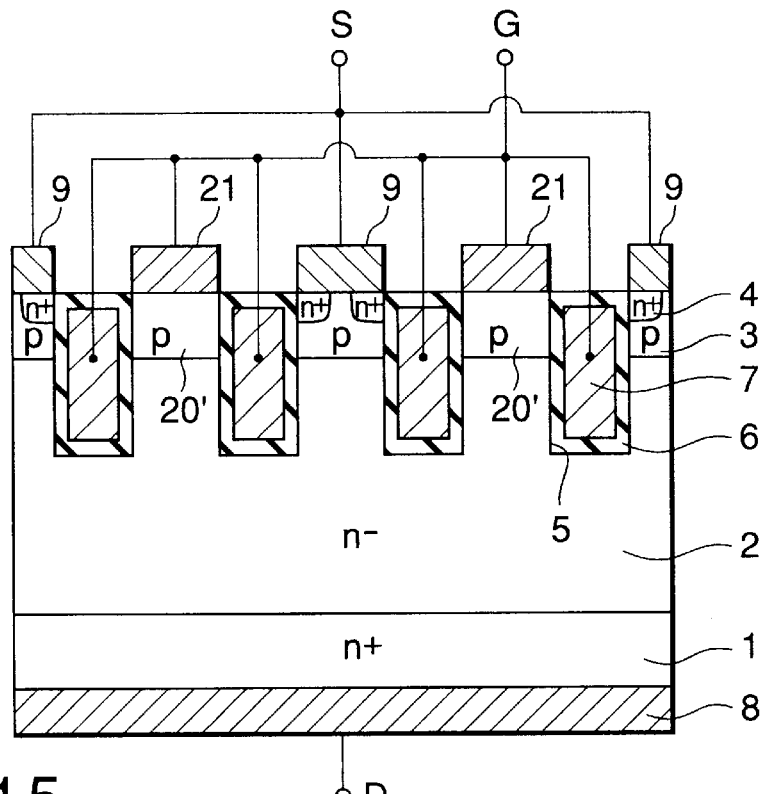
FIG. 15 is a cross-sectional view showing the structure of a semiconductor device according to a second embodiment of the invention.

FIG. 15 is a cross-sectional view showing the structure of this semiconductor device, which is a modification of the structure shown in FIG. 12.

Specifically, the present embodiment is a modification of the first embodiment. As is shown in FIG. 15, the first gate electrode 7 and second gate electrode 21 are electrically connected at a node which is connected to a terminal G. The terminal G is connected to a gate drive circuit (not shown).

Also, the p type injection layer 20' having substantially the same impurity concentration as that of the p type base layer 3 is formed instead of the p+ type injection layer 20 of high impurity concentration. The p+ type injection layer 20' and the p type base layer 3 are may be formed simultaneously or separately. In the case that they are separately formed, the p+ type injection layer 20' may be formed with a lower impurity concentration than that of the p type base layer 3.

Because of the above structure, the gate drive circuit can be commonly used, and the structure thereof can be simplified.

Also, in the case that they are simultaneously formed, a manufacturing process can be simplified in comparison with the case of the separately forming.

(Third Embodiment)

A semiconductor device according to a third embodiment of the present invention will now be described.

Figure 16:
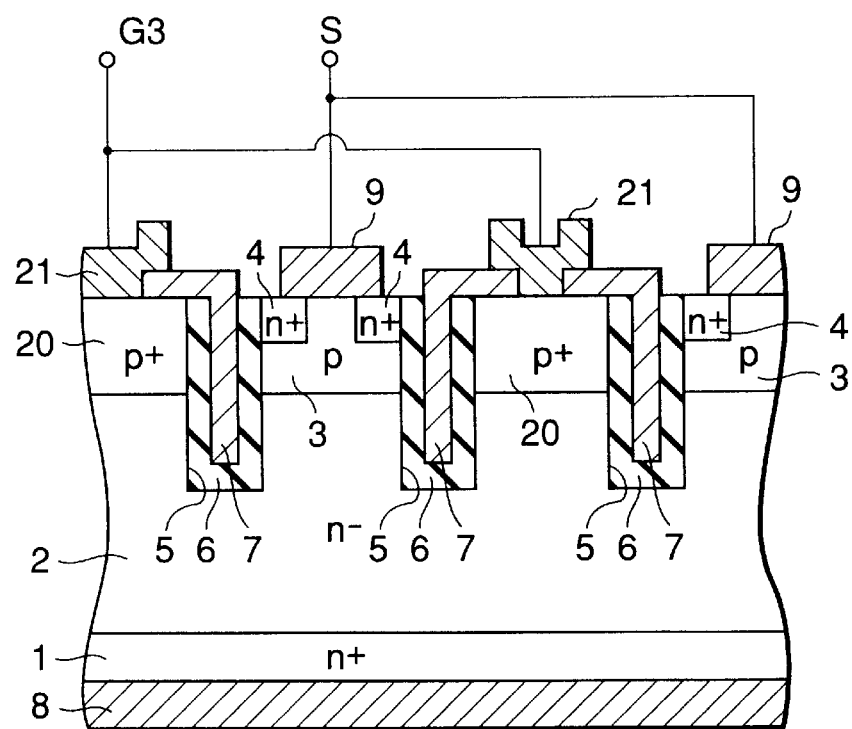
FIG. 16 is a cross-sectional view showing the structure of a semiconductor device according to a third embodiment of the invention.

FIG. 16 is a cross-sectional view showing the structure of this semiconductor device, which is a modification of the structure shown in FIG. 12. A technology using p+ type injection layer 20' instead of the p+ type injection layer 20 is applicable to the first embodiment and all the remaining embodiments.

Specifically, the present embodiment is a modification of the first embodiment and aims at simplifying the circuit configuration. As is shown in FIG. 16, the insulating layer 6 in the upper region of the first gate electrode 7 is removed, and the first gate electrode 7 extends onto the p+ type injection layer 20 and is connected to the second gate electrode 21. Accordingly, the terminals G1 and G2 for connection between the first and second gate electrodes 7 and 21 and the drive circuits are dispensed with. Instead, a terminal G3 for a common gate drive circuit is connected to the second gate electrode 21.

With this structure, there is no need to provide the two control terminals G1 and G2, and the operation is simplified. When the semiconductor device is to be turned on, a positive voltage which is positive relative to the source electrode 9 is applied to the second gate electrode 21. Similarly, when the semiconductor device is to be turned off, a negative voltage which is negative relative to the source electrode 9 is applied to the second gate electrode 21.

According to the third embodiment, as has been described above, the first and second gate electrodes 7 and 21 are electrically connected to each other. Thus, in addition to the advantages of the first embodiment, the first gate electrode 7 for switching on/off the electron path and the second gate electrode 21 for injecting/discharging holes can be controlled at the same time, and the gate drive control is simplified.

(Fourth Embodiment)

A semiconductor device according to a fourth embodiment of the present invention will now be described.

Figure 17:
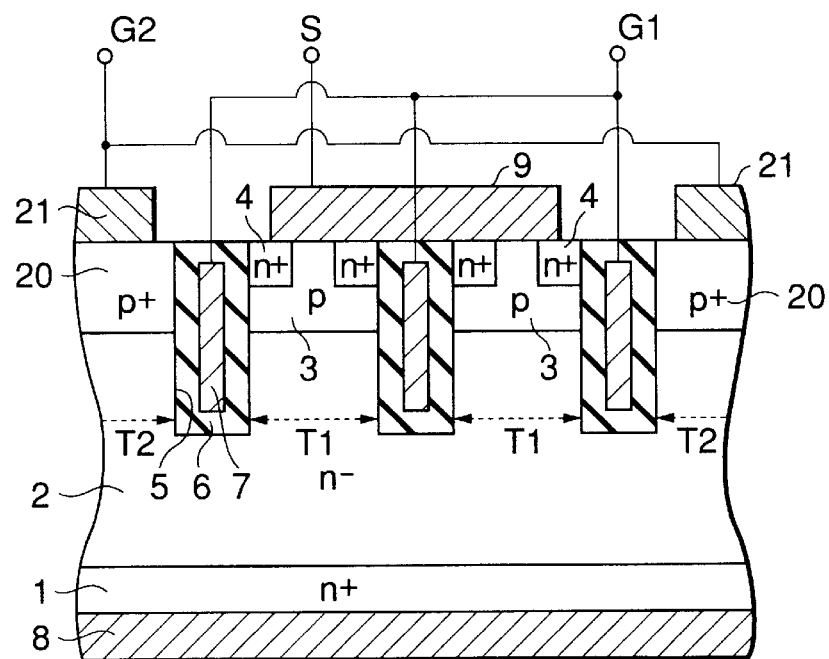
FIG. 17 is a cross-sectional view showing the structure of a semiconductor device according to a fourth embodiment of the invention.

FIG. 17 is a cross-sectional view showing the structure of this semiconductor device, which is a modification of the structure shown in FIG. 12.

Specifically, the present embodiment is a modification of the first embodiment. As is shown in FIG. 17, the arrangement of the first inter-trench region T1 comprising p type base layer 3 and n+ type source layer 4 and the second inter-trench region T2 comprising p+ type injection layer 20 is modified.

For example, two first inter-trench regions Ti (p+ type base layer 3 and n+ type source layer 4) and one second inter-trench region T2 (p+ type injection layer 20) are provided.

Thereby, the amount of holes h injected from the p+ type injection layer 20 can be controlled so as not to be excessive. The arrangement of inter-trench regions T1 and T2 may be determined in consideration of a reduction in on-resistance and a trade-off with gate current. The ratio in number of T1 to T2 is not limited to 1:1 or 2:1, and may be freely chosen.

With this structure, too, the same advantages as with the first embodiment can be obtained.

(Fifth Embodiment)

A semiconductor device according to a fifth embodiment of the present invention will now be described.

Figure 18:
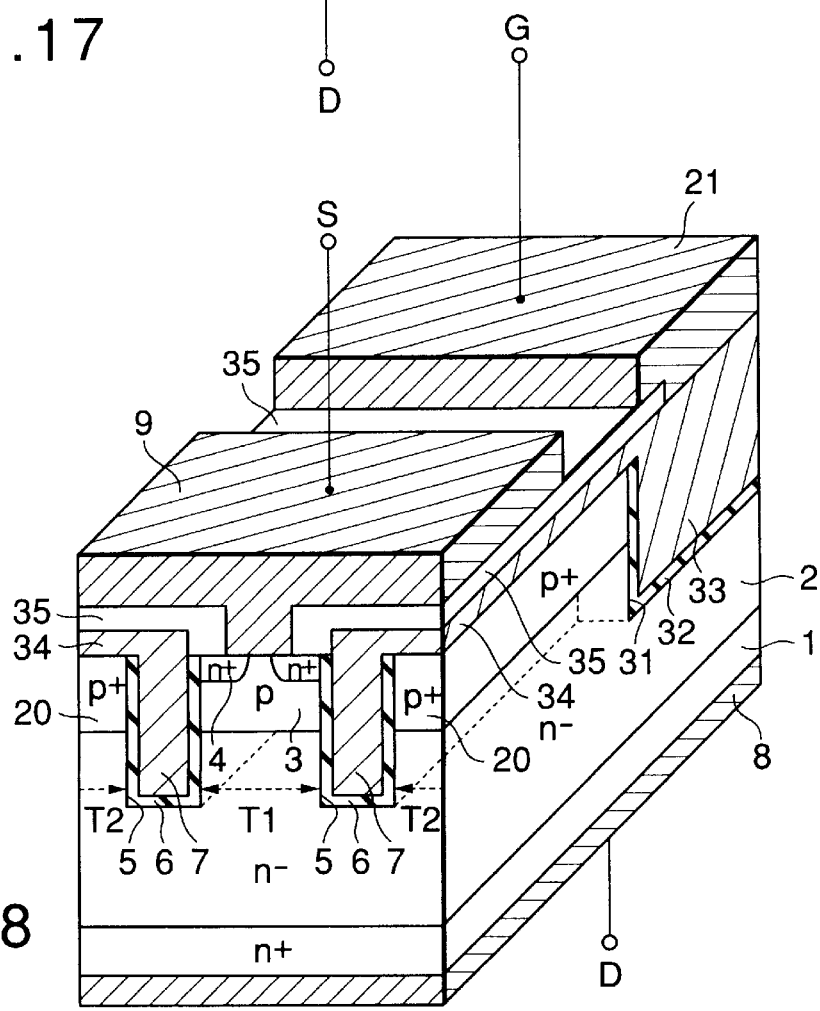
FIG. 18 is a cross-sectional view showing the structure of a semiconductor device according to a fifth embodiment of the invention.
Figure 19:
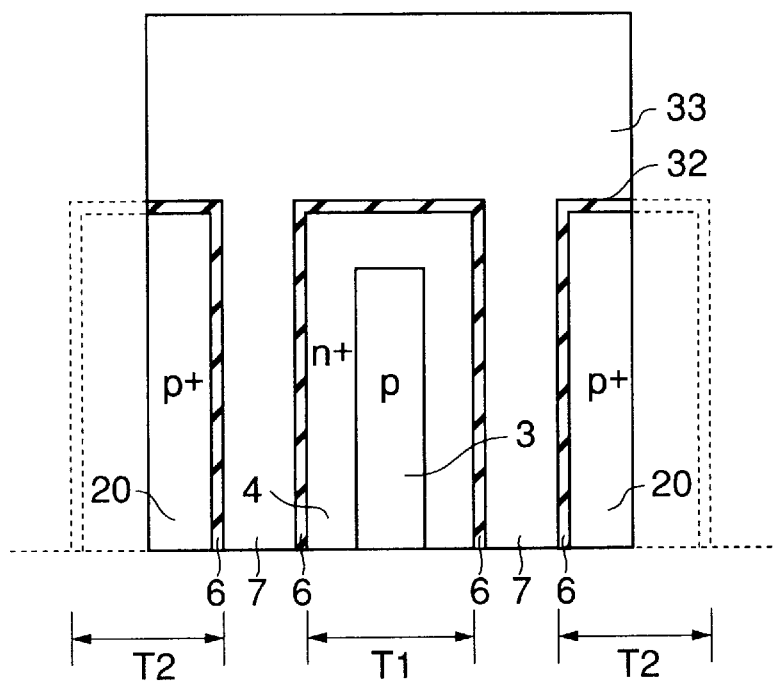
FIG. 19 is a plan view showing a surface structure of a semiconductor layer in the fifth embodiment of the invention.

FIG. 18 is a perspective cross-sectional view showing the structure of this semiconductor device, and FIG. 19 is a plan view showing the structure of a surface portion of a semiconductor layer of the semiconductor device.

The present embodiment is a modification of the first embodiment and aims at integrating the first and second gate electrodes. Specifically, as shown in FIGS. 18 and 19, a buried electrode 33 is formed away from the first and second inter-trench regions T1 and T2, and above the n− type base layer 2 and below the second gate electrode 21, with a trench 31 and an insulating film 32 interposed. The buried electrode 33 is put in contact with both p+ type injection layer 20 and first gate electrode 7. A connection path between the buried electrode 33 and first gate electrode 7 is electrically insulated from the source electrode 9 by means of an insulating film 35.

With the above structure, like the third embodiment, the circuit can be simplified. Even if the trench 5 below the source electrode 9 and the inter-trench region T1 are narrowed respectively, for example, to a width of 2 μm, the source electrode 9 and second gate electrode 21 can be spaced apart to some extent. Thus, the reliability of manufacturing steps relating to formation of electrodes can be enhanced.

(Sixth Embodiment)

A semiconductor device according to a sixth embodiment of the present invention will now be described.

Figure 20:
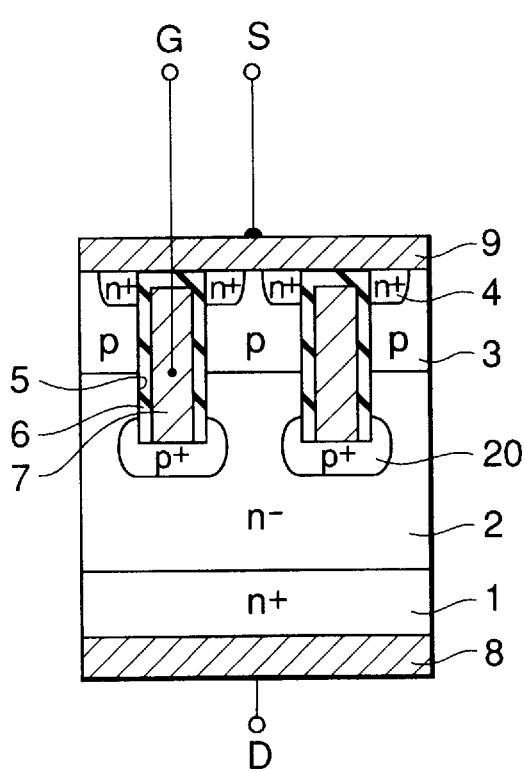
FIG. 20 is a cross-sectional view showing the structure of a semiconductor device according to a sixth embodiment of the invention.

FIG. 20 is a cross-sectional view showing the structure of this semiconductor device, which is a modification of the structure shown in FIG. 12.

Specifically, the present embodiment is a modification of the first embodiment and aims at integrating the first and second gate electrodes. As shown in FIG. 20, a p+ type injection layer 20 is formed within the n− type base layer 2 at a bottom part of the trench 5, and the p+ type injection layer 20 is put in contact with the first gate electrode 7.

This structure can be fabricated, for example, in the following manner.

An n- type base layer 2 is formed on an n+ type drain layer 1. A p type base layer 3 is formed on a surface of the n- type base layer 2. A plurality of n+ type source layers 4 are selectively formed on a surface of the p type base layer 3. A trench 5 is formed to extend from a central portion of each n+ type source layer 4 into the n- base layer 2.

A p+ type injection layer 20 extending from a bottom portion of the trench 5 into the n- type base layer 2 is formed by means of selective ion implantation and annealing. In addition, an insulating film 6 is provided on a side wall alone of the trench 5 by means of thermal oxidization and RIE.

Following the above, a first gate electrode 7 is buried in the trench 5, and a source electrode 9 is formed on the p type base layer 3 and n+ type source layer 4. Besides, a drain electrode 8 is formed on that surface of the n+ type drain layer 1, which is opposite to the surface thereof facing the n- type base layer 2. Thus, the fabrication of the semiconductor device is completed.

In the above structure, when a positive voltage is applied to the first gate electrode 7, an inversion layer is formed in that portion of the p type base layer, which interfaces with the insulating film 6. When electrons are injected from the source electrode 9 into the n- type base layer 2 through the n+ type source layer 4 and inversion layer, holes are simultaneously injected from the p+ type injection layer 20 at the bottom of the trench 5 into the n- type base layer 2.

Accordingly, a conductivity modulation occurs similarly with the above-described embodiments and the semiconductor device can be turned on at a low on-voltage.

As has been described above, according to the sixth embodiment, in addition to the advantages of the first embodiment, the amount of injected electrons per unit area can be increased and the gate electrode can be commonly used.

(Seventh Embodiment)

A semiconductor device according to a seventh embodiment of the present invention will now be described.

Figure 21:
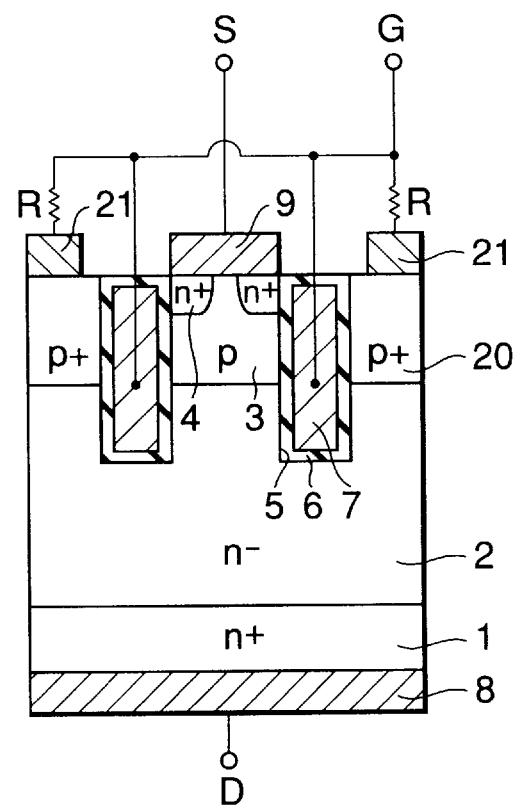
FIG. 21 is a cross-sectional view showing the structure of a semiconductor device according to a seventh embodiment of the invention.

FIG. 21 is a cross-sectional view showing the structure of this semiconductor device, which is a modification of the structure shown in FIG. 12.

The present embodiment is a modification of the first embodiment and aims at simplifying the circuit configuration. Specifically, as shown in FIG. 21, a line portion between the first gate electrode 7 and the terminal G connected to the gate drive circuit is electrically connected to the second gate electrode 21 with a resistor R interposed.

By virtue of this structure, when a voltage of, e.g. 3 V, is applied from the gate drive circuit via the control terminal G to the first gate electrode 7 to form the inversion layer in the p type base layer, a voltage of 0.7 V can be applied at the same time to the second gate electrode 21 to thereby inject holes h from the p+ type injection layer 20. In this case, a difference in voltage of 2.3 V corresponds to a voltage drop in the resistor R.

As has been described above, there is no need to provide the two control terminals G1 and G2, and the operation can be simplified. When the semiconductor device is to be turned on, a positive voltage which is positive relative to the source electrode 9 is applied to the first and second gate electrodes 7 and 21 via the control terminal G. Similarly, when the semiconductor device is to be turned off, a negative voltage which is negative relative to the source electrode 9 is applied to the first and second gate electrodes 7 and 21 via the control terminal G.

According to the seventh embodiment, as described above, in the addition to the advantages of the first embodiment, the following advantages can be obtained. Since the first and second gate electrodes are electrically connected with each other, the gate drive control can be made easier. In this case, since the resistor R is provided between the terminal G of the gate drive circuit and the second gate electrode 21, the value of the voltage to be applied to the second gate 21 can be optically controlled to be lower than the voltage applied to the first gate electrode 9.

(Eighth Embodiment)

A semiconductor device according to an eighth embodiment of the invention will now be described.

Figure 22:
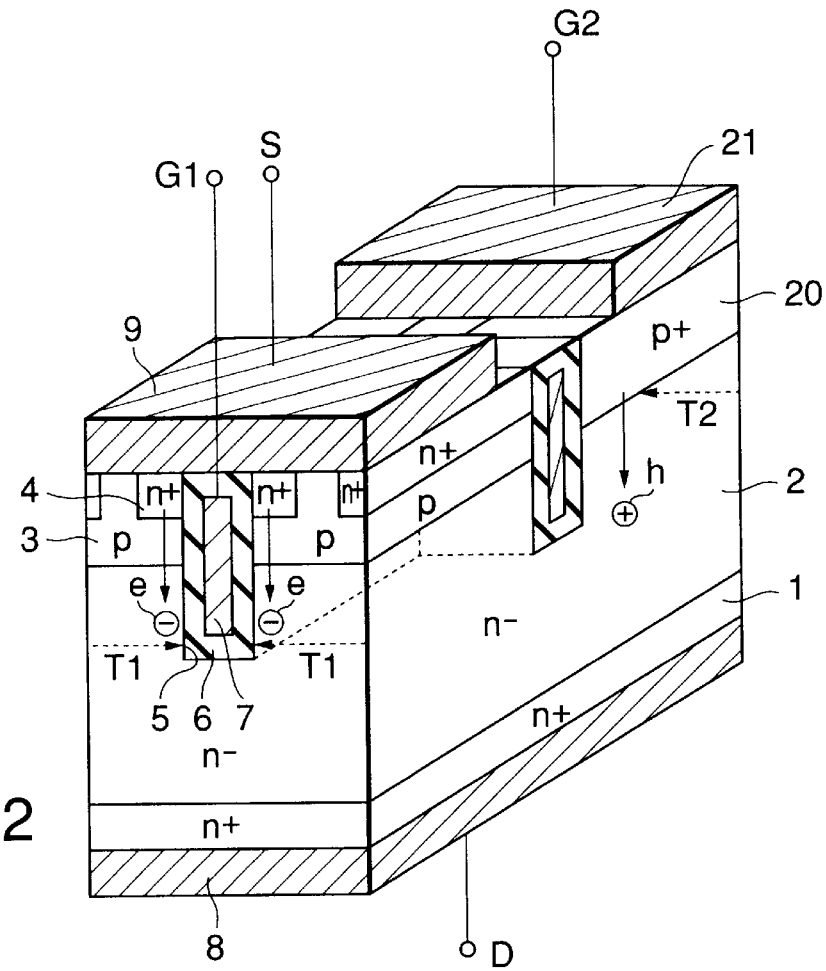
FIG. 22 is a cross-sectional view showing the structure of a semiconductor device according to an eighth embodiment of the invention.
Figure 23:
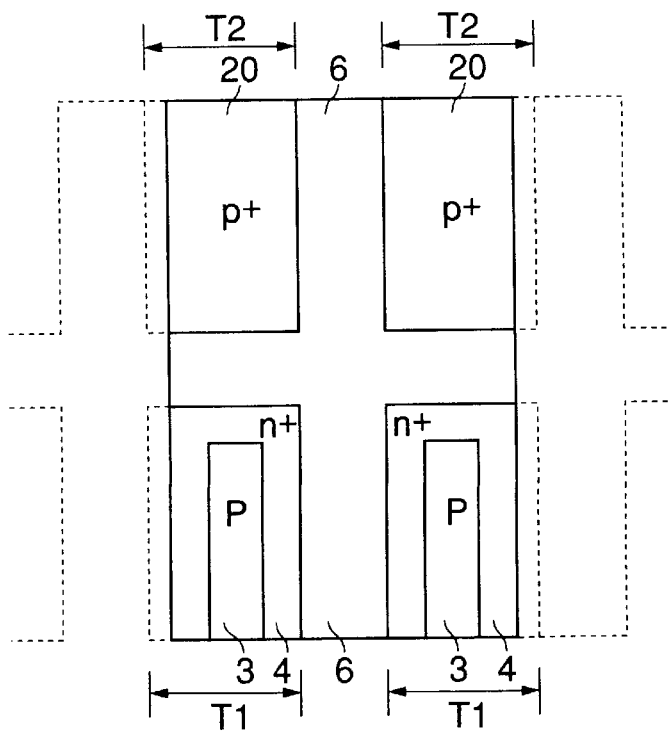
FIG. 23 is a plan view of a semiconductor layer in the eighth embodiment of the invention.

FIG. 22 is a perspective cross-sectional view showing the structure of this semiconductor device, and FIG. 23 is a plan view of a semiconductor layer of the semiconductor device. FIGS. 22 and 23 show a modification of the structure shown in FIG. 12.

The present embodiment is a modification of the first embodiment. Specifically, as shown in FIGS. 22 and 23, a plurality of first inter-trench regions T1 and a plurality of second inter-trench regions T2 are disposed in a plan-view arrangement, with trenches 5 interposed.

By virtue of this structure, one source electrode 9 may be provided on the plural first inter-trench regions T1, and one second gate electrode 21 may be provided on the plural second inter-trench regions T2. In addition, the first and second gate electrodes 7 and 21 may be spaced apart from each other. Thus, the width of an electrode wiring pattern can be increased, and the formation of electrodes can be made easier.

Figure 24:
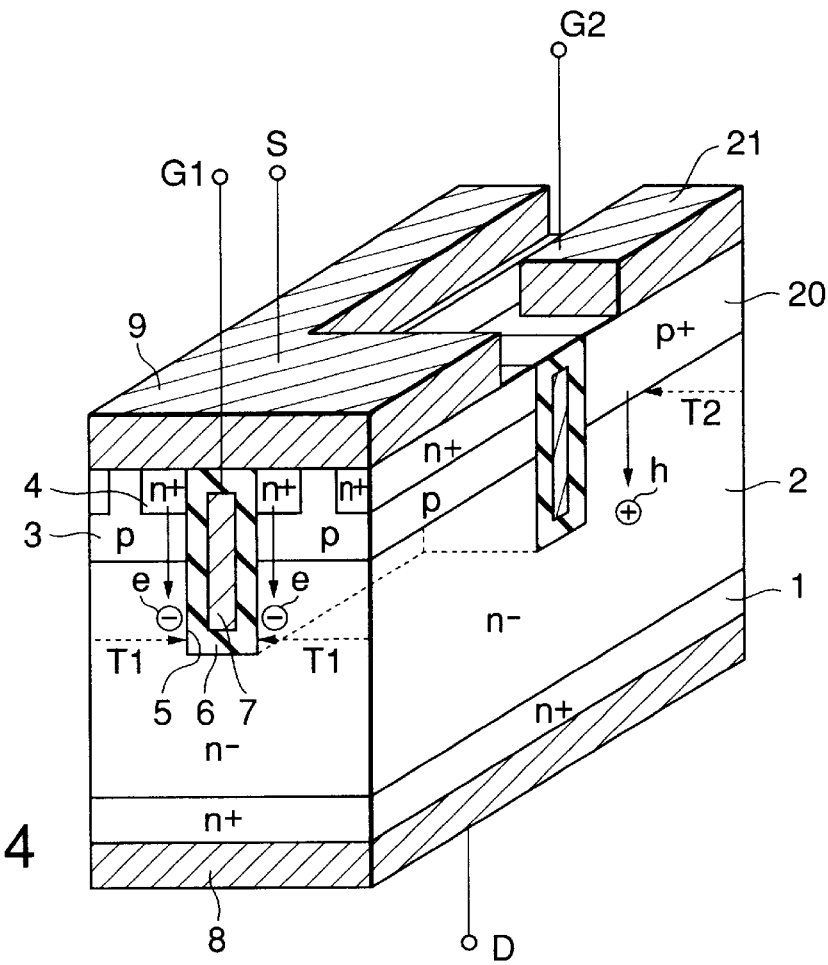
FIG. 24 is a cross-sectional view showing a modification of the structure of the semiconductor device according to the eighth embodiment.
Figure 25:
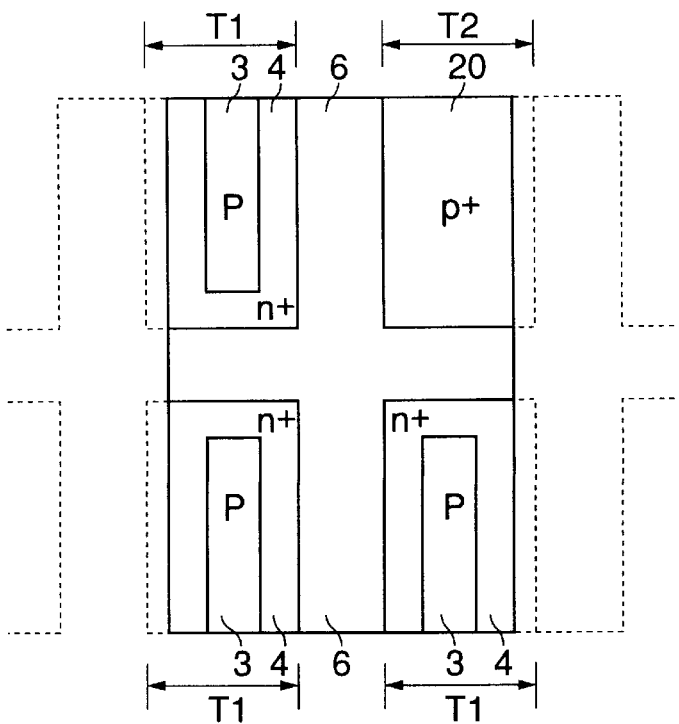
FIG. 25 is a plan view showing the modified structure of the eighth embodiment.

In the present embodiment, the ratio in number of T1:T2 is set at 1:1. However, as shown in FIGS. 24 and 25, for example, this ratio may be set at T1:T2=3:1. Even if the electrode pattern is varied according to design specifications, the two or more first intertrench regions T1 can be combined, and the first and second gate electrodes 7 and 21 can be spaced apart. Therefore, the same advantages as with the present embodiment can be obtained.

In the fourth and eighth embodiments, modifications of arrangement are shown. The present invention, however, is not limited to these embodiments. The first inter-trench region T1 having p+ type injection layer 20 and the second inter-trench region T2 having p type base layer 3 and n+ type source layer 4 may be arranged at desired positions on the surface of the n- type base layer 2.

The integrated structure of the first and second gate electrodes 7 and 21 described in the third embodiment may be combined with the third and/or fourth embodiments or with the modifications thereof.

(Ninth Embodiment)

A semiconductor device according to a ninth embodiment of the present invention will now be described.

Figure 26:
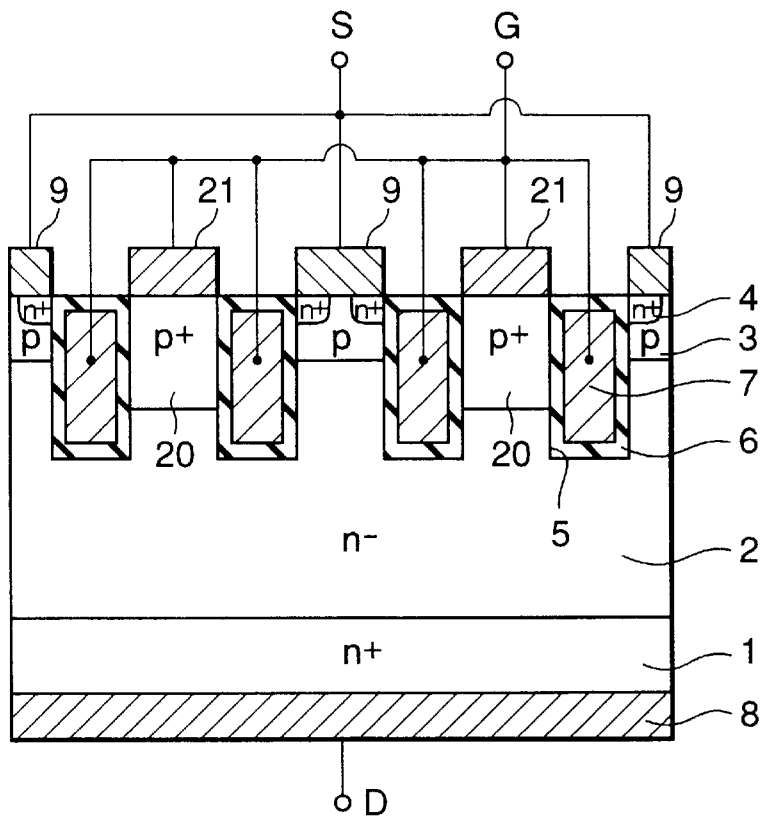
FIG. 26 is a cross-sectional view showing the structure of a semiconductor device according to a ninth embodiment of the invention.

FIG. 26 is a cross-sectional view showing the structure of this semiconductor device, which is a modification of the structure shown in FIG. 12.

The present embodiment is a modification of the first embodiment. Specifically, as shown in FIG. 26, the second gate electrode 21 is electrically connected to a connection path between the first gate electrode 7 and the terminal G led to the gate drive circuit (not shown), and the depth of the p+ type injection layer 20 is made greater than that of the p type base layer 3.

With this structure, the following advantage is obtained in addition to the advantages of the first embodiment. That is, since the p+ type injection layer 20 is made deeper, the injection/discharge efficiency of holes h is enhanced.

(Tenth Embodiment)

A semiconductor device according to a tenth embodiment of the present invention will now be described.

Figure 27:
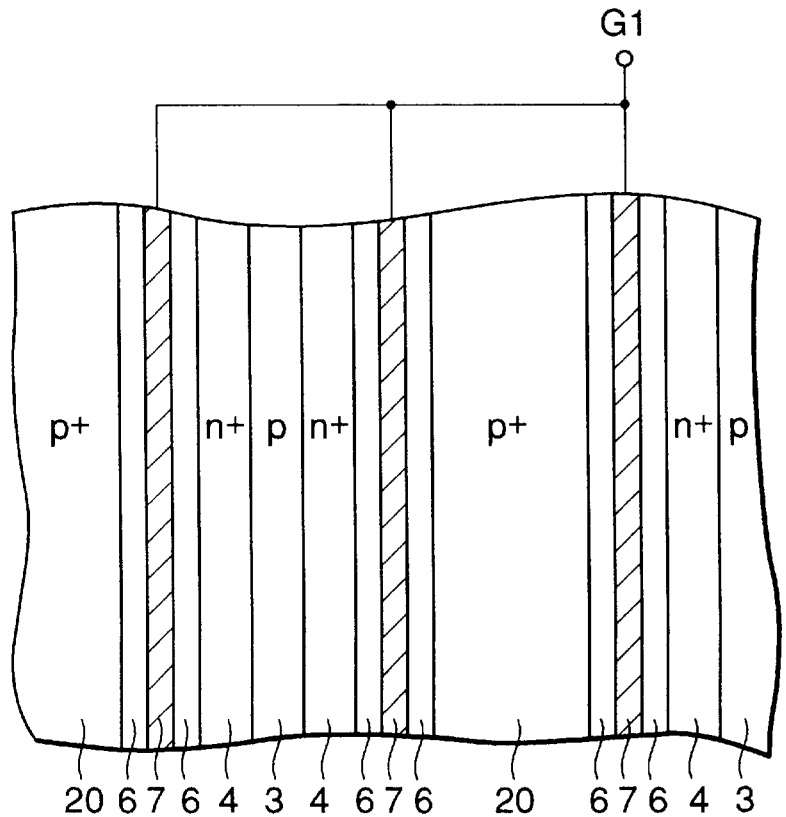
FIG. 27 is a plan view showing the structure of a surface portion of a semiconductor device according to a tenth embodiment of the invention.

FIG. 27 is a plan view showing the structure of a surface portion of a semiconductor layer of this semiconductor device. FIG. 27 is associated with the cross-sectional view of FIGS. 12, 15, 16, 21 or 26.

The present embodiment defines the plan-view structure of the first, second, third, seventh or ninth embodiment. Specifically, as shown in FIG. 27, the p+ type injection layer 20, n+ type source layer 4 and p type base layer 3 are formed in parallel stripes.

Figure 28:
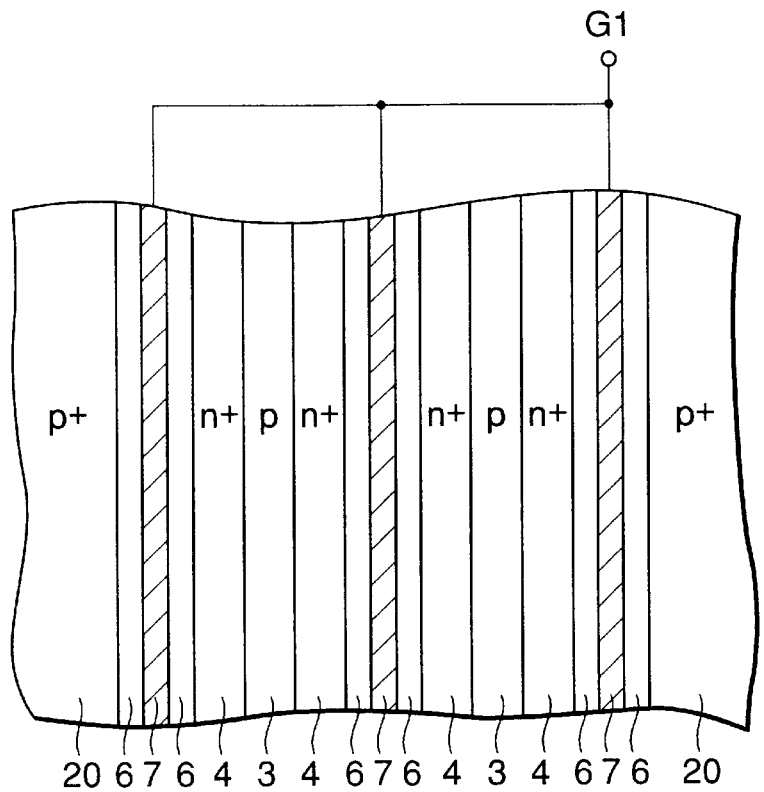
FIG. 28 is a plan view showing a modified structure of a surface portion of the tenth embodiment.

With the above structure, too, the advantages of the first, second, third, seventh or ninth embodiment can be obtained. Needless to say, the plan-view structure of the fourth embodiment shown in FIG. 17 may be designed, as shown in FIG. 28, such that the p+ type injection layer 20, n+ type source layer 4 and p type base layer 3 are arranged in stripes. The plan-view structure of the sixth embodiment shown in FIG. 20 may be similarly designed, though not shown.

(Eleventh Embodiment)

A semiconductor device according to an eleventh embodiment of the present invention will now be described.

Figure 29:
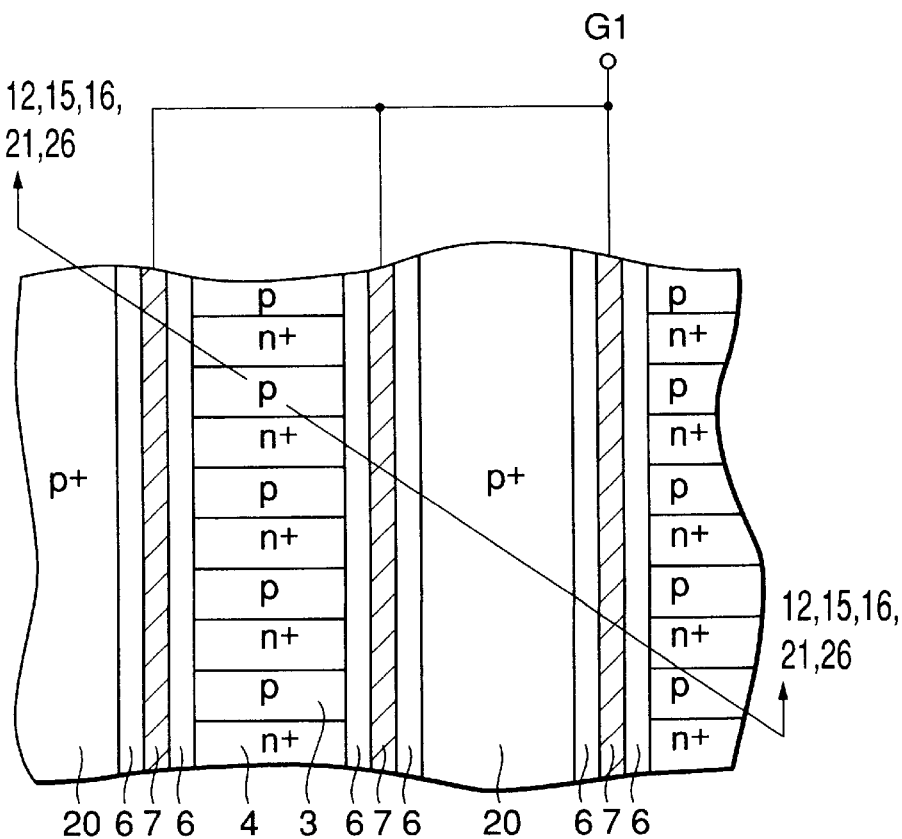
FIG. 29 is a plan view showing the structure of a surface portion of a semiconductor device according to an eleventh embodiment of the invention.

FIG. 29 is a plan view showing the structure of a surface portion of a semiconductor layer of this semiconductor device. This figure is associated with the cross-sectional view of FIGS. 12, 15, 16, 21 or 26.

The present embodiment defines the plan-view structure of the first, second, third, seventh or ninth embodiment. Specifically, as shown in FIG. 29, n+ type source layers 4 are formed on the p type base layer 3 in stripes extending in a direction perpendicular to the longitudinal direction of the p+ type injection layer 20 (or trench 5).

With the above structure, too, the advantages of the first, second, third, seventh or ninth embodiment can be obtained. Further, this embodiment may be modified to the plane structure with stripe-shaped surface layers as shown in FIG. 27

Figure 30:
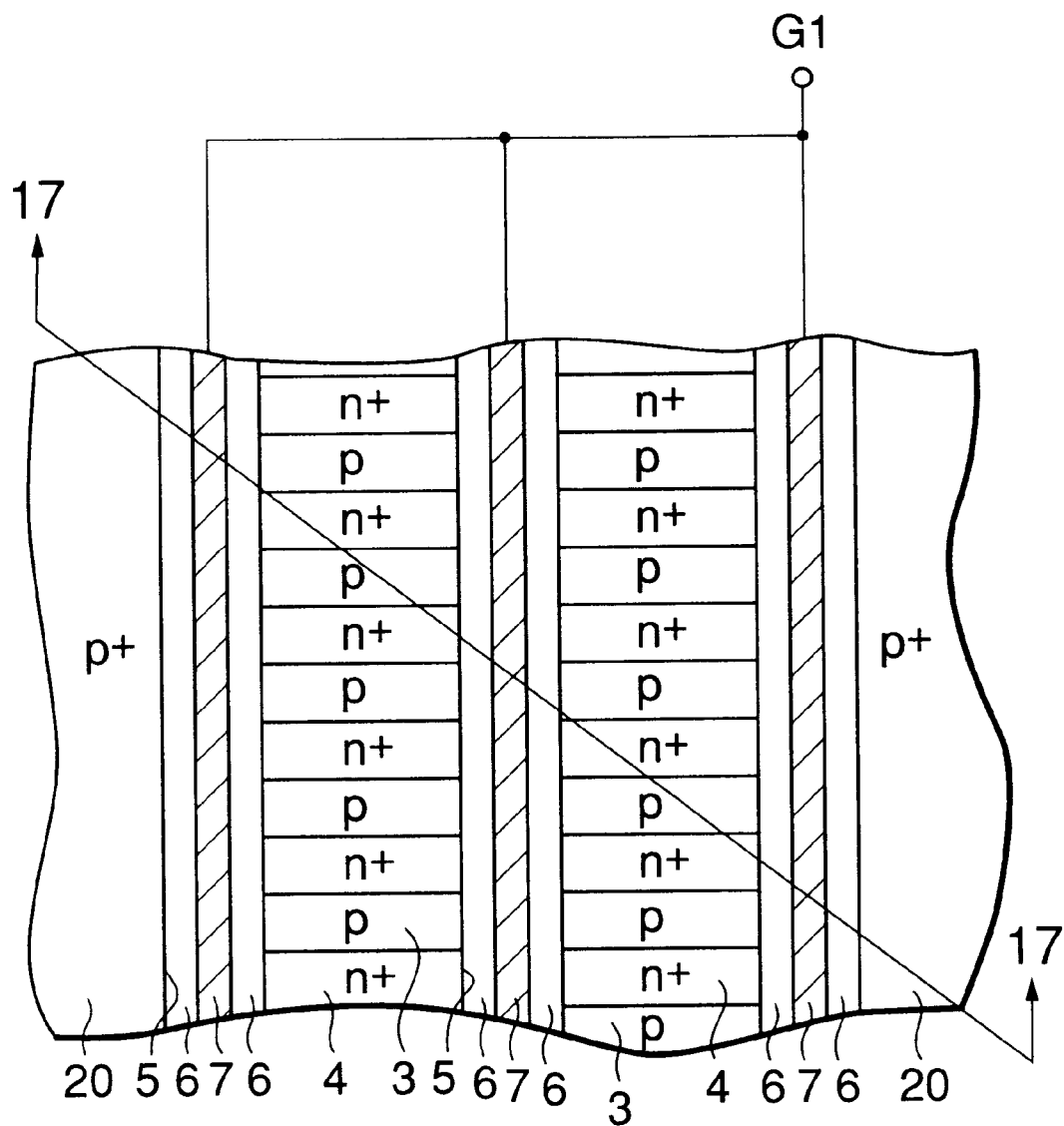
FIG. 30 is a plan view showing a modified structure of a surface portion of the eleventh embodiment.

The plan-view structure of the fourth embodiment may be designed like the present embodiment, as shown in the plan-view of FIG. 30. Although not shown, the plan-view structure of the sixth embodiment shown in FIG. 20 may be similarly designed.

(Twelfth Embodiment)

A semiconductor device according to a twelfth embodiment of the present invention will now be described.

Figure 31:
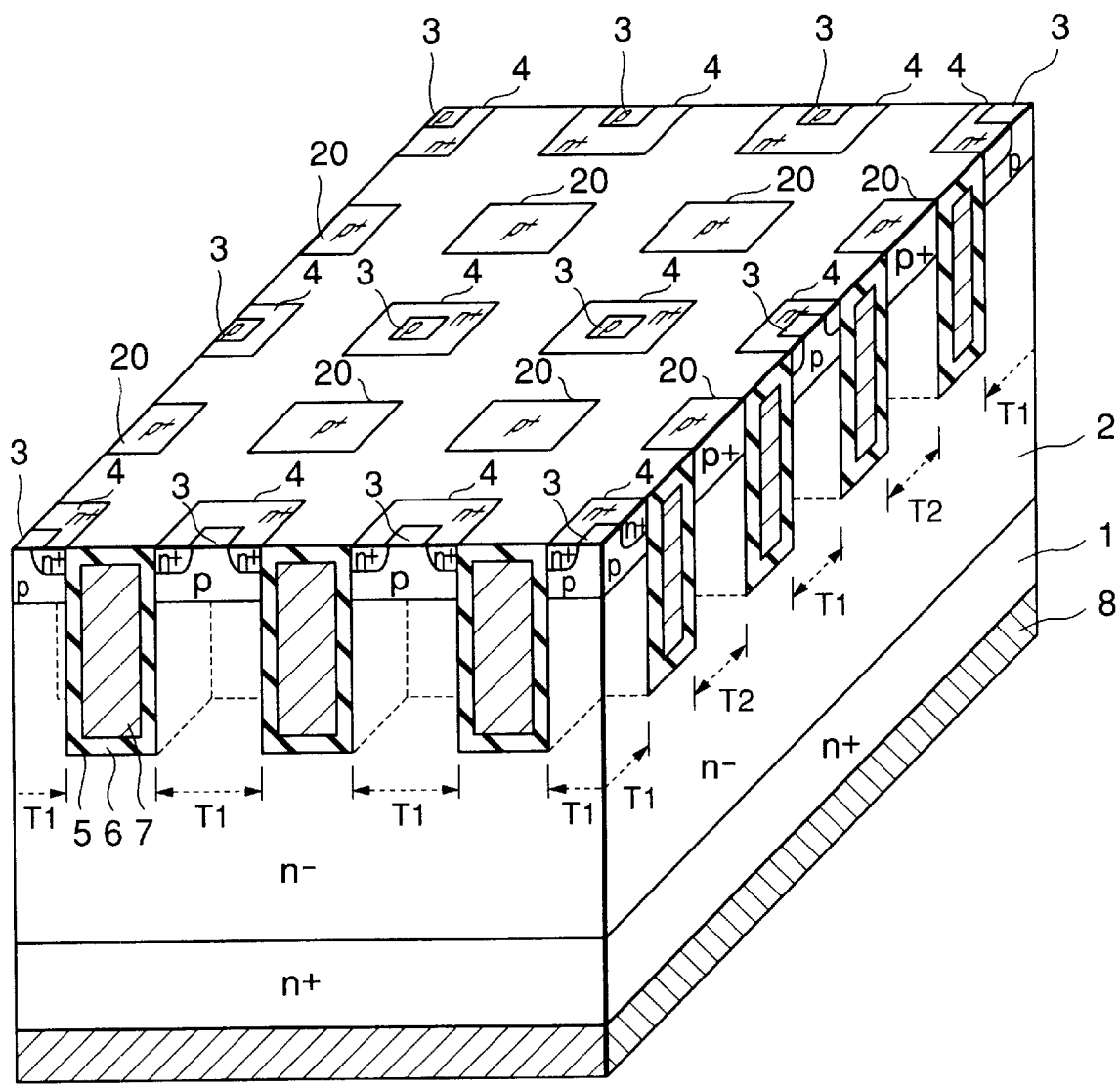
FIG. 31 is a perspective cross-sectional view showing the structure of a semiconductor device according to a twelfth embodiment of the invention.

FIG. 31 is a perspective cross-sectional view showing the structure of this semiconductor device. FIG. 31 is associated with the cross-sectional view of FIGS. 12, 15, 16, 21 or 26.

The present embodiment defines the plan-view structure of the first, second, third, seventh or ninth embodiment. Specifically, as shown in FIG. 31, trenches 5 are formed in a lattice, and inter-trench regions T1 and T2 are provided among the trenches 5 in row and column directions on the face of the sheet of FIG. 31. The first inter-trench regions T1 each comprising p type base layer 3 and n+ type source layer 4 are arranged in the row direction and also the second inter-trench regions T2 each comprising p+ type injection layer 20 are arranged in the row direction, such that the first inter-trench regions T1 and second inter-trench regions T2 are alternately arranged in the column direction.

With the above structure, too, the advantages of the first, second, third, seventh or ninth embodiment can be obtained.

Needless to say, the arrangement shown in FIG. 31 may be rotated over 90°, so that the first inter-trench regions Ti are arranged in the column direction and also the second inter-trench regions T2 are arranged in the column direction such that the first and second inter-trench regions T1 and T2 are alternately arranged in the row direction.

In the above structure, the p+ type injection layers 20 are provided in every other row. However, the p+ type injection layers 20 may be provided in every third row or every fourth row. Besides, p type base layers 3 and n+ type source layers 4 may be provided in desired rows of p+ type injection layers 20 which are arranged at desired intervals of rows. Other modifications of arrangement patterns can be conceived from the above descriptions and the accompanying drawings and are included in the scope of the present invention.

(13th Embodiment)

A semiconductor device according to a 13th embodiment of the present invention will now be described.

Figure 32:
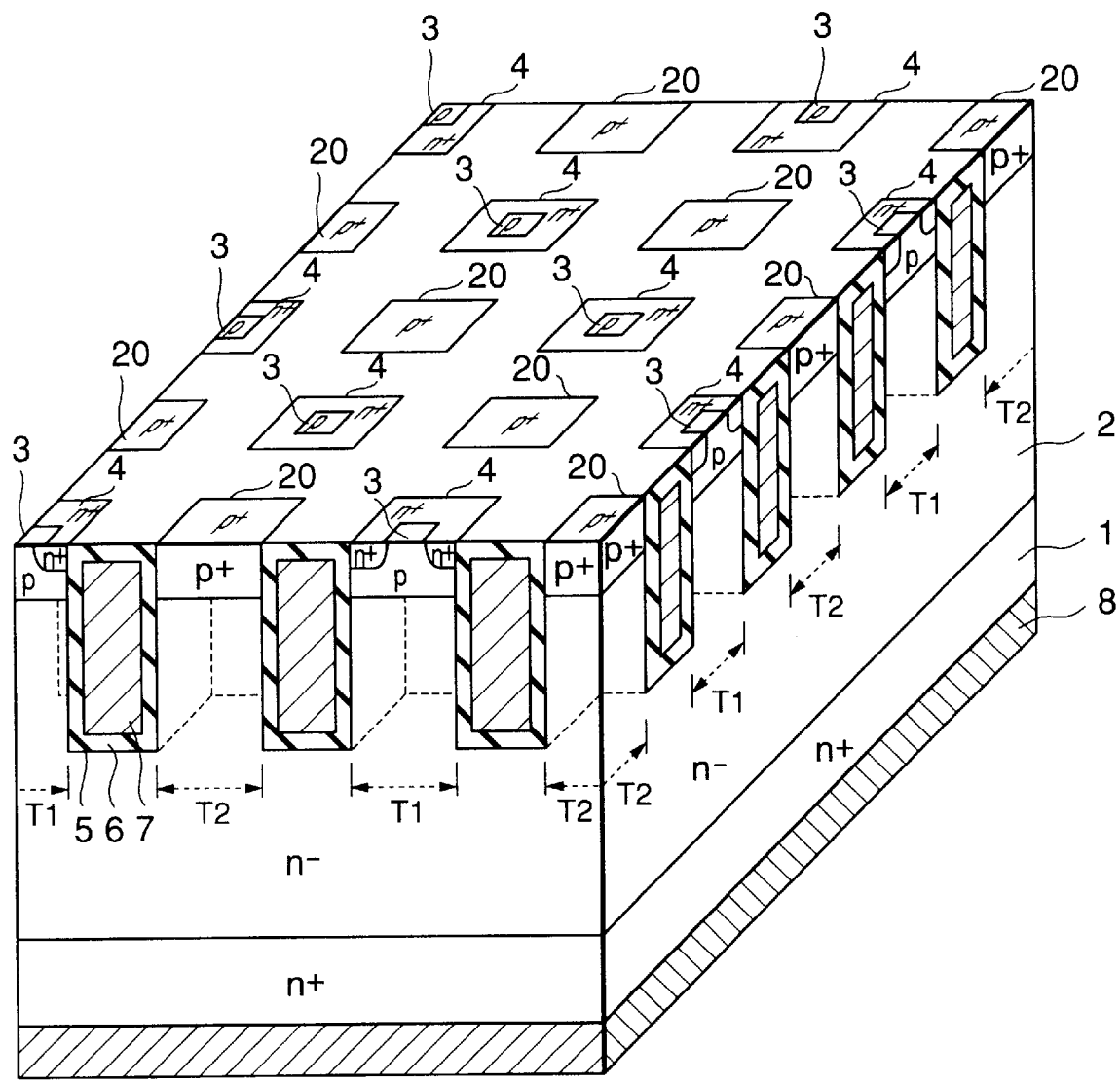
FIG. 32 is a perspective cross-sectional view showing the structure of a semiconductor device according to a 13th embodiment of the invention.

FIG. 32 is a perspective cross-sectional view showing the structure of this semiconductor device. FIG. 32 is associated with the cross-sectional view of FIGS. 12, 15, 16, 21 or 26.

The present embodiment defines the plan-view structure of the first, second, third, seventh or ninth embodiment. Specifically, as shown in FIG. 32, trenches 5 are formed in a lattice, and inter-trench regions T1 and T2 are provided among the trenches 5 in row and column directions on the face of the sheet of FIG. 31. The inter-trench regions T1 and T2 are arranged alternately in each row, and also the inter-trench regions T1 and T2 are arranged alternately in each column.

With the above structure, too, the advantages of the first, second, third, seventh or ninth embodiment can be obtained.

In the above structure, the inter-trench regions T2 (p+ type injection layers 20) are provided in every other row and in every other column. However, the p+ type injection layers 20 may be arranged with a desired number of inter-trench regions T1 (e.g. two or three inter-trench regions T1) interposed therebetween. As mentioned above, if other modifications of arrangement patterns are made, such modifications are included within the scope of the present invention. Not only regular patterns but also irregular patterns are included within the scope of the present invention.

(14th Embodiment)

A semiconductor device according to a 14th embodiment of the present invention will now be described.

Figure 33:
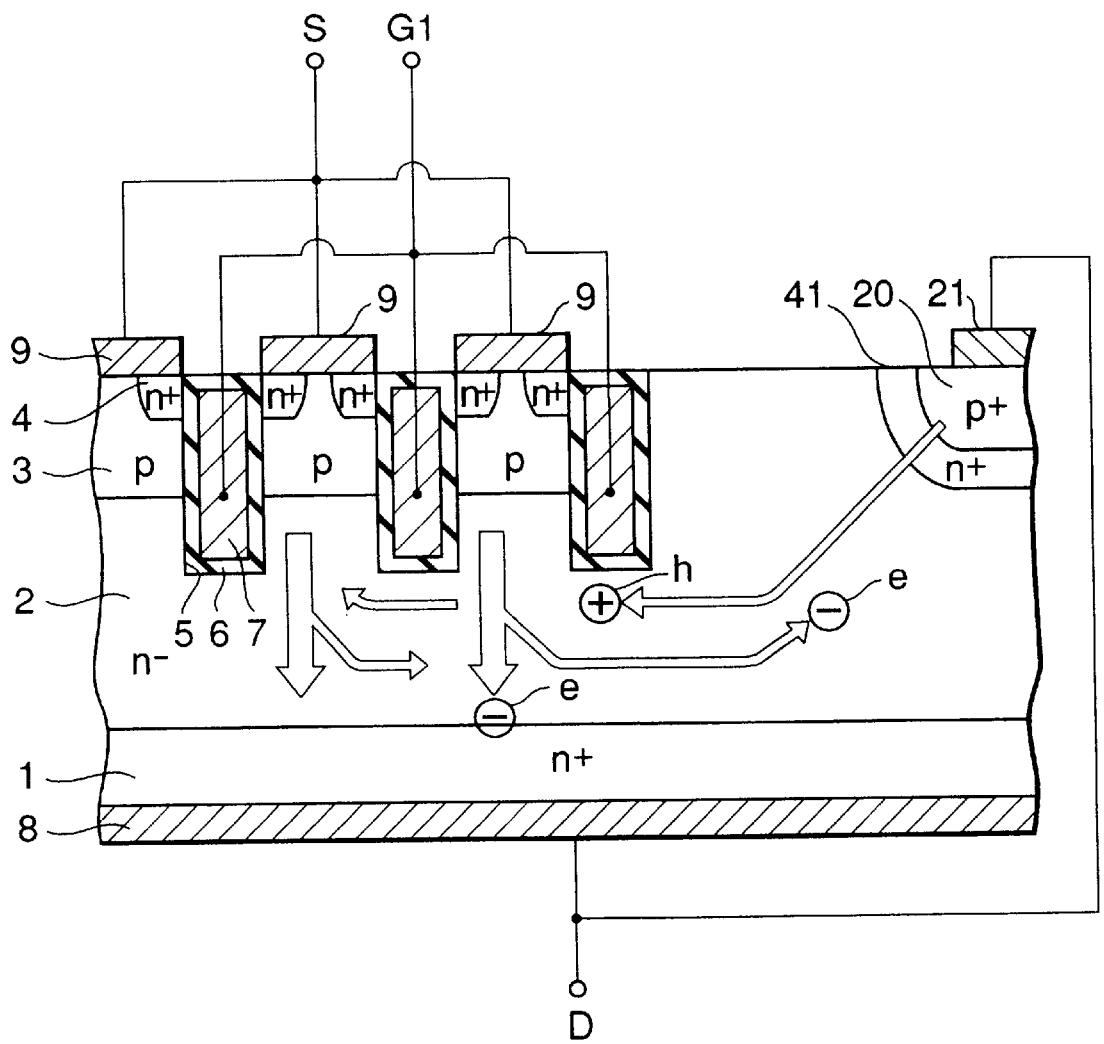
FIG. 33 is a cross-sectional view showing the structure of a semiconductor device according to a 14th embodiment of the invention.

FIG. 33 is a cross-sectional view showing the structure of this semiconductor device, which is a modification of the structure shown in FIG. 12.

The present embodiment is a modification of the first embodiment. Specifically, as shown in FIG. 33, the p+ type injection layer 20 is not provided in the regions among the trenches 5 but is provided selectively in a surface portion of the n– type base layer 2 away from each trench 5.

An n+ type buffer layer 41 for suppressing broadening of a depletion layer from the p type base layer 3 is formed between the p+ type injection layer 20 and n– type base layer 2. The n+ type buffer layer 41, however, may be dispensed with.

The second gate electrode 21 is formed on the p+ type injection layer 20. The second gate electrode 21 is connected to the drain electrode and a drain-side circuit (not shown).

In the above structure, a positive voltage is applied to the drain electrode 8, a negative voltage to the source electrode 9, and a positive voltage to the gate electrode 7. In this case, electrons e are injected from the n+ type source layer 4 into the n– type base layer 2 via the inversion layer of p type base layer 3. Most of the electrons e flow to the drain electrode 8 through the n+ type drain layer 1, while small part of the electrons e flows toward the surface portion and reach the p+ type injection layer 20 via the n+ type buffer layer 41.

At this time, holes h are injected from the p+ type injection layer 20 into the n– type base layer 2 via the n+ type buffer layer 41. Thus, a conductivity modulation occurs and the on-voltage is decreased.

When the device is to be turned off, a negative voltage is applied to the gate electrode 7, like the case described above, thereby stopping injection of electrons e.

According to the present embodiment, the following advantage can be obtained in addition to the advantages of the first embodiment. Since the p+ type injection layer 20 is not formed among the trenches but is formed apart from the trenches, all inter-trench regions can be used for injection of electrons and the amount of injected electrons per unit area can be increased.

Furthermore, since the drain electrode 8 and second gate electrode 21 are connected and the hole injecting gate drive circuit is dispensed with, the gate drive circuit is simplified.

(15th Embodiment)

A semiconductor device according to a 15th embodiment of the present invention will now be described.

Figure 34A:
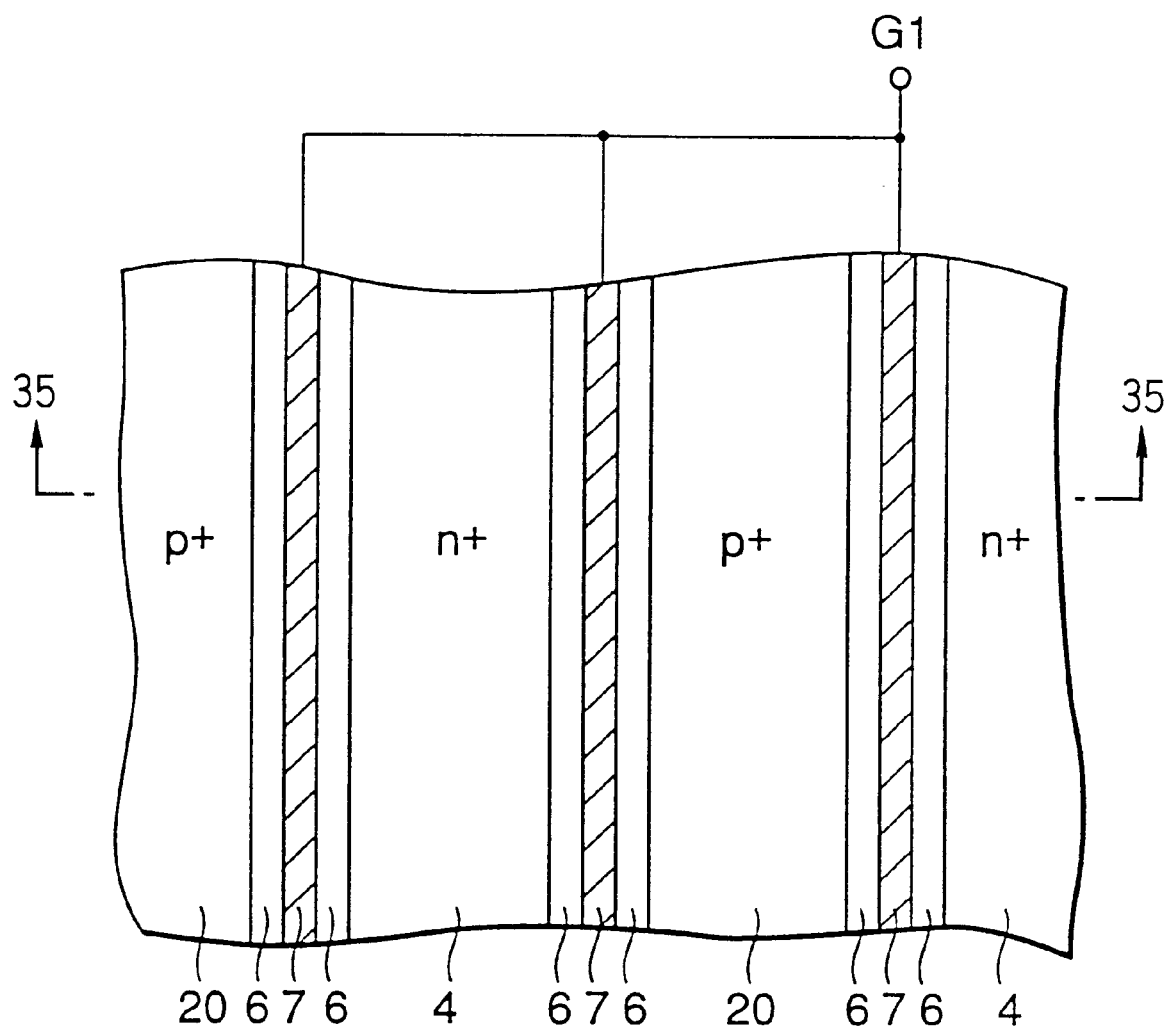
FIGS. 34A and 34B are cross-sectional views showing the structures of a semiconductor device according to a 15th embodiment of the invention.
Figure 34B:
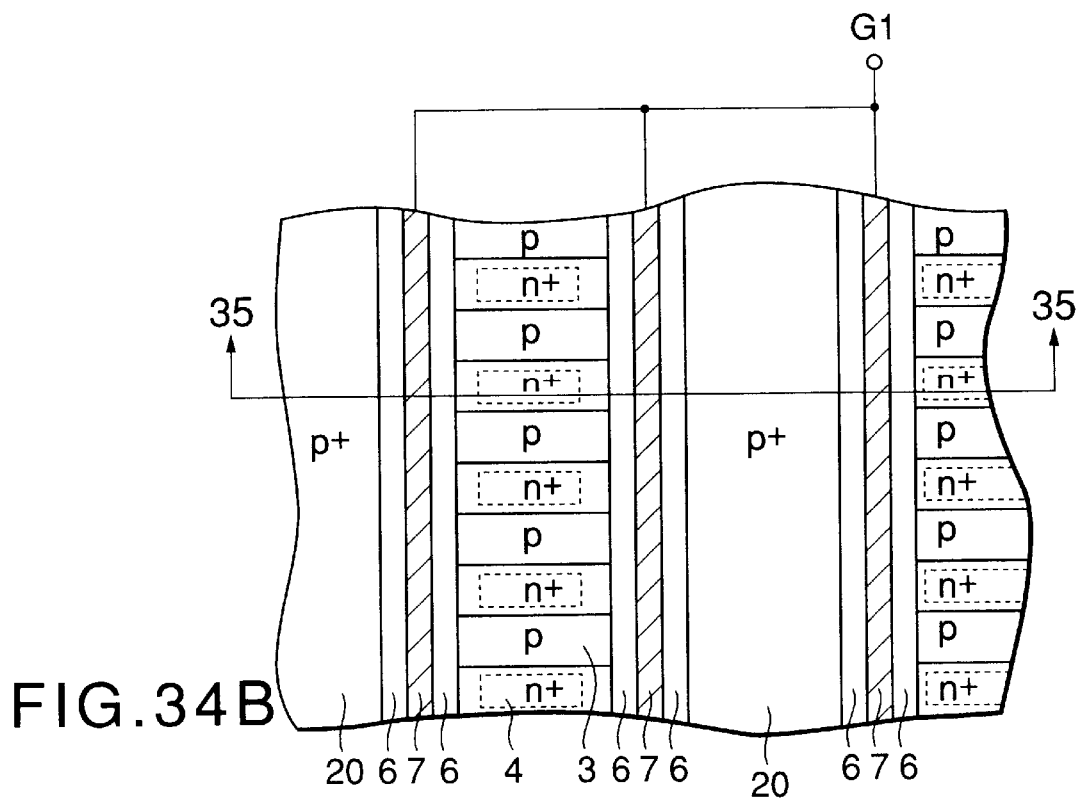
Figure 35:
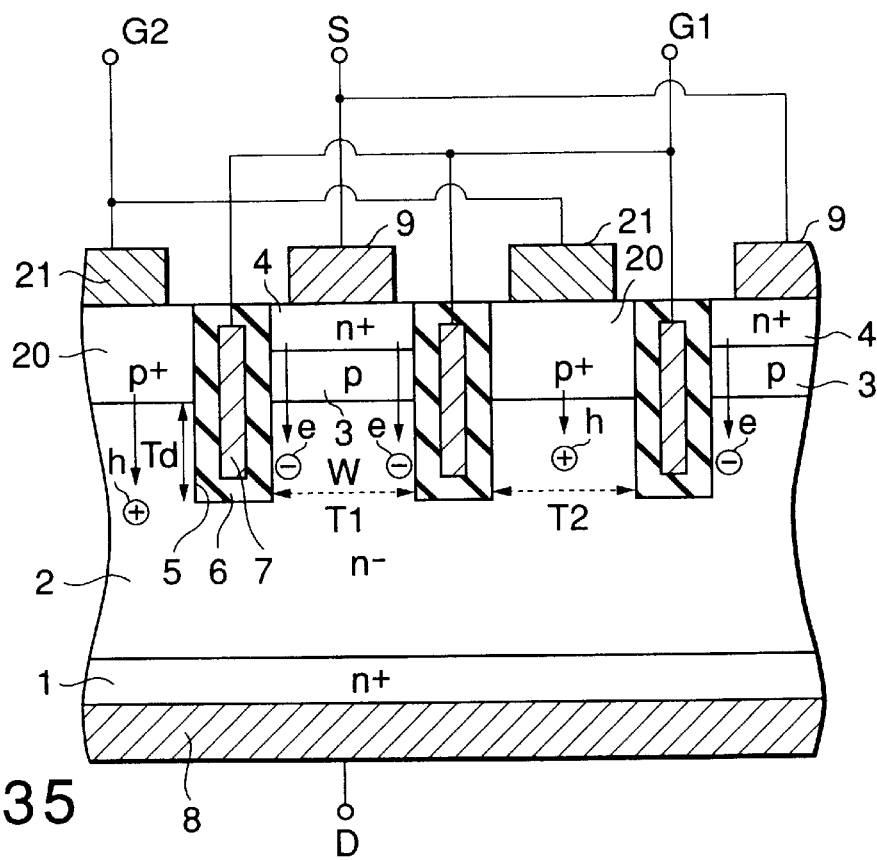
FIG. 35 is a cross-sectional view taken along line 35—35 in FIG. 34.

FIGS. 34A and 34B are plan views showing the structures of a surface portion of a semiconductor layer of this semiconductor device. FIG. 35 is a cross-sectional view taken along line 35—35 in FIGS. 34A or 34B. FIGS. 34A, 34B and 35 show a modification of the structure shown in FIG. 12.

The present embodiment is a modified structure of the first embodiment. As shown in FIGS. 34A and 35, the p+ type injection layer 20, n+ type source layer 4 and p type base layer 3 are formed in parallel stripes.

On the other hand, as shown in FIGS. 34B and 35, n+ type source layers 4 are formed on the p type base layer 3 so as to have striped wiring patterns extending in a direction perpendicular to the longitudinal direction of the p+ type injection layer 20 (or trench 5). In other words, as shown in FIG. 34B, many microscopic n+ type source layers 4 are arranged on the surface of the p type base layer 3. A region on the n+ type source layer 4, which is indicated by a broken line, is a contact region between the n+ type source layer 4 and the source electrode 9.

With the above structure, too, the advantages of the first embodiment can be obtained. Further, since the p type base layer 3 is not in contact with the source electrode 9, holes are not flowed through the source electrode 9, but are accumulated in the n– type base layer 3. Simultaneously, electrons are directly injected into the n– type base layer 3 from not only n-channel but also the whole n+ type source layer 4.

Figure 36A:
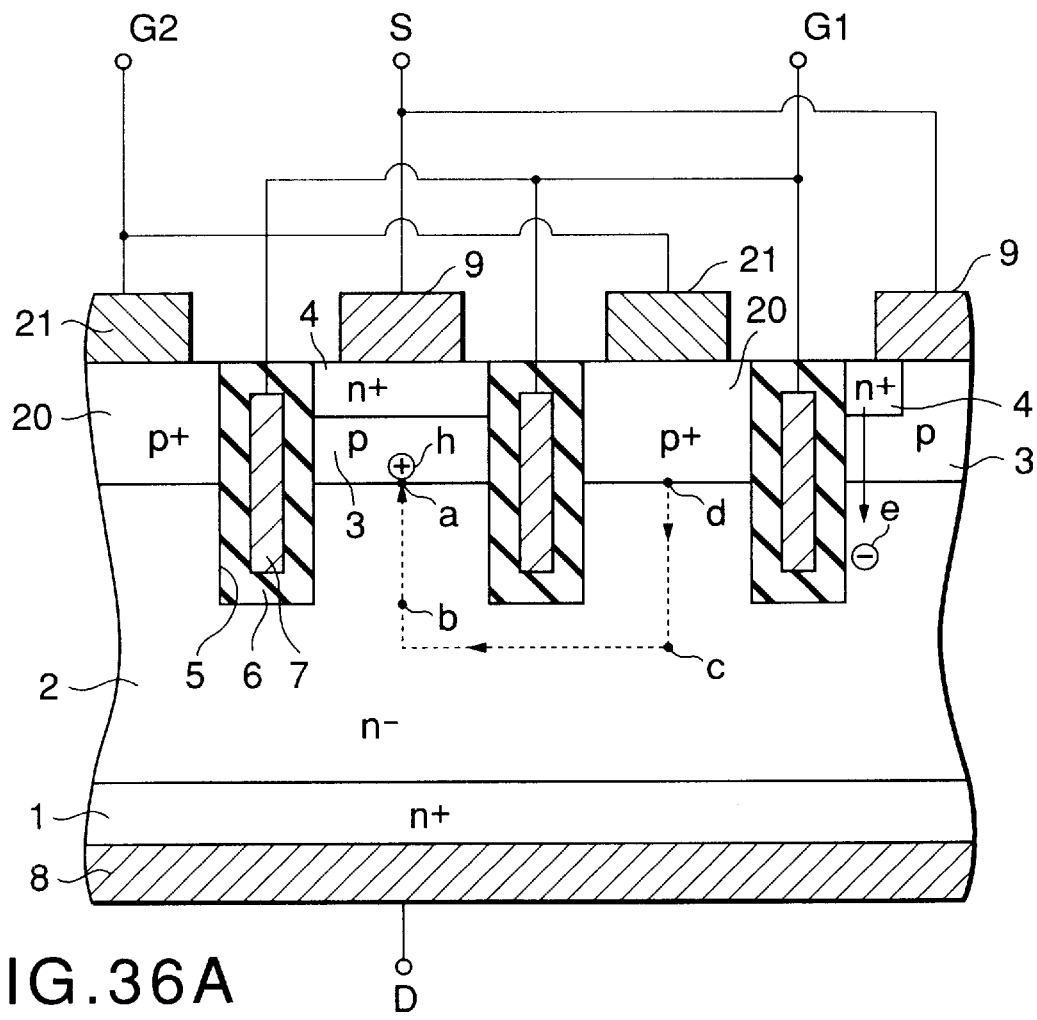
FIGS. 36A and 36B are views showing a hole density distribution along a hole current path in the 15th embodiment.
Figure 36B:
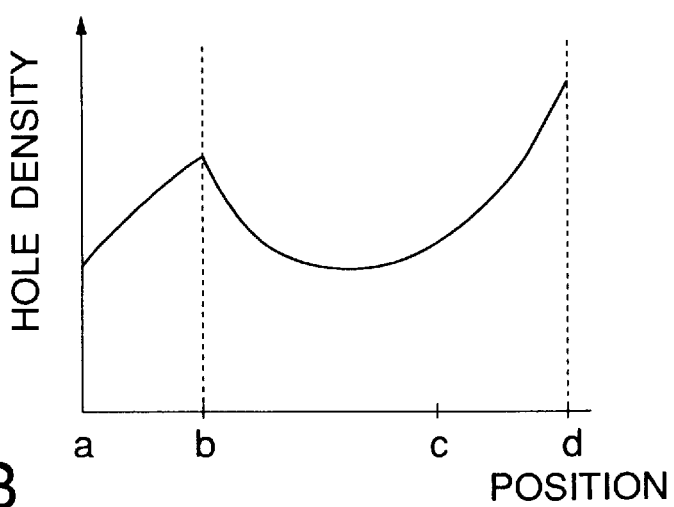

For example, FIGS. 36A and 36B show a hole density distribution along a hole current path in the semiconductor device. Unlike the structure shown in FIG. 12, a resistance to holes h flowing through the inter-trench region T1 into the source electrode 9 increases, and a hole concentration in the n– type base region near the bottom of the trench increases. Thus, the on-voltage is further decreased. In the other words, according to the described structure, on-voltage can be remarkably decreased in comparison with the structure as shown in FIG. 12.

Similarly, 16th to 27th embodiments, which will be described below, have the advantages of the basic embodiments to which the 16th to 27th embodiments correspond. In the present 15th embodiment, the plan-view structure shown in FIGS. 34A or 34B may be replaced with a plan-view structure wherein n+ source layers 4 are provided on the entire surface of the p type base layer 3.

(16th Embodiment)

A semiconductor device according to a 16th embodiment of the present invention will now be described.

Figure 37:
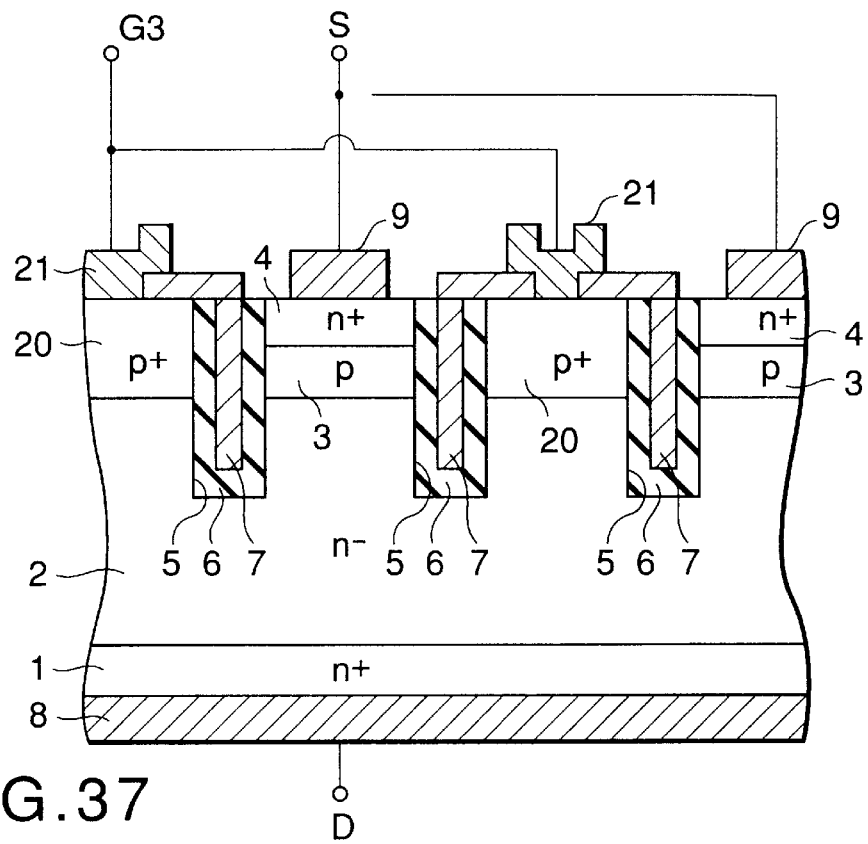
FIG. 37 is a cross-sectional view showing the structure of a semiconductor device according to a 16th embodiment of the invention.

FIG. 37 is a cross-sectional view showing the structure of this semiconductor device, which is a modification of the structure shown in FIG. 16.

The present embodiment is a modification of the third embodiment. Specifically, as shown in FIG. 37, the n+ type source layer 4 is not selectively provided on the p type base layer 3, but is provided on the entire surface of the p type base layer 3.

(17th Embodiment)

A semiconductor device according to a 17th embodiment of the present invention will now be described.

Figure 38:
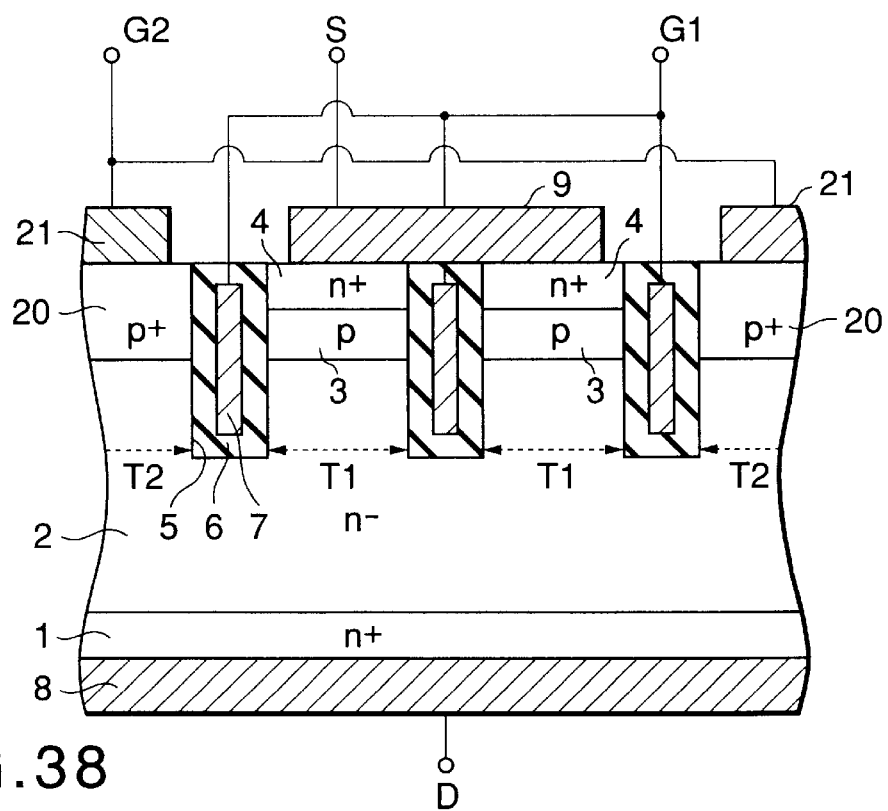
FIG. 38 is a cross-sectional view showing the structure of a semiconductor device according to a 17th embodiment of the invention.

FIG. 38 is a cross-sectional view showing the structure of this semiconductor device, which is a modification of the structure shown in FIG. 17.

The present embodiment is a modification of the fourth embodiment. Specifically, as shown in FIG. 38, the n+ type source layer 4 is not selectively provided on the p type base layer 3, but is provided on the entire surface of the p type base layer 3.

(18th Embodiment)

A semiconductor device according to an 18th embodiment of the present invention will now be described.

Figure 39:
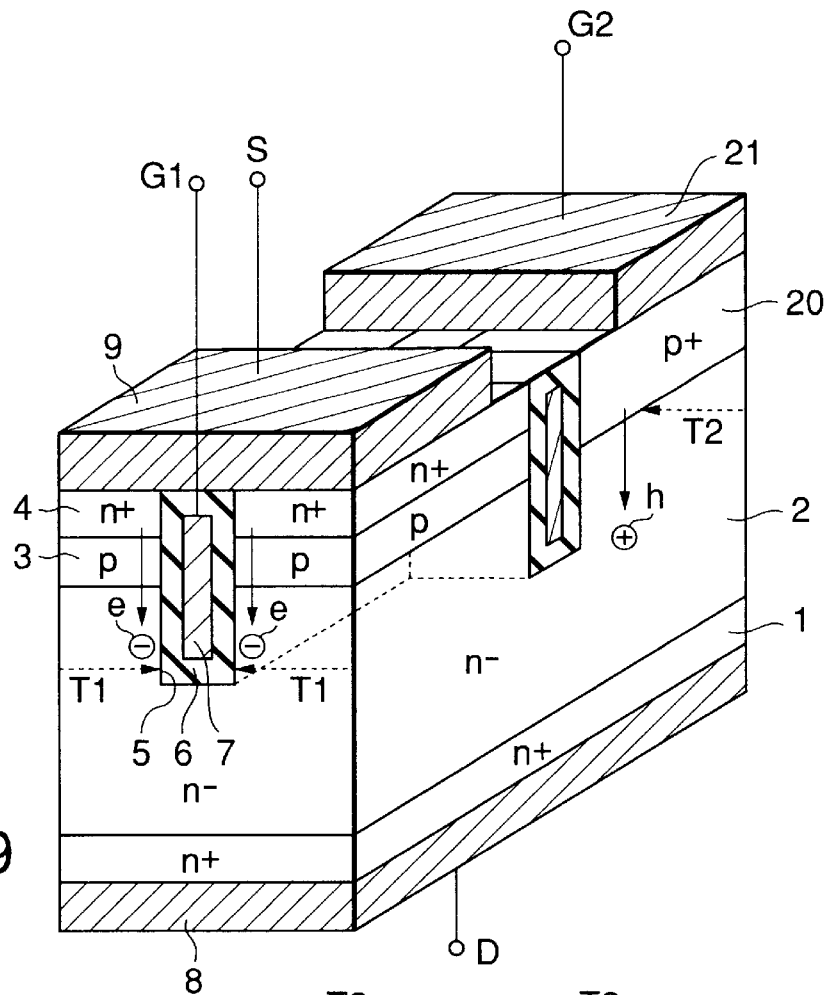
FIG. 39 is a perspective cross-sectional view showing the structure of a semiconductor device according to an 18th embodiment of the invention.
Figure 40:
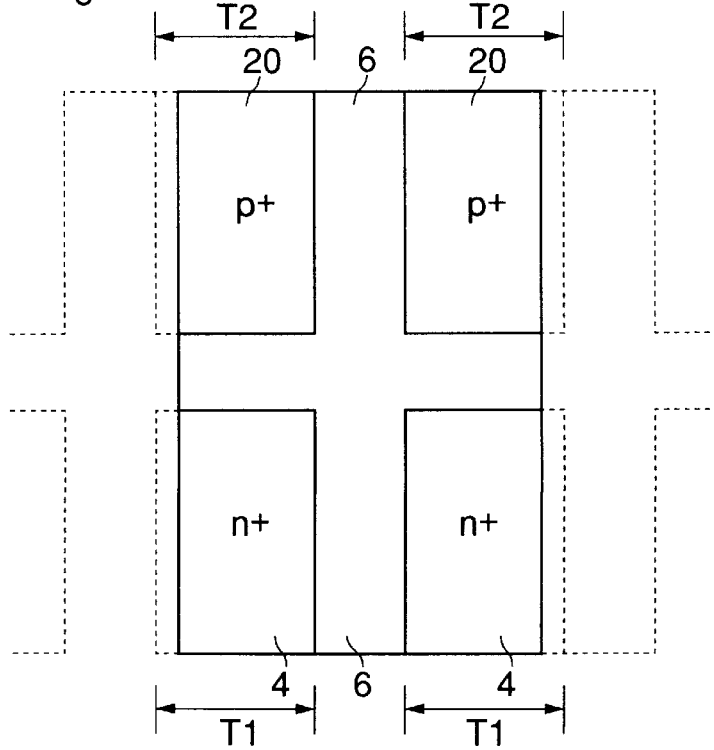
FIG. 40 is a plan view of a semiconductor layer in the 18th embodiment.

FIG. 39 is a perspective cross-sectional view showing the structure of this semiconductor device, and FIG. 40 is a plan view of a semiconductor layer of this semiconductor device. FIGS. 39 and 40 show a modification of the structure shown in FIGS. 22 and 23.

Figure 41:
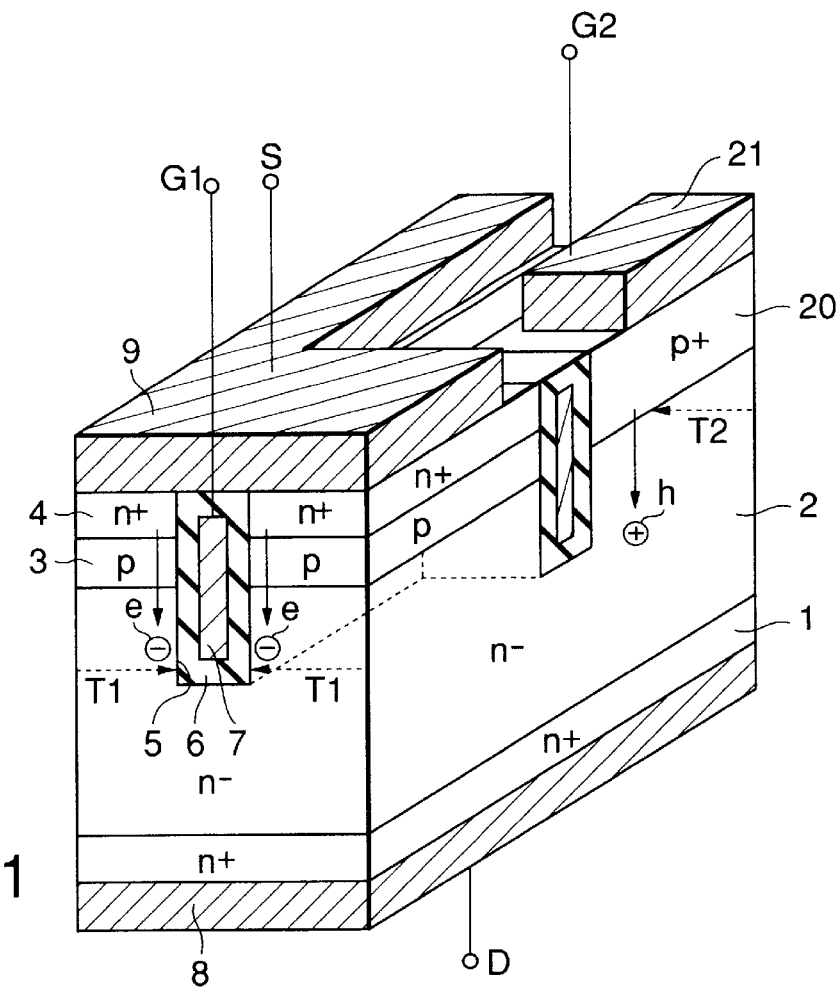
FIG. 41 is a perspective cross-sectional view showing a modified structure of the semiconductor device according to the 18th embodiment.
Figure 42:
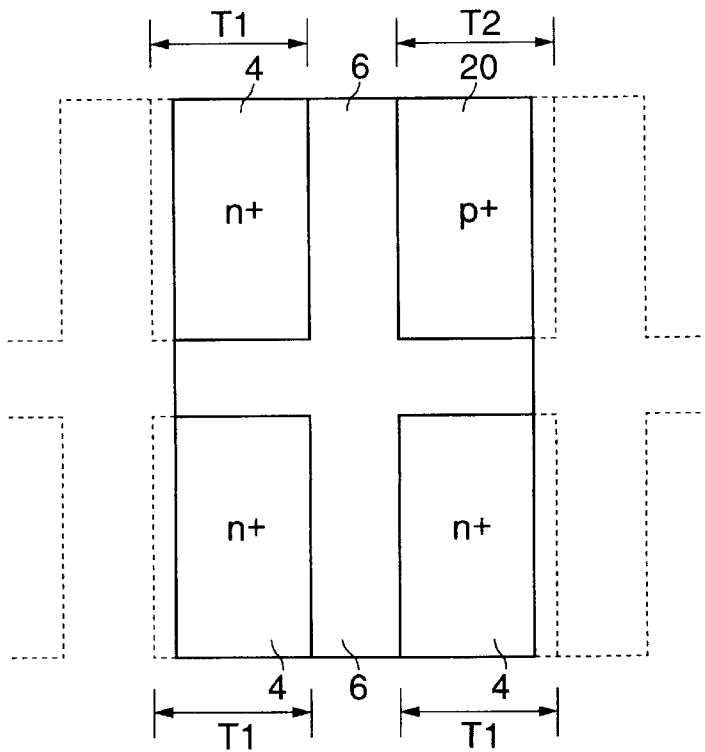
FIG. 42 is a plan view showing the modified structure of the semiconductor layer in the 18th embodiment.

The present embodiment is a modified structure of the fourth embodiment. Specifically, as shown in FIGS. 39 and 40, the n+ type source layer 4 is not selectively provided on the p type base layer 3, but is provided on the entire surface of the p type base layer 3. A structure as shown in FIGS. 41 and 42 may be adopted, as has been described above.

(19th Embodiment)

A semiconductor device according to a 19th embodiment of the present invention will now be described.

Figure 43:
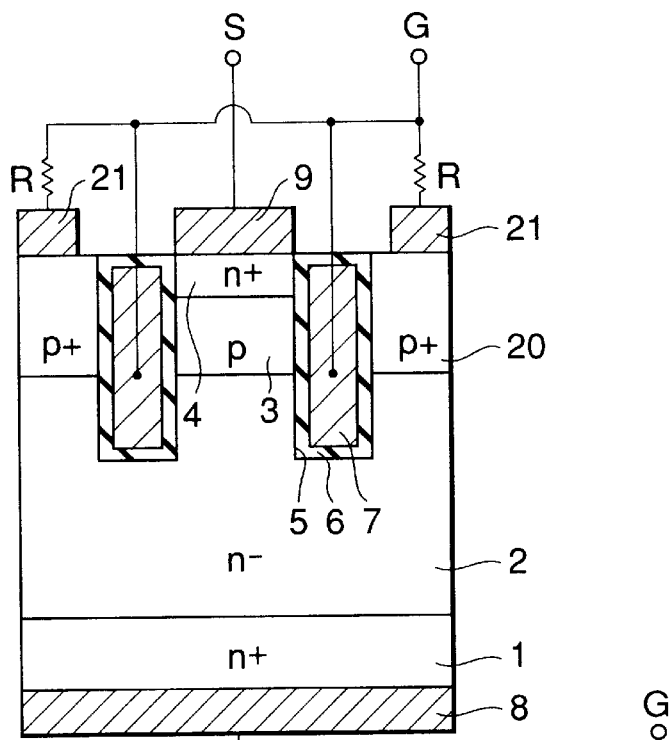
FIG. 43 is a cross-sectional view showing the structure of a semiconductor device according to a 19th embodiment of the invention.

FIG. 43 is a cross-sectional view showing the structure of this semiconductor device, which is a modification of the structure shown in FIG. 21.

The present embodiment is a modification of the seventh embodiment. Specifically, as shown in FIG. 43, the n+ type source layer 4 is not selectively provided on the p type base layer 3, but is provided on the entire surface of the p type base layer 3.

(20th Embodiment)

A semiconductor device according to a 20th embodiment of the present invention will now be described.

Figure 44:
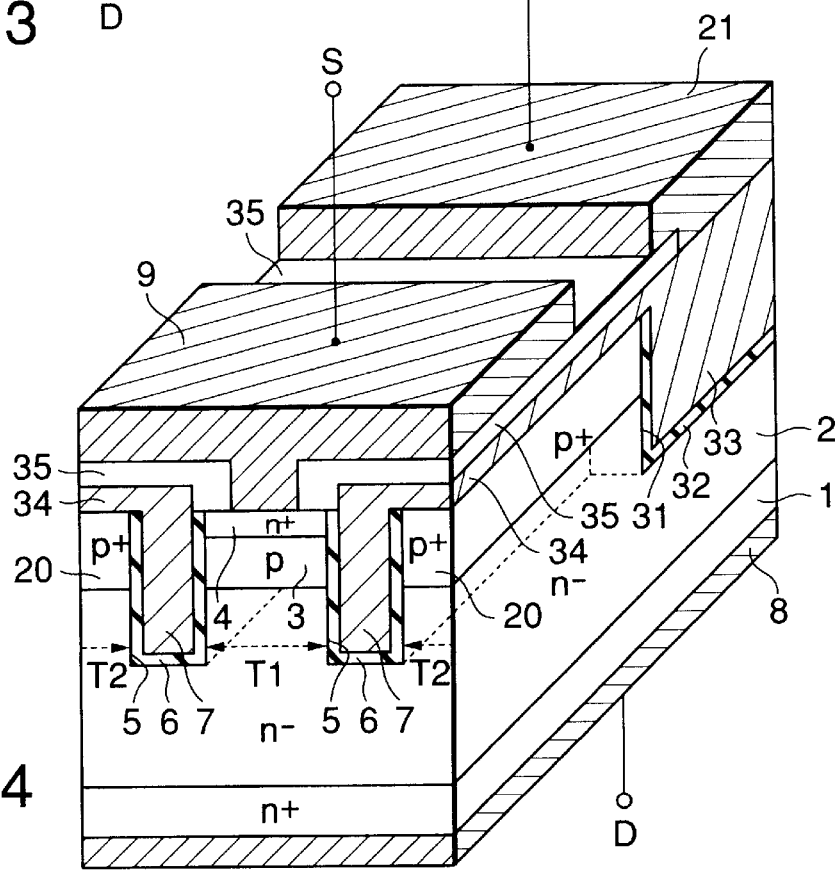
FIG. 44 is a perspective cross-sectional view showing the structure of a semiconductor device according to a 20th embodiment of the invention.
Figure 45:
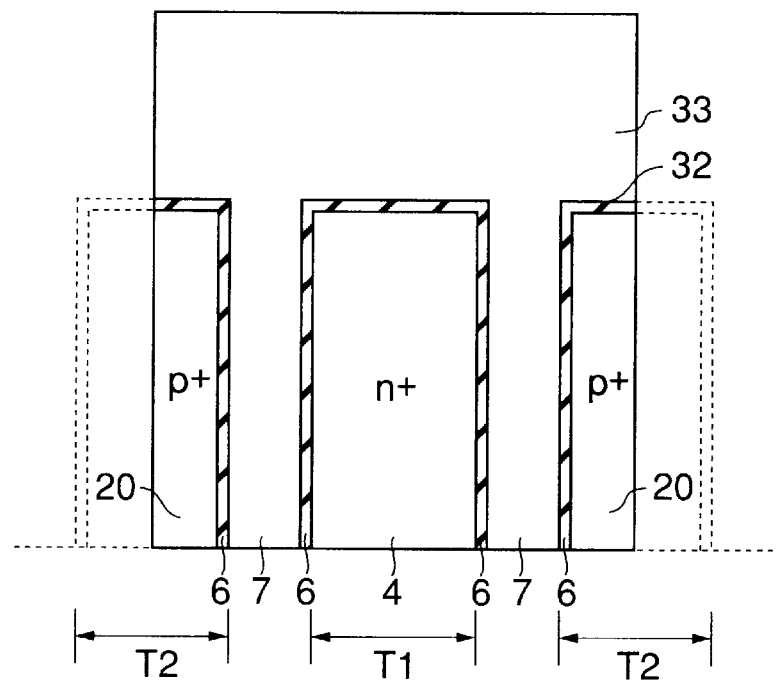
FIG. 45 is a plan view showing a surface structure of a semiconductor layer in the 20th embodiment.

FIG. 44 is a perspective cross-sectional view showing the structure of this semiconductor device, and FIG. 45 is a plan view showing the structure of a semiconductor layer of this semiconductor device.

The present embodiment is a modified structure of the fifth embodiment. Specifically, as shown in FIGS. 44 and 45, the n+ type source layer 4 is not selectively provided on the p type base layer 3, but is provided on the entire surface of the p type base layer 3.

(21st Embodiment)

A semiconductor device according to a 21st embodiment of the present invention will now be described.

Figure 46:
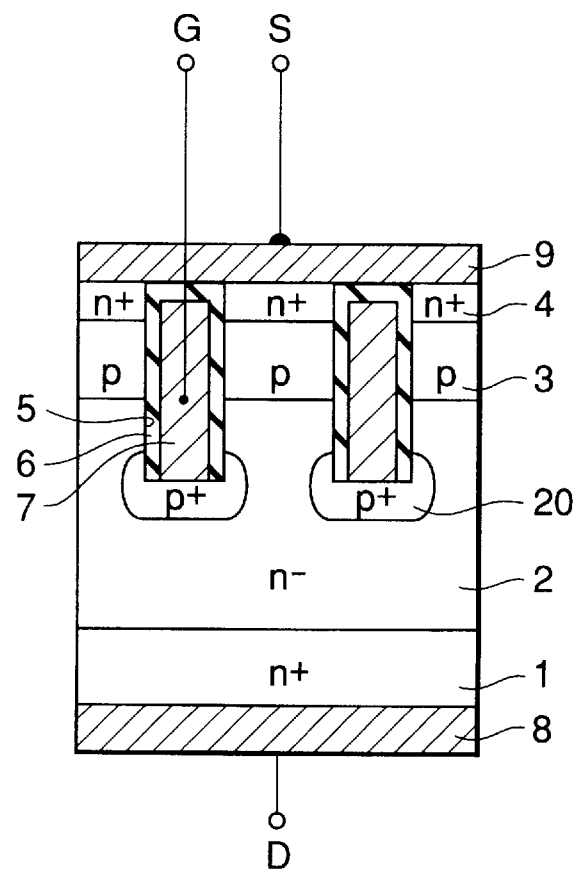
FIG. 46 is a cross-sectional view showing the structure of a semiconductor device according to a 21st embodiment of the invention.

FIG. 46 is a cross-sectional view showing the structure of this semiconductor device, which is a modification of the structure shown in FIG. 20.

The present embodiment is a modification of the sixth embodiment. Specifically, as shown in FIG. 46, the n+ type source layer 4 is not selectively provided on the p type base layer 3, but is provided on the entire surface of the p type base layer 3.

(22nd Embodiment)

A semiconductor device according to a 22nd embodiment of the present invention will now be described.

Figure 47:
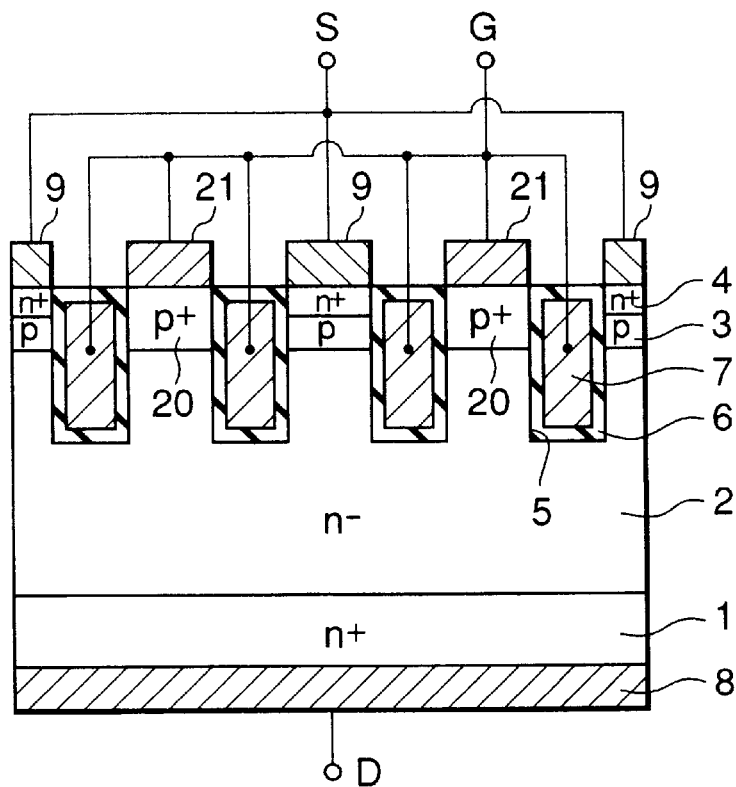
FIG. 47 is a cross-sectional view showing the structure of a semiconductor device according to a 22nd embodiment of the invention.

FIG. 47 is a cross-sectional view showing the structure of this semiconductor device, which is a modification of the structure shown in FIG. 15.

The present embodiment is a modification of the second embodiment. Specifically, as shown in FIG. 47, the n+ type source layer 4 is not selectively provided on the p type base layer 3, but is provided on the entire surface of the p type base layer 3.

(23rd Embodiment)

A semiconductor device according to a 23rd embodiment of the present invention will now be described.

Figure 48:
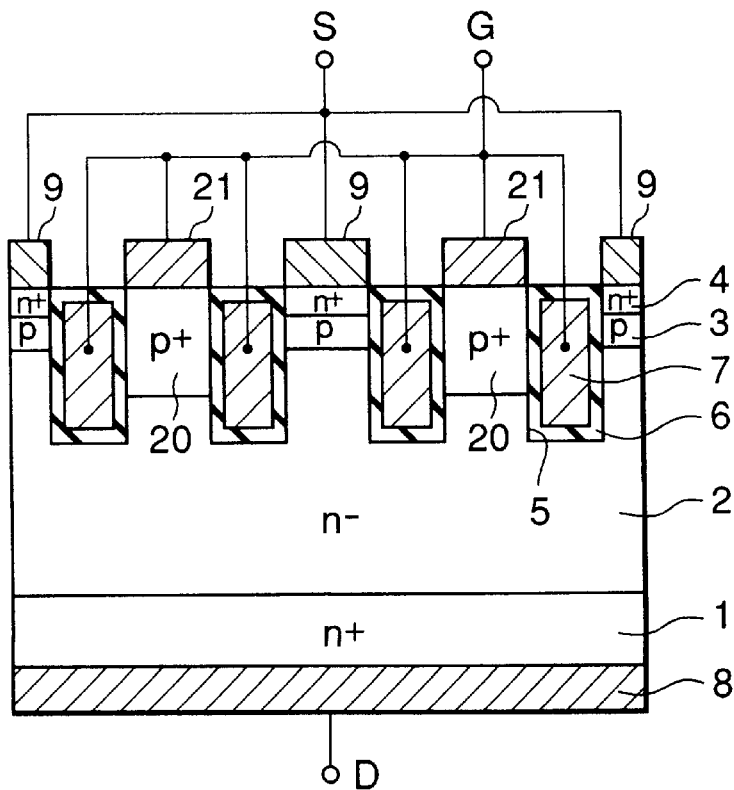
FIG. 48 is a cross-sectional view showing the structure of a semiconductor device according to a 23rd embodiment of the invention.

FIG. 48 is a cross-sectional view showing the structure of this semiconductor device, which is a modification of the structure shown in FIG. 26.

The present embodiment is a modification of the ninth embodiment. Specifically, as shown in FIG. 48, the n+ type source layer 4 is not selectively provided on the p type base layer 3, but is provided on the entire surface of the p type base layer 3.

(24th Embodiment)

A semiconductor device according to a 24th embodiment of the present invention will now be described.

Figure 49A:
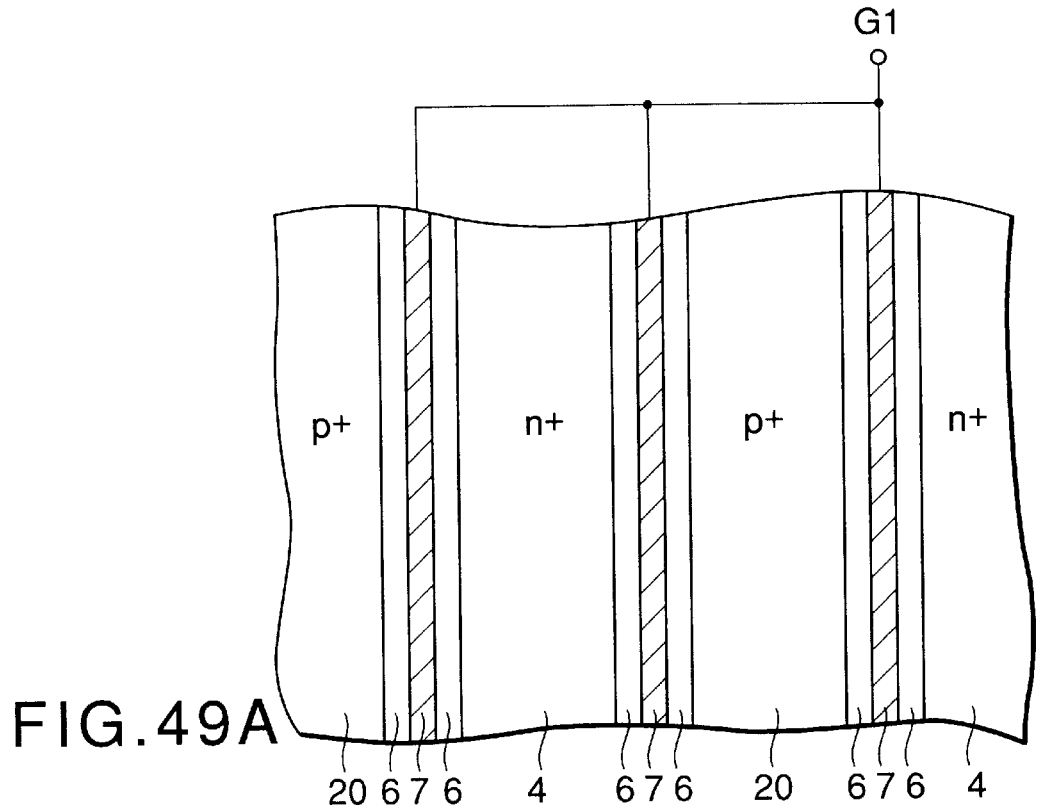
FIGS. 49A and 49B are plan views showing the structures of a surface portion of a semiconductor device according to a 24th embodiment of the invention.
Figure 49B:
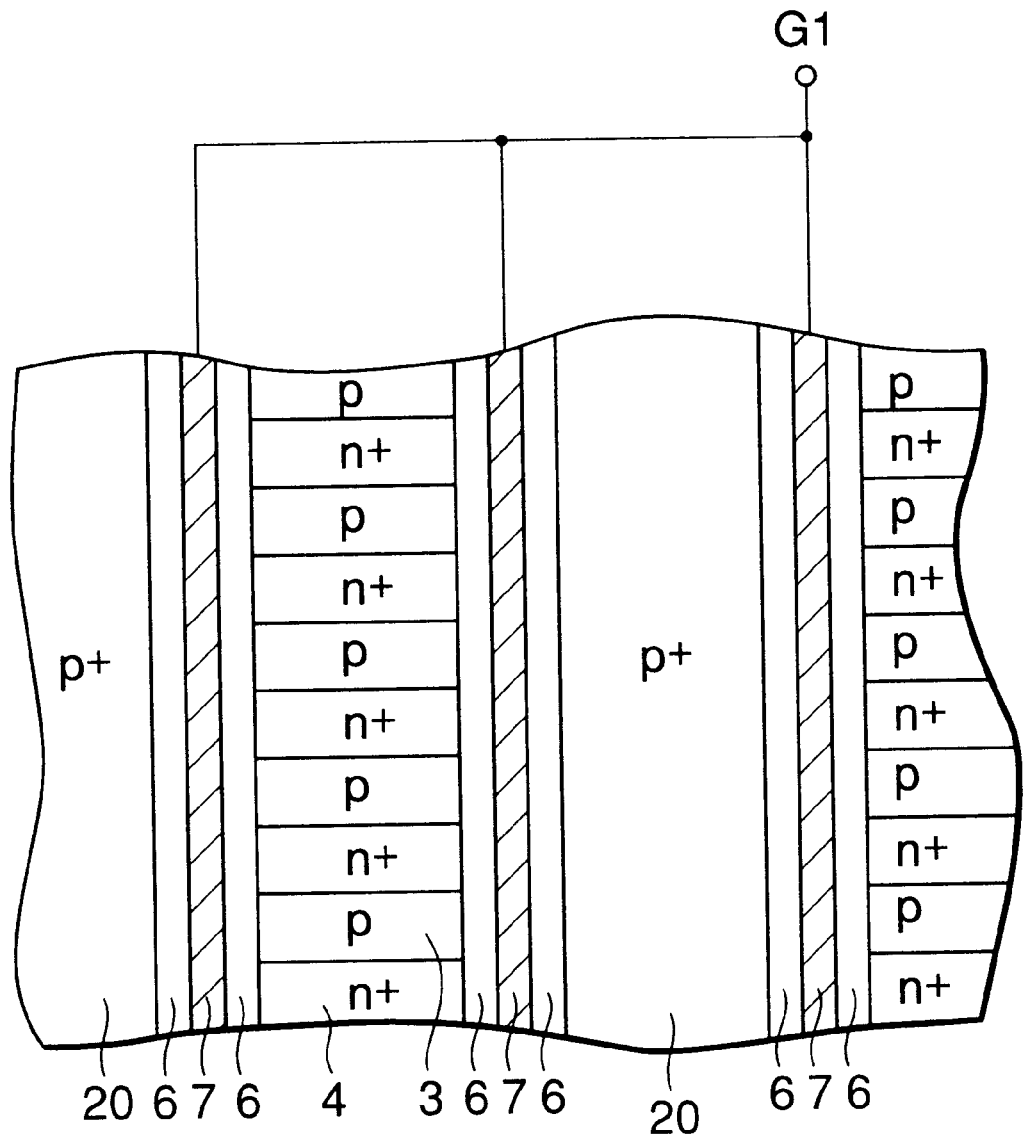

FIGS. 49A and 49B are plan views showing the structures of a surface portion of this semiconductor device, which are modifications of the structure shown in FIG. 27.

The present embodiment corresponds to the tenth embodiment, and defines the plan-view structures of the 15th, 16th, 19th, 22nd and 23rd embodiments. As shown in FIG. 49A, the p+ type injection layer 20, n+ type source layer 4 and p type base layer 3 are formed in parallel stripes. On the other hand, as shown in FIG. 49B, n+ type source layers 4 are formed on the p type base layer 3 so as to have striped wiring patterns extending in a direction perpendicular to the longitudinal direction of the p+ type injection layer 20 (or trench 5). In other words, as shown in FIG. 49B, many microscopic n+ type source layers 4 are arranged on the surface of the p type base layer 3.

Figure 50:
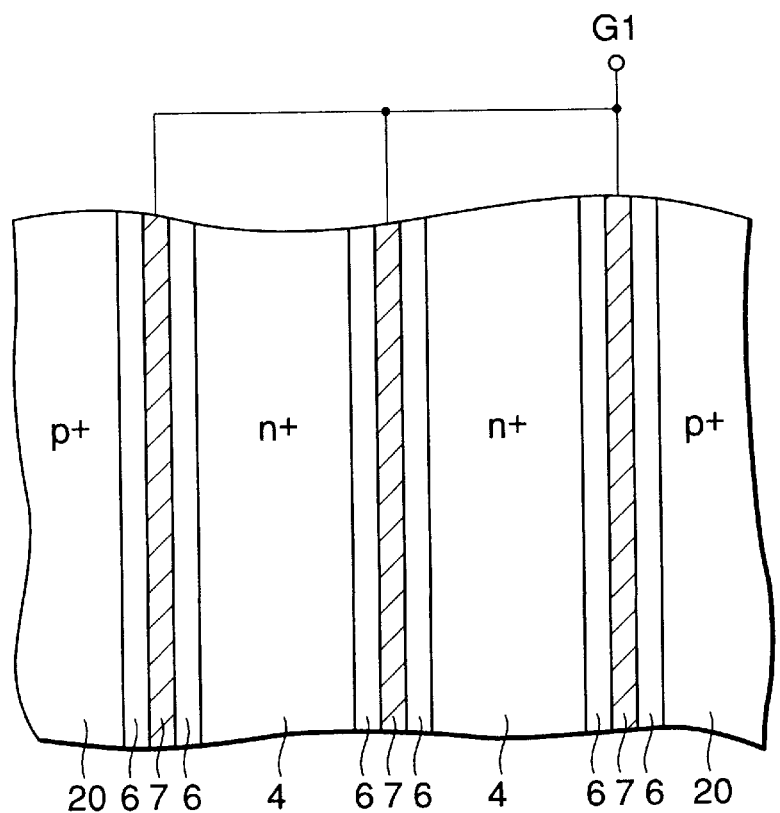
FIG. 50 is a plan view showing a modified structure of a surface portion of the 24th embodiment.

The plan-view structure of the 17th embodiment shown in FIG. 38 may be designed, as shown in FIG. 50, such that the p+ type injection layer 20, n+ type source layer 4 and p type base layer 3 are arranged in stripes. The plan-view structure of the 21st embodiment shown in FIG. 46 may be similarly designed, though not shown.

(25th Embodiment)

A semiconductor device according to a 25th embodiment of the present invention will now be described.

Figure 51:
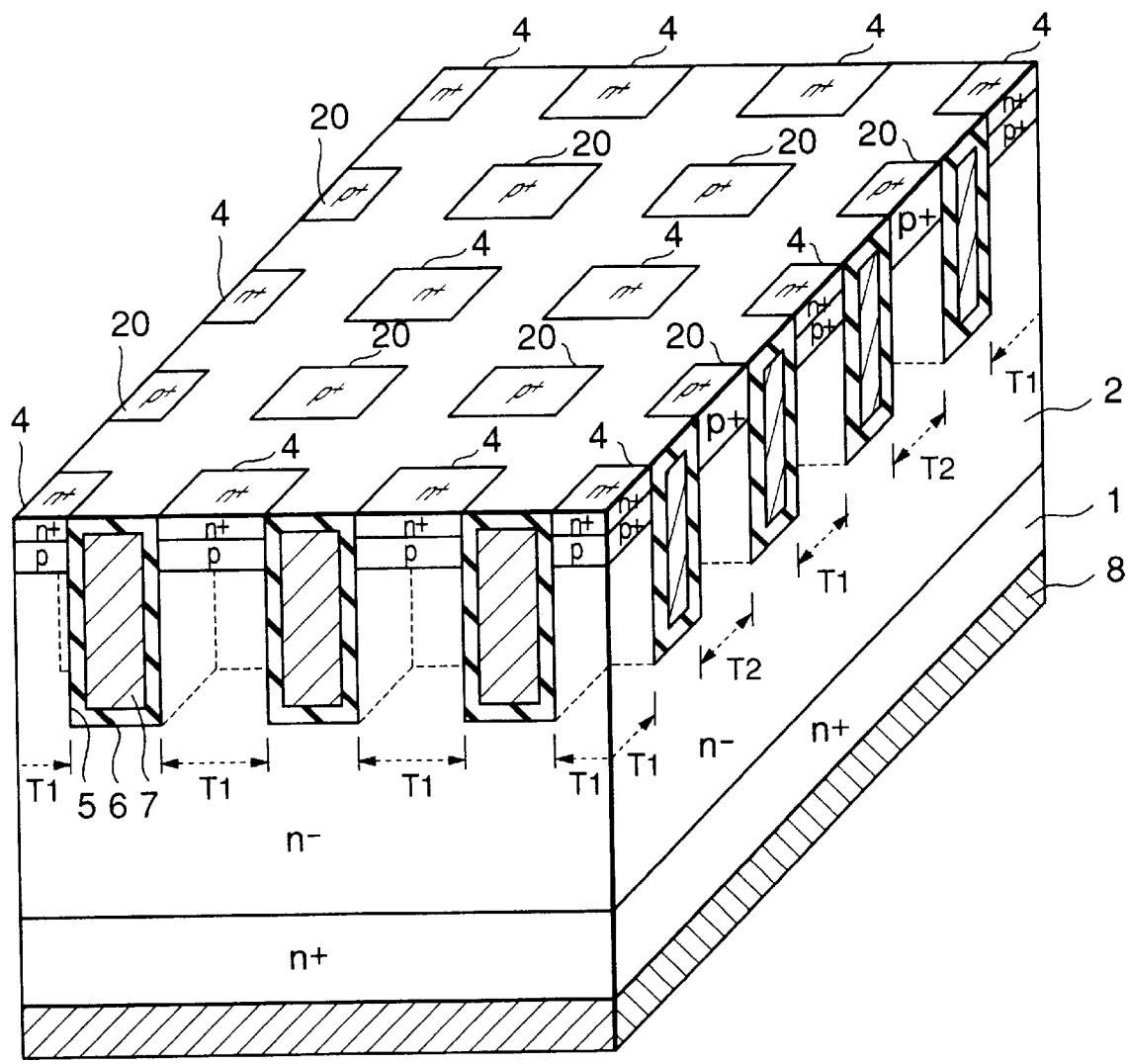
FIG. 51 is a perspective cross-sectional view showing the structure of a semiconductor device according to a 25th embodiment of the invention.

FIG. 51 is a perspective cross-sectional view showing the structure of this semiconductor device and is associated with the cross-sectional view of FIG. 35, 37, 43, 47 or 48.

The present embodiment is a modified structure of the 15th embodiment. This embodiment defines the plan-view structure of the 15th, 16th, 19th, 22nd or 23rd embodiment. Specifically, as shown in FIG. 51, trenches 5 are formed in a lattice, and inter-trench regions T1 and T2 are provided among the trenches 5 in row and column directions on the face of the sheet of FIG. 51. The first inter-trench regions T1 each comprising p type base layer 3 and n+ type source layer 4 are arranged in the row direction and also the second inter-trench regions T2 each comprising p+ type injection layer 20 are arranged in the row direction, such that the first inter-trench regions T1 and second inter-trench regions T2 are alternately arranged in the column direction.

(26th Embodiment)

A semiconductor device according to a 26th embodiment of the present invention will now be described.

Figure 52:
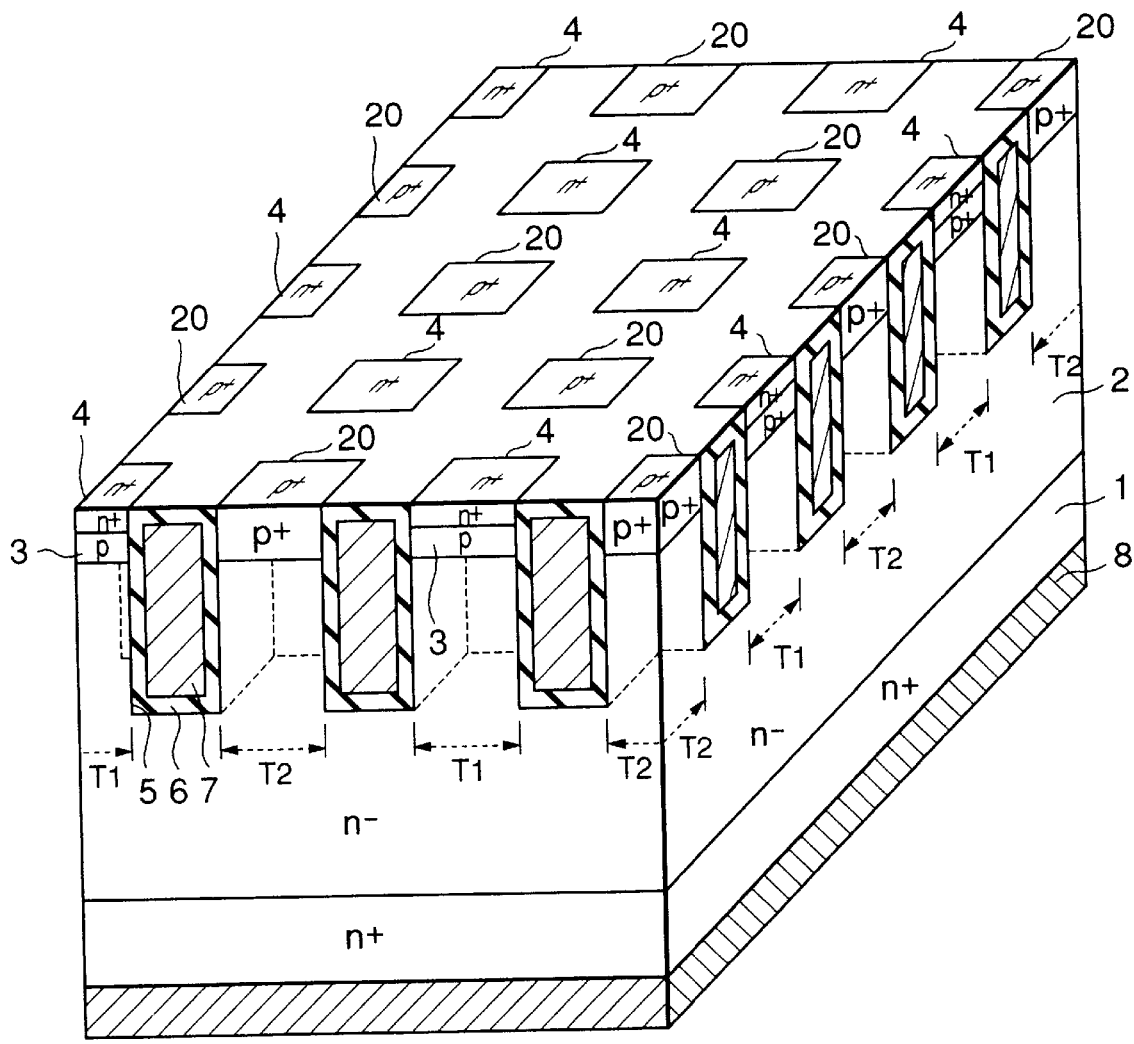
FIG. 52 is a perspective cross-sectional view showing the structure of a semiconductor device according to a 26th embodiment of the invention.

FIG. 52 is a perspective cross-sectional view showing the structure of this semiconductor device and is associated with the cross-sectional view of FIG. 35, 37, 43, 47 or 48.

The present embodiment is a modified structure of the 15th embodiment. This embodiment defines the plan-view structure of the 15th, 16th, 19th, 22nd or 23rd embodiment. Specifically, as shown in FIG. 52, trenches 5 are formed in a lattice, and inter-trench regions T1 and T2 are provided among the trenches 5 in row and column directions on the face of the sheet of FIG. 52. The inter-trench regions T1 and T2 are arranged alternately in each row, and also the inter-trench regions T1 and T2 are arranged alternately in each column.

(27th Embodiment)

A semiconductor device according to a 27th embodiment of the present invention will now be described.

Figure 53:
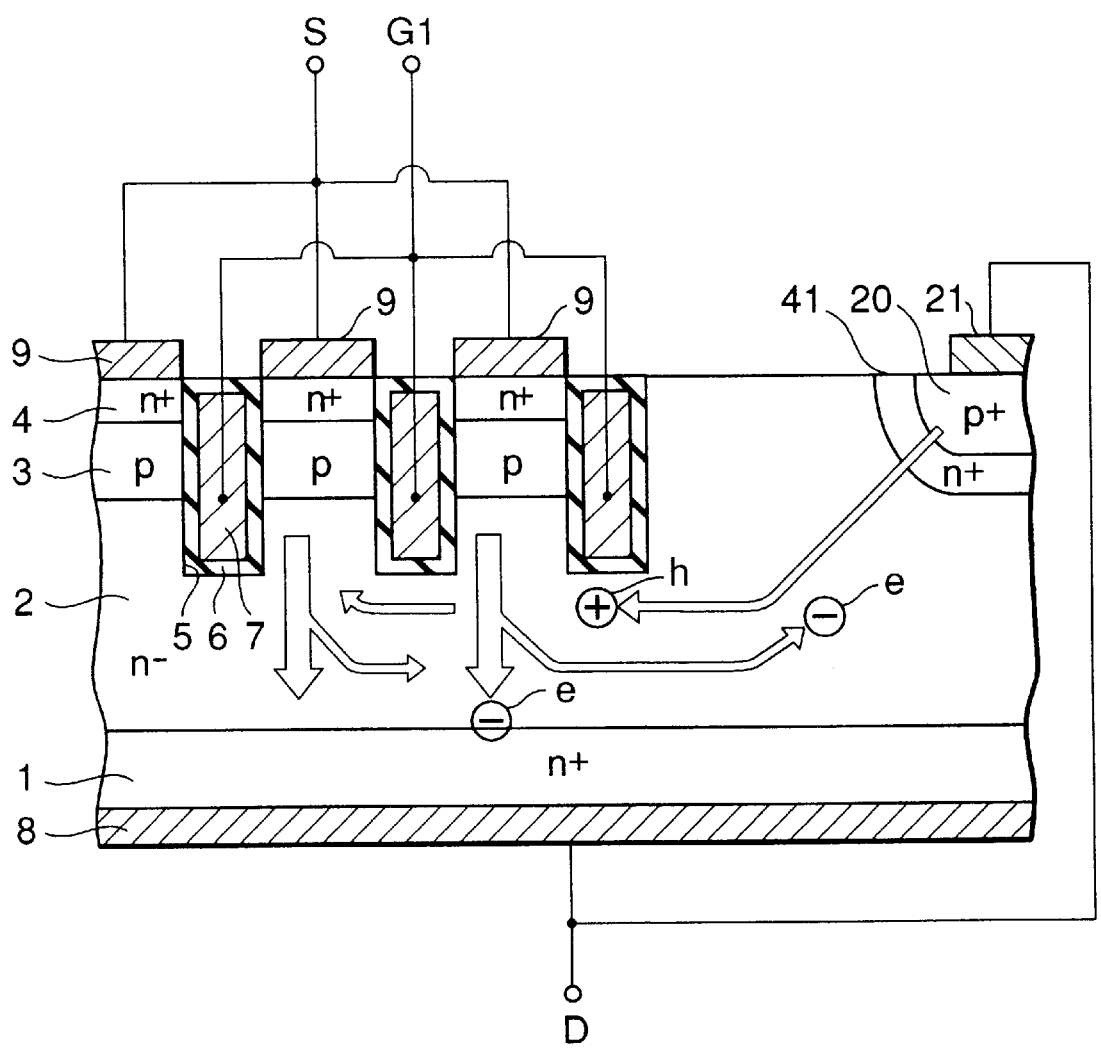
FIG. 53 is a cross-sectional view showing the structure of a semiconductor device according to a 27th embodiment of the invention.

FIG. 53 is a cross-sectional view showing the structure of this semiconductor device, which is a modification of the structure shown in FIG. 33.

The present embodiment is a modification of the 14th embodiment. Specifically, as shown in FIG. 53, the n+ type source layer 4 is not selectively provided on the p type base layer 3, but is provided on the entire surface of the p type base layer 3.

(28th Embodiment)

A semiconductor device according to a 28th embodiment of the present invention will now be described.

Figure 54A:
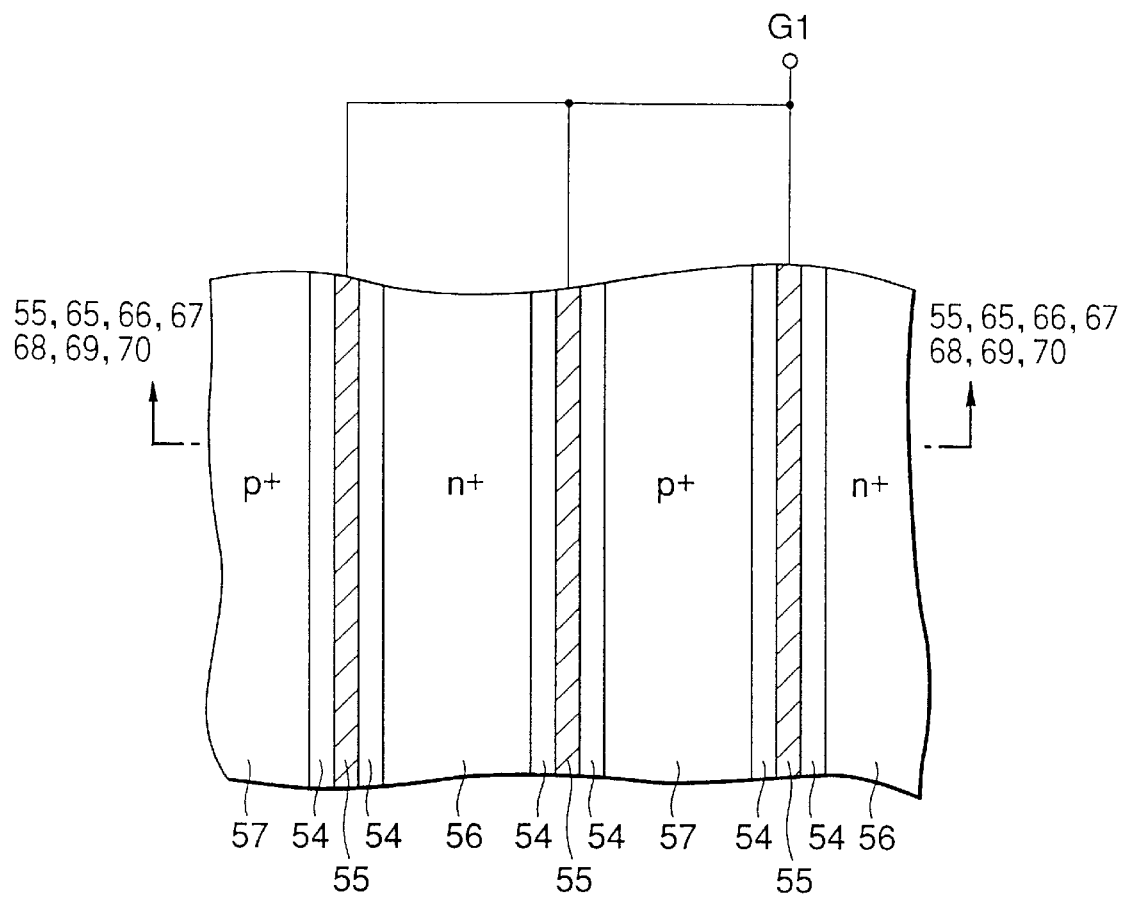
FIGS. 54A and 54B are plan views showing the structures of a semiconductor device according to a 28th embodiment of the invention.
Figure 54B:
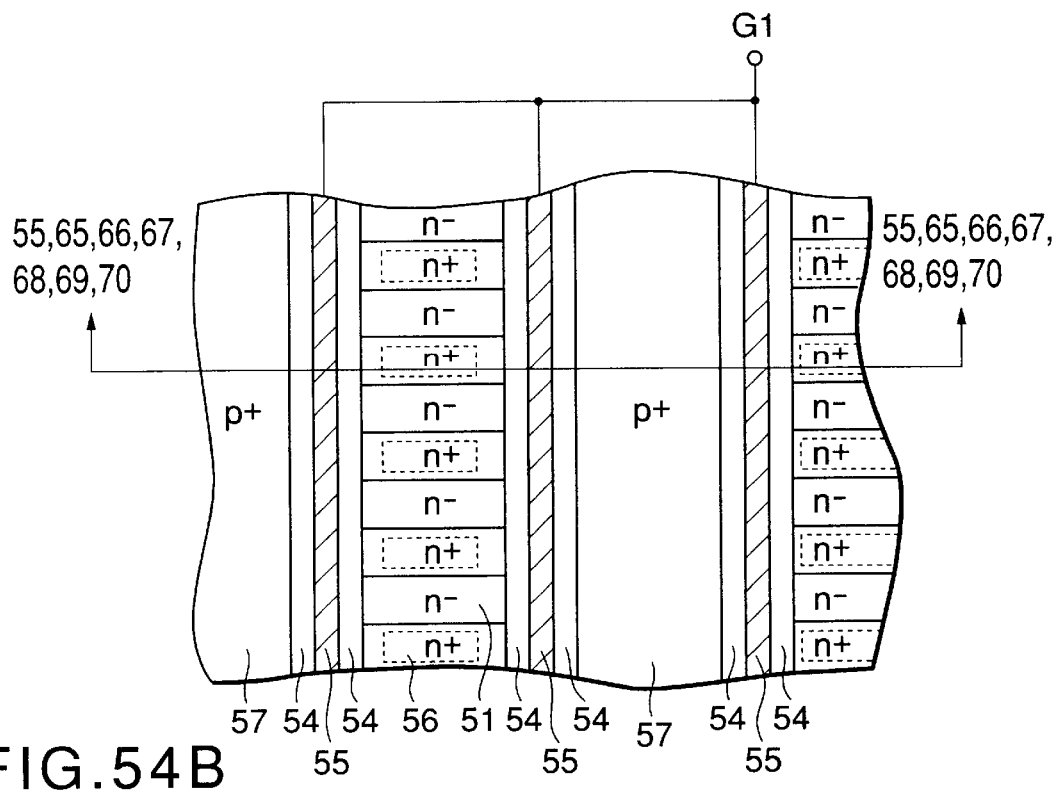
Figure 55:
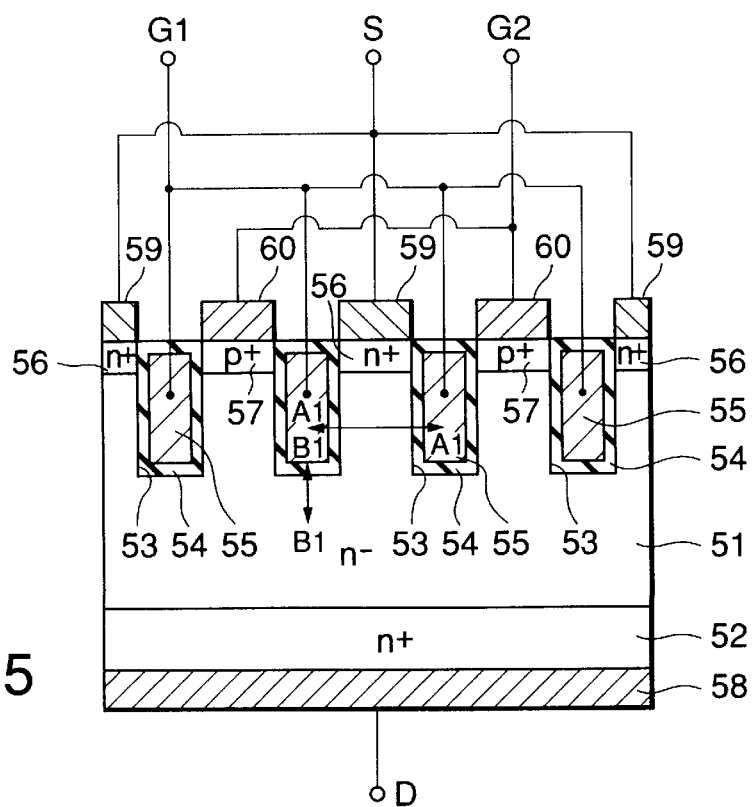
FIG. 55 is a cross-sectional view taken along line 55—55 in FIG. 54.

FIGS. 54A and 54B are plan views showing the structures of a surface portion of a semiconductor layer of this semiconductor device. FIG. 55 is a cross-sectional view taken along line 55—55 in FIGS. 54A or 54B. In this semiconductor device, a high-concentration n+ type drain layer 52 is formed on one surface of a high-resistance n− type base layer 51. A plurality of trenches 53 are formed in the other surface of the base layer 51 at narrow intervals. A first gate electrode 55 is buried in each trench 53, with a gate insulating film 54 interposed therebetween. High-concentration n+ type source layers 56 and p+ type injection layers 57 are alternately formed in inter-trench regions among the trenches 53 formed in the surface portion of the n− type base layer 51. As shown in FIGS. 54A and 55, the p+ type injection layer 20, n+ type source layer 4 and p type base layer 3 are formed in parallel stripes.

On the other hand, as shown in FIGS. 54B and 55, the n+ type source layers 56 are formed on the n− type base layer 51 in striped patterns extending in a direction perpendicular to the longitudinal direction of the p+ type injection layers 57 (or trenches 53). In other words, as shown in FIG. 54B, many microscopic n+ type source layers 56 are arranged on the surface of the n− type base layer 51. A region indicated by a broken line on the n+ type source region 56 is a contact region for contact with the source electrode 59.

On the other hand, a drain electrode 58 is formed on that surface of the n+ type drain layer 52, which is opposite to the n− type base layer 51. The source electrode 59 is formed on each n+ type source layer 56. A second gate electrode 60 is formed on each p+ type injection layer 57.

The method of manufacturing this semiconductor device and the operation thereof will now be described.

(Manufacturing Method)

Figure 56A:
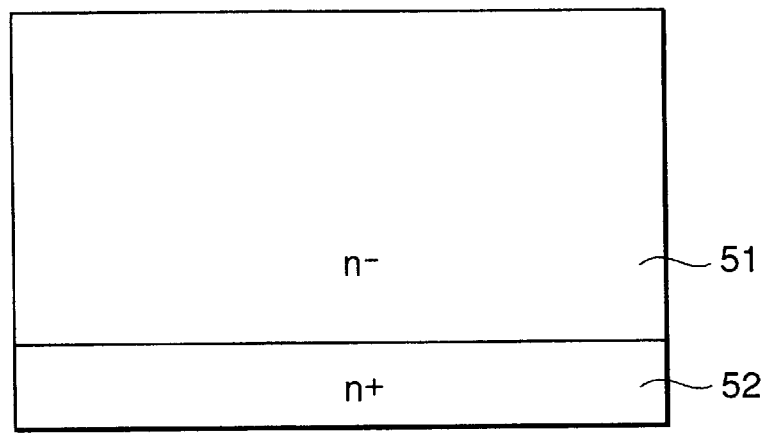
FIGS. 56A to 56C are cross-sectional views showing the steps of a method of manufacturing the semiconductor device according to the 28th embodiment of the invention.

As is shown in FIG. 56A, a high-concentration n+ type drain layer 52 is first formed on one surface of an n− type base layer 51 which is a high-resistance substrate.

Figure 56B:
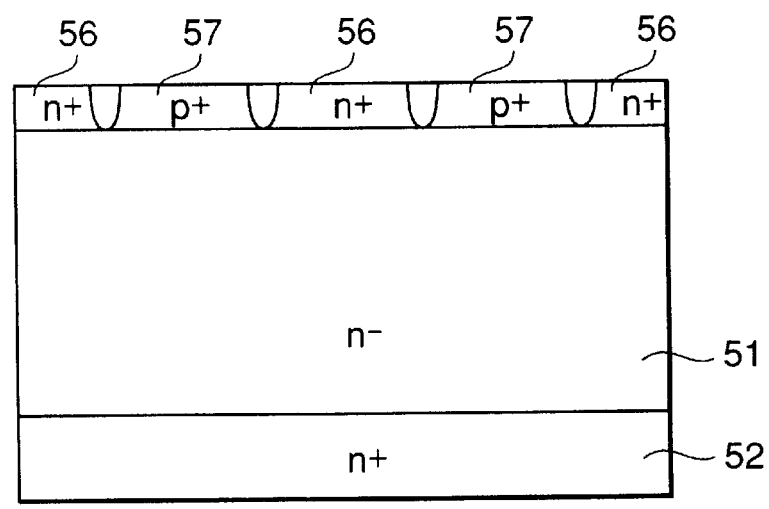

As is shown in FIG. 56B, n+ type source layers 56 and p+ type injection layers 57 are selectively formed in different regions of the other surface of the n-type base layer 51 by means of diffusion, etc.

Figure 56C:
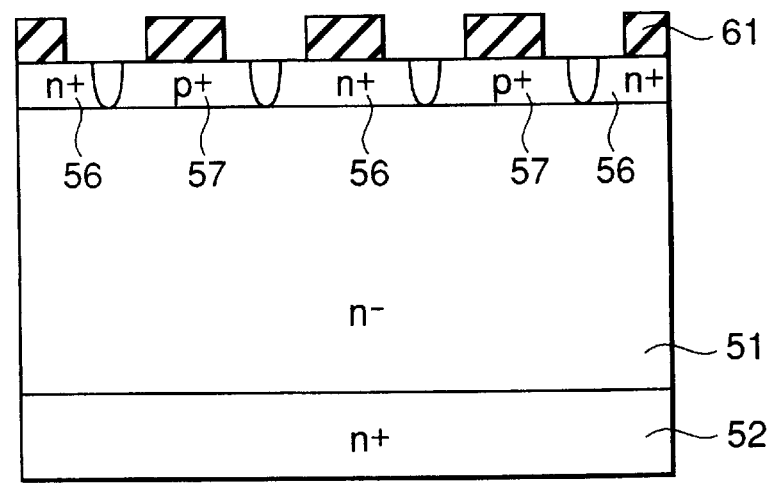

Then, as shown in FIG. 56C, insulating layers 61 are formed on the n+ type source layers 56 and p+ type injection layers 57 such that the n+ type source layers 56 and p+ type injection layers 57 are individually covered and intermediate regions among the layers 56 and 57 are exposed.

Subsequently, trenches 53 are formed in the exposed regions by conventional techniques, and a trench-structure semiconductor device is fabricated.

(Operation)

Figure 57:
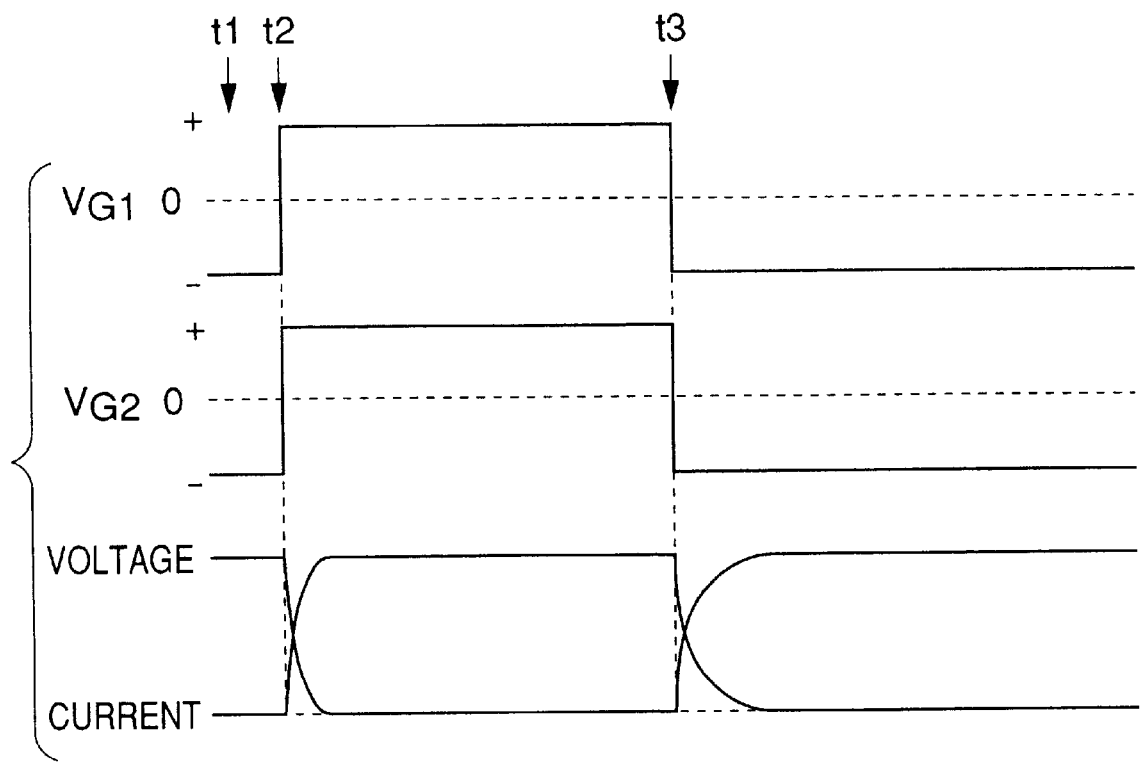
FIG. 57 is a timing chart illustrating a gate driving method for the semiconductor device according to the 28th embodiment.

This semiconductor device is switched on/off by a gate driving method according to a timing chart of FIG. 57. In FIG. 57, VG1 denotes a gate voltage to the first gate electrode 55, and VG2 denotes a gate voltage to the second gate electrode 60.

Figure 58:
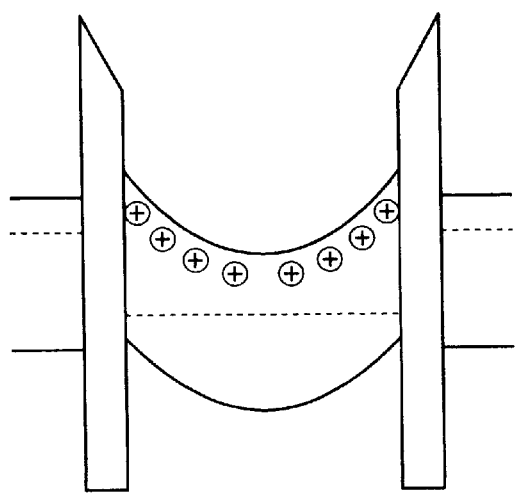
FIG. 58 shows an energy band of an inter-trench region in a non-conductive state in the 28th embodiment.
Figure 59:
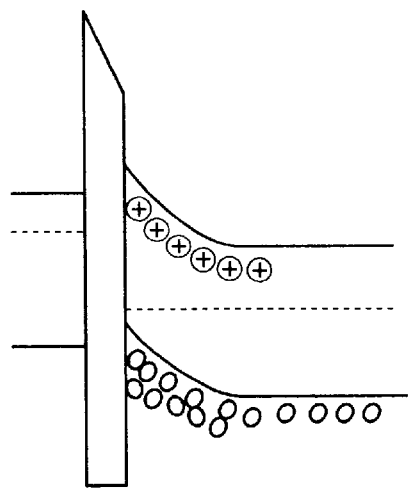
FIG. 59 shows an energy band of a trench bottom portion in a non-conductive state in the 28th embodiment.

This semiconductor device comprises semiconductor layers with an n+n-n+ type main carrier path, and this device is of the normally-on type. Thus, a negative voltage is applied to the first gate electrode 55 to set the device in the non-conductive state (time t=t1). At this time, an energy band along line A1—A1 between the trenches 53 is as shown in FIG. 58. A depletion layer extends from each trench 53 toward a middle point between the trenches 53. An energy band along line B1—B1 extending from the trench 53 toward the drain electrode 58 is as shown in FIG. 59. A depletion layer extends similarly from each trench 53 toward the drain electrode 58.

A turn-on operation of the semiconductor device will now be described.

Figure 60:
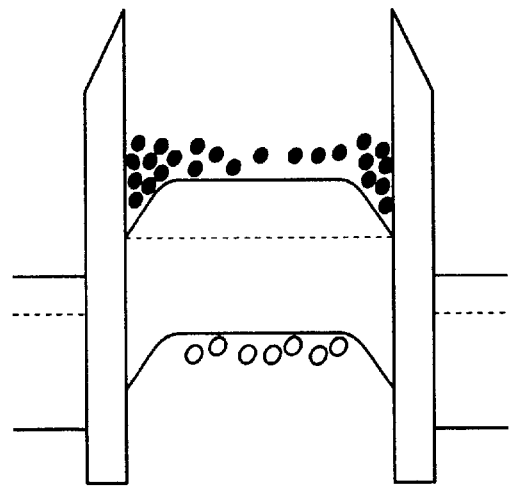
FIG. 60 shows an energy band of the inter-trench region in a conductive state in the 28th embodiment.

At the time of turn-on, a positive voltage which is positive relative to the source electrode 59 is applied to the first and second gate electrodes 55 and 60 (time t=t2). As a result, the energy band along line A1—A1 changes as shown in FIG. 60. The depletion layer formed between the trenches in the non-conductive state is eliminated, and electrons are injected from the n+ type source layer 56 into the n− type base layer 51.

Figure 61:
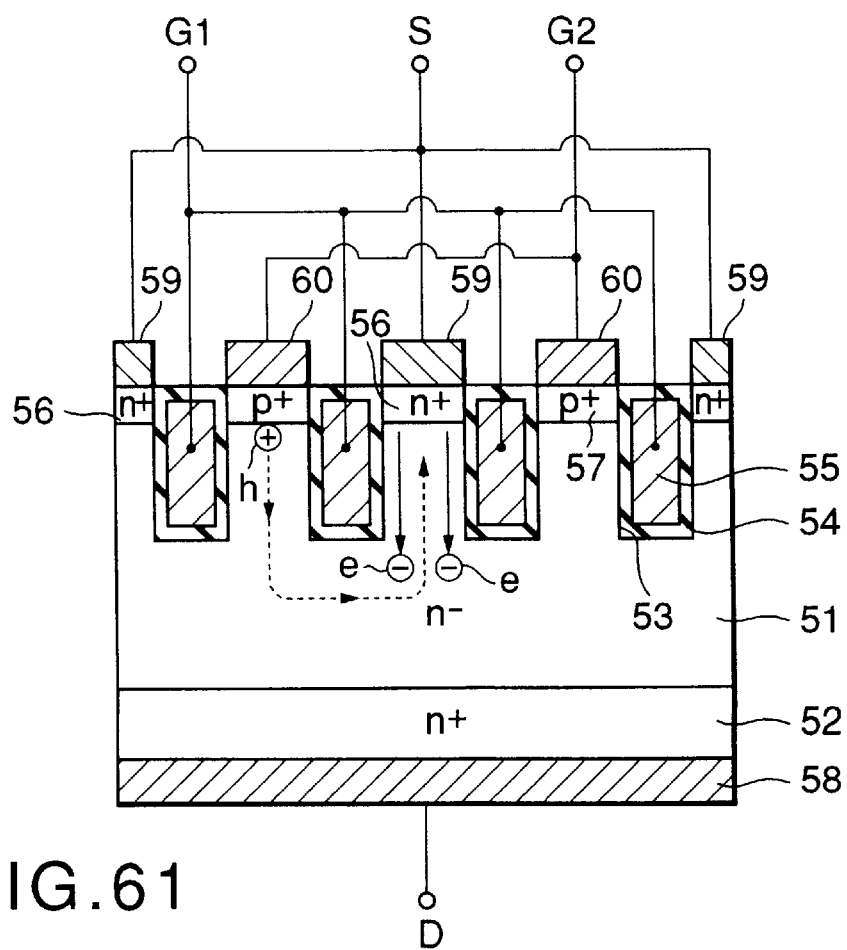
FIG. 61 shows a flow of carriers in the 28th embodiment.
Figure 62A:
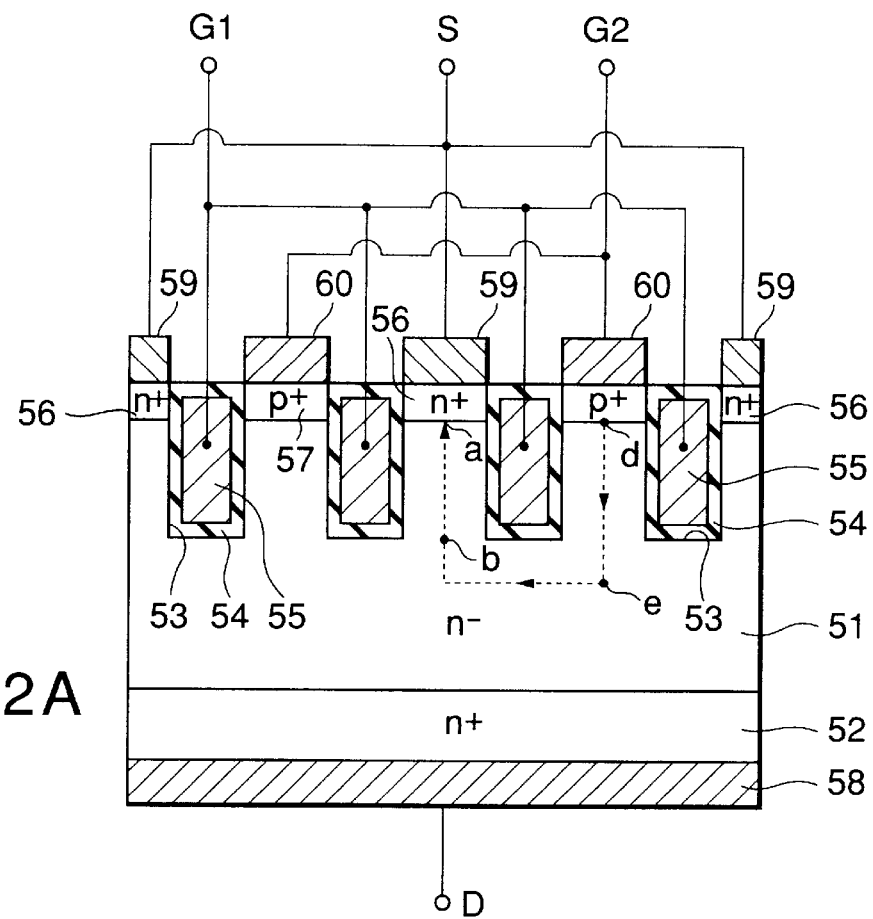
FIG. 62A and FIG. 62B show a hole density along a hole current path in the 28th embodiment.
Figure 62B:
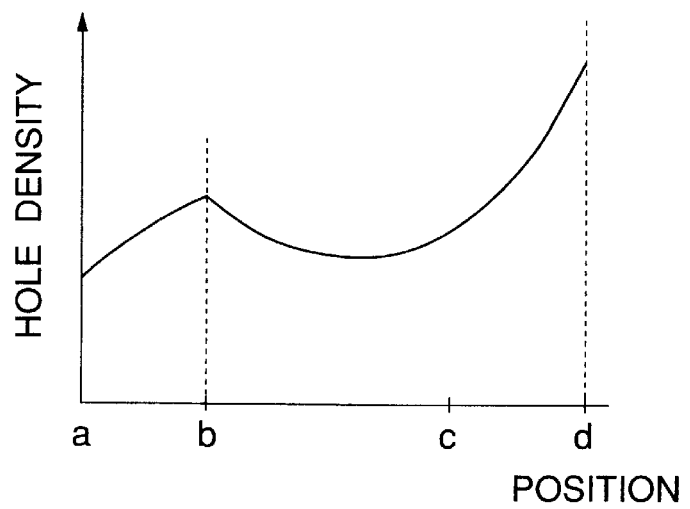

In this case, as shown in FIG. 61, electrons e are injected not only through the bulk portion of the inter-trench region but also through an accumulation layer formed near the side surface of the trench 53 as conduction paths. Further, holes h are injected from the second gate electrode 60 into the n+ type source layer 56 through the p+ type injection 57 and n− type base layer 51 near the bottom of the trench 53. Thus, carriers are accumulated in the n− type base layer 51, and a conductivity modulation occurs. FIGS. 62A and 62B show a hole density distribution along a hole current path in this case.

Figure 63:
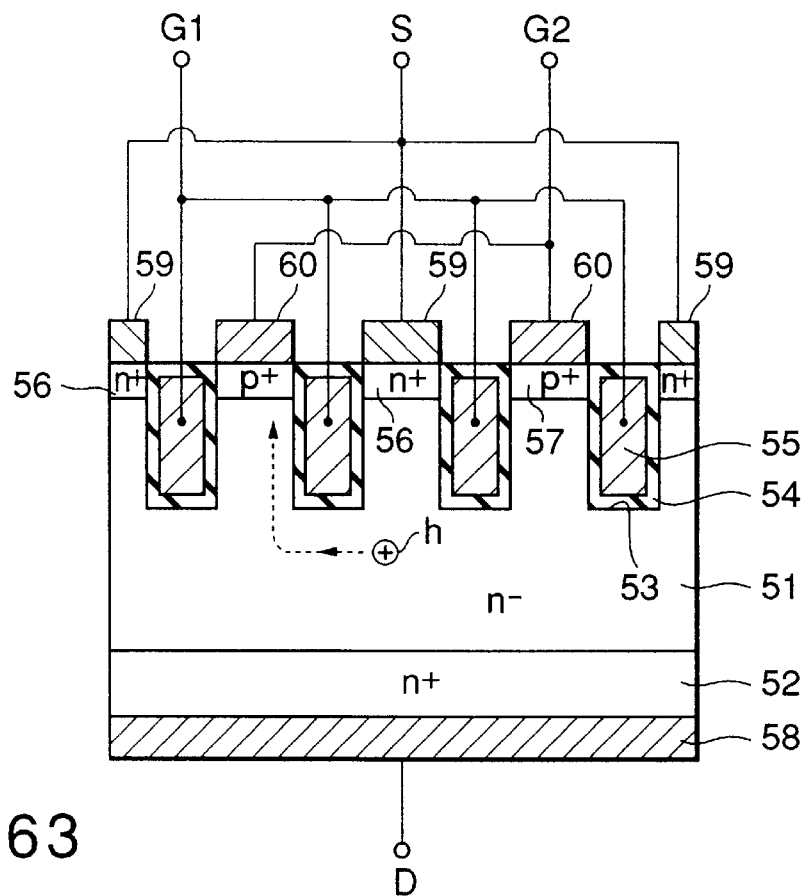
FIG. 63 shows a flow of carriers in the 28th embodiment.

On the other hand, at the time of turn-off, a negative voltage which is negative relative to the source is applied to the first and second gate electrodes 55 and 60 (time t=t3). As a result, the holes h accumulated in the n− type base layer 51 are discharged to the second gate electrode 60 via the p+ type injection layer 57. At this time, as shown in FIG. 63, the holes h are injected not only through the bulk portion of the inter-trench region but also through an inversion layer formed near the side surface of the trench as conduction paths. With the discharge of holes h, a depletion layer forms in the inter-trench region, and pitching-off is caused. Accordingly, a potential barrier to electrons e is created and the injection of electrons is stopped. Thus, the semiconductor device is turned off.

The energy band along line A1—A1 in the inter-trench region in the non-conductive state is as shown in FIG. 58.

According to the 27th embodiment, both carriers of electrons e and holes h are accumulated in the n− type base layer 51 in the turn-on state and the conductivity modulation occurs. In addition, since no pn junction is formed in the main current path, a low on-voltage not higher than a built-in voltage can be attained. The emitter injection efficiency is also enhanced.

Specifically, when a hole current flows from the p+ type injection layer 57 to the n+ type source layer 56 in the on-state, it does not easily flow through the inter-trench region because of a resistance (potential barrier) in that portion of the inter-trench region contacting the n+ type source layer 56, which extends along the side wall of the trench 53. As a result, holes h are accumulated near the bottom of the inter-trench region. With the accumulation of holes h, the injection of electrons from the n+ type source layer is accelerated, and the on-voltage is effectively decreased.

At the time of turn-off, the accumulated carriers in the n− type base layer 51 is positively discharged by the second gate electrode 60. Moreover, since the discharge path of holes h differs from the main current path, the depletion layer is surely formed in the inter-trench region and a high turn-off performance is achieved.

Figure 64:
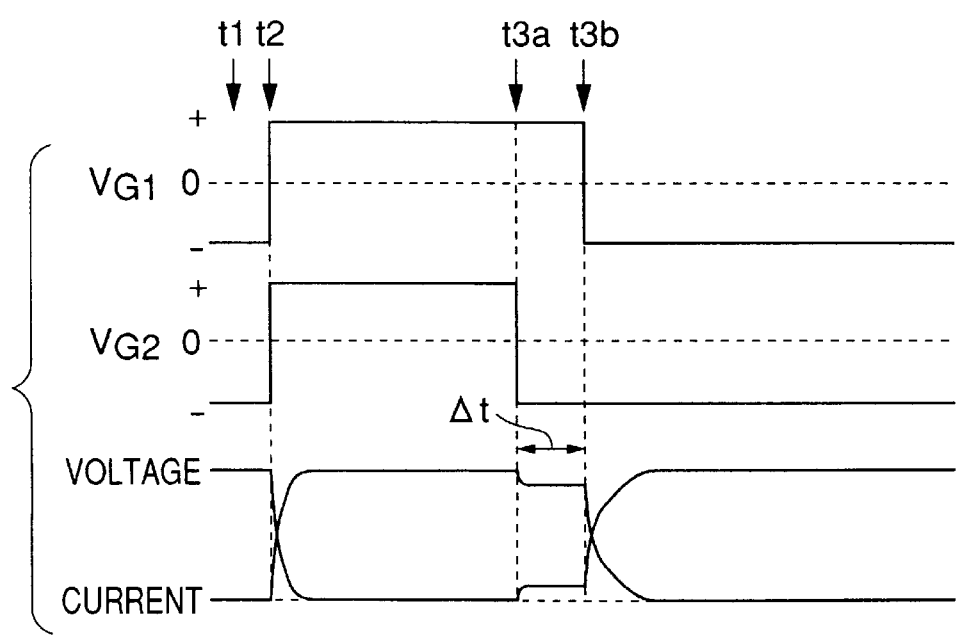
FIG. 64 is a timing chart illustrating another gate driving method for the semiconductor device according to the 28th embodiment.

The turn-off performance of this semiconductor device can be more enhanced by a gate driving method according to the timing chart of FIG. 64, than by the method according to the timing chart of FIG. 57. The operations at times t1 and t2 in the turn-off mode are the same, and a description thereof may be omitted.

At the time of turn-off, a negative voltage which is negative relative to the source electrode 59 is applied to the second gate electrode 60 (time t=t3a). In this case, electrons e are injected from the n+ type source layer to the n− type base layer 51, like the turn-on state, and flow through the accumulation layer on the side of the trench 53 and the inter-trench region. However, since the second gate electrode 60 has a negative potential, the holes h are discharged to the p+ type injection layer 57, as shown in FIG. 63.

After a predetermined time period Δt from time t3a, a negative voltage is applied to the first gate electrode 55 (time t=t3b) and the depletion layer is pinched off. Thus, the injection of electrons e is stopped and the semiconductor device is turned off.

According to this gate driving method, the holes h in the inter-trench region are discharged just before turn-off. Thus, the depletion layer is pinched off more exactly, and the turn-off loss is greatly decreased.

Needless to say, in this embodiment, the plan-view structure shown in FIG. 43 may be replaced with such a plan-view structure that the n+ type source layers 56 are formed on the n− type base layers 51 among the trenches 53 in striped patterns extending in the longitudinal direction of the p+ type injection layers 57 (or trenches 53).

(29th Embodiment)

A semiconductor device according to a 29th embodiment of the present invention will now be described.

Figure 65:
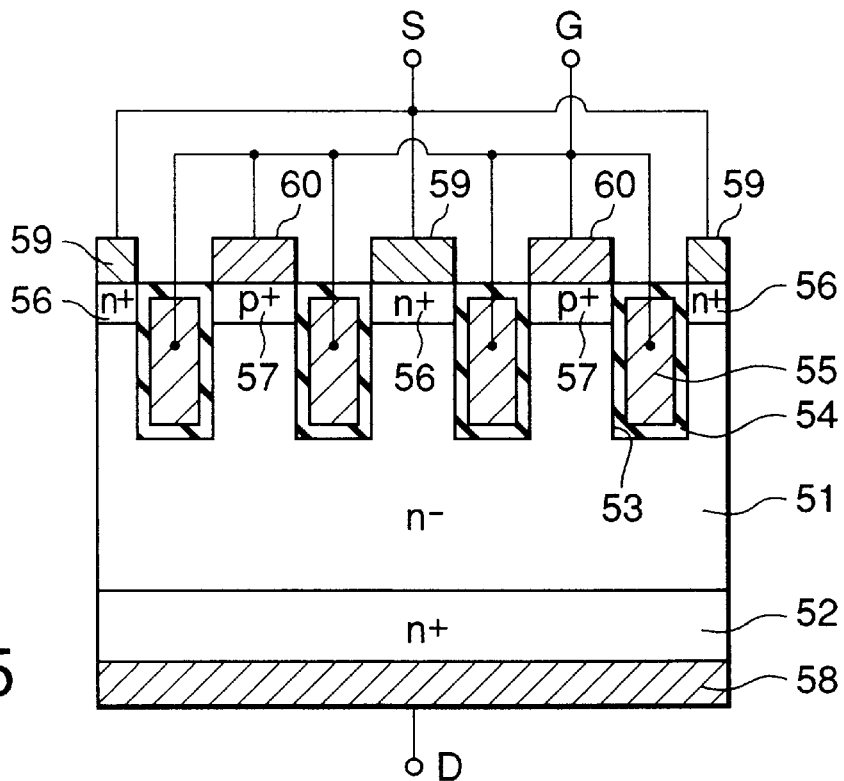
FIG. 65 is a cross-sectional view showing the structure of a semiconductor device according to a 29th embodiment of the invention.

FIG. 65 is a cross-sectional view showing the structure of this semiconductor device, which is a modification of the structure shown in FIG. 55. For example, the structure shown in FIG. 54 or the striped structure mentioned at the end of the description of the 28th embodiment can be applied to the plan-view structure of the present embodiment, as well as to various modifications of the structure shown in FIG. 55, which will be described below.

The present embodiment is a modification of the 28th embodiment. Specifically, as shown in FIG. 65, the first gate electrode 55 and second gate electrode 60 are electrically connected.

With this structure, a common gate drive circuit can be used and therefore the structure of the gate drive circuit is simplified.

(30th Embodiment)

A semiconductor device according to a 30th embodiment of the present invention will now be described.

Figure 66:
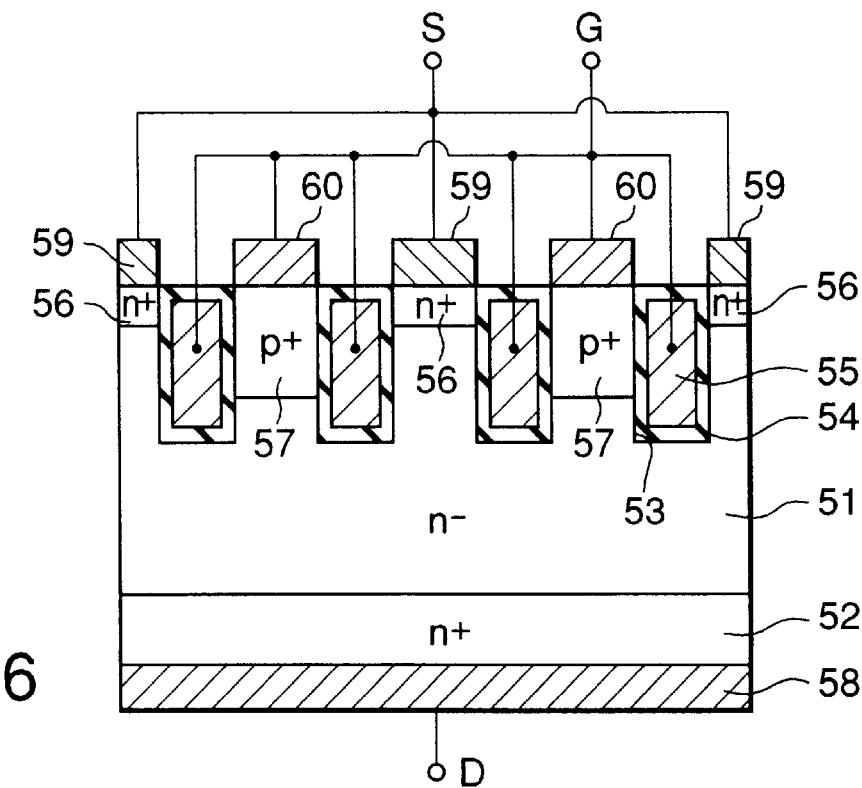
FIG. 66 is a cross-sectional view showing the structure of a semiconductor device according to a 30th embodiment of the invention.

FIG. 66 is a cross-sectional view showing the structure of this semiconductor device, which is a modification of the structure shown in FIG. 55.

The present embodiment is a modification of the 28th embodiment. Specifically, as shown in FIG. 66, the second gate electrode 60 is electrically connected to a connection path between the first gate electrode 55 and the terminal G led to the gate drive circuit (not shown), and the depth of the p+ type injection layer 57 is made greater than that of the n+ type source layer 56.

With this structure, the following advantage is obtained in addition to the advantages of the 28th embodiment. That is, since the p+ type injection layer 57 is made deeper, the injection/discharge efficiency of holes h is enhanced.

(31st Embodiment)

A semiconductor device according to a 31st embodiment of the present invention will now be described.

Figure 67:
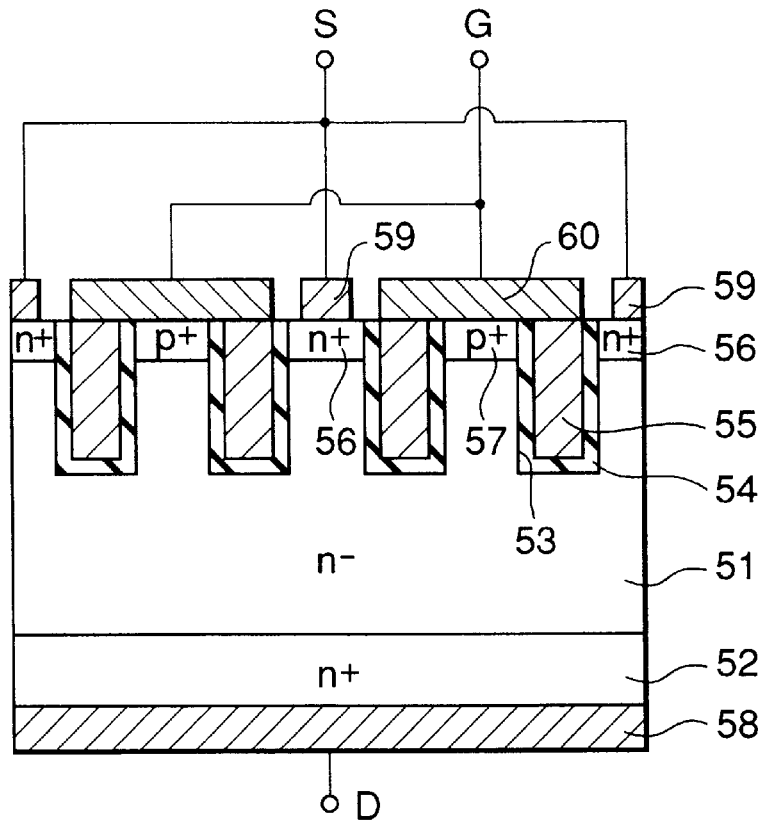
FIG. 67 is a cross-sectional view showing the structure of a semiconductor device according to a 31st embodiment of the invention.

FIG. 67 is a cross-sectional view showing the structure of this semiconductor device, which is a modification of the structure shown in FIG. 55.

The present embodiment is a modification of the 28th embodiment. Specifically, as shown in FIG. 67, that portion of the insulating film 54 in trench 53, which is located on top of the first gate 55, is removed, and the second gate electrode 60 is extended onto the first gate electrode 55, whereby both electrodes 55 and 60 are short-circuited.

With this structure, the following advantage is obtained in addition to the advantages of the 28th embodiment. That is, since the first and second gate electrodes 55 and 60 are integrated, the manufacture and drive control of the device are made easier.

(32nd Embodiment)

A semiconductor device according to a 32nd embodiment of the present invention will now be described.

Figure 68:
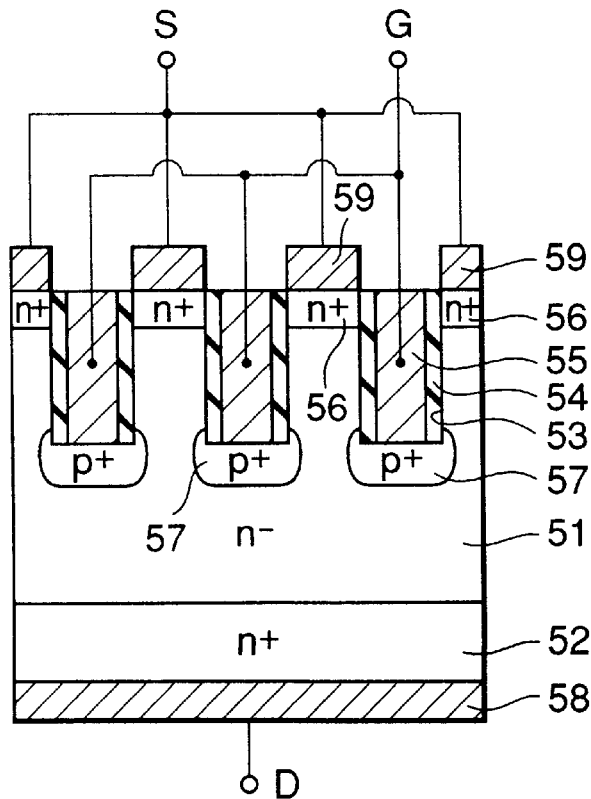
FIG. 68 is a cross-sectional view showing the structure of a semiconductor device according to a 32nd embodiment of the invention.

FIG. 68 is a cross-sectional view showing the structure of this semiconductor device, which is a modification of the structure shown in FIG. 55.

The present embodiment is a modification of the 28th embodiment, and a p+ type injection layer 57 is formed at a distal end portion of the trench gate so that holes h can be injected in the n– type base layer 51. Specifically, as shown in FIG. 68, the p+ type injection layer 57 is not provided in the surface portion of the device. The n+ type source layer is provided in the surface portion of the n– type base layer, and the p+ type injection layer 57 is provided within the n– type base layer 51 in contact with the bottom portion of the first gate electrode 55. Needless to say, all n+ type source layers 56 are commonly connected via the source electrodes 59, as with the above-described case.

With this structure, the following advantages are obtained in addition to the advantages of the 28th embodiment. The first gate electrode 55 can serve also as the second gate electrode 60. Specifically, at the time of turn-on, a positive voltage is applied to the first gate electrode 55. Thereby, the depletion layer in the inter-trench region is eliminated and the accumulation layer is formed on the side of the trench 53, as described above. In addition, the holes h can be injected from the p+ type injection layer 57 into the n– type base layer 51.

Furthermore, the p+ type injection layer 57 is provided at the bottom portion of the trench 53, and the n+ type source layer 56 is provided in the surface portion of the n– type base layer 51, where the p+ type injection layer 57 is provided in the structure shown in FIG. 63. Therefore, the amount of injected electrons e per unit area can be increased.

(33rd Embodiment)

A semiconductor device according to a 33rd embodiment of the present invention will now be described.

Figure 69:
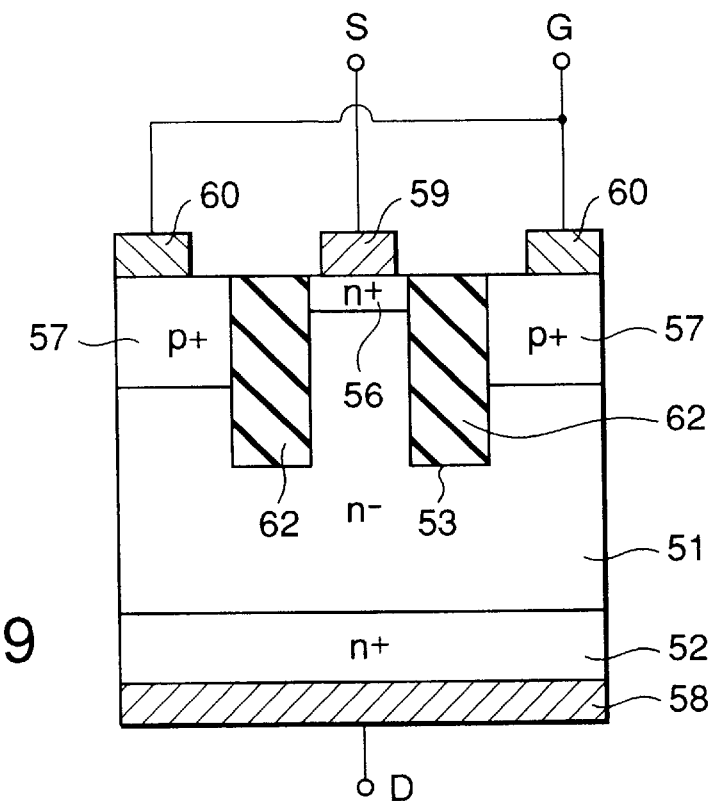
FIG. 69 is a cross-sectional view showing the structure of a semiconductor device according to a 33rd embodiment of the invention.

FIG. 69 is a cross-sectional view showing the structure of this semiconductor device, which is a modification of the structure shown in FIG. 55.

The present embodiment is a modification of the 28th embodiment. Specifically, as shown in FIG. 69, the first gate electrode 55 and the surrounding insulating film 54 are replaced with an insulating layer 62 of, e.g. $SiO_2$, provided within the trench 53.

The insulating layer 62 functions as a barrier layer while holes h injected from the p+ type injection layer 57 are flowing toward the n+ type source layer 56. Since the insulating layer 62 corresponds to the insulating film 54 when the p+ type injection layer 57 is made to function as the first gate electrode 55, it is desirable to make the insulating layer 62 as thin as an ordinary gate insulating film.

With the above structure, too, the same advantages as with the 28th embodiment can be obtained. Since the first gate electrode 55 is dispensed with and the p+ type injection layer 57 serves also as the first gate electrode 55, the construction of the device is simplified.

In the present embodiment, it is preferable to make the depth of the p+ type injection layer 57 greater than that of the n+ type source layer 56, in order to enhance the injection/discharge efficiency of holes h.

(34th Embodiment)

A semiconductor device according to a 34th embodiment of the present invention will now be described.

Figure 70:
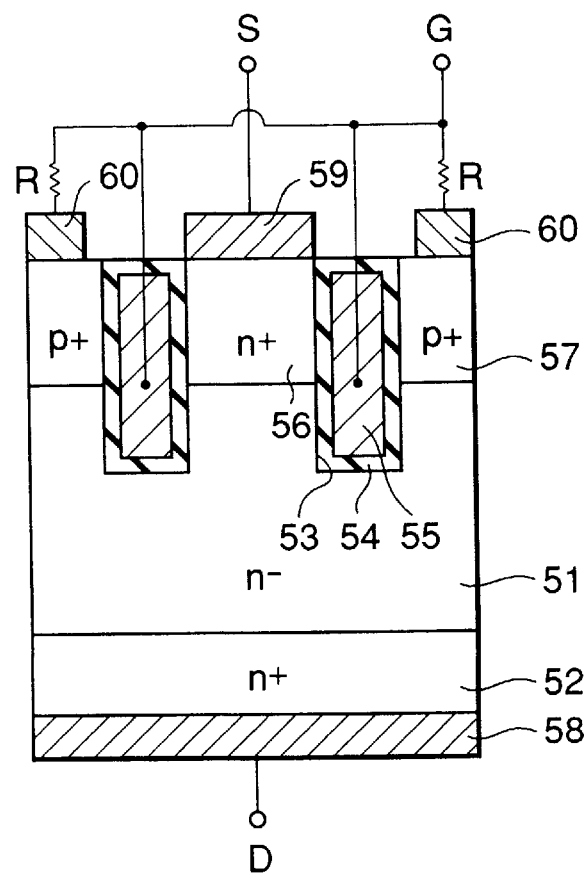
FIG. 70 is a cross-sectional view showing the structure of a semiconductor device according to a 34th embodiment of the invention.

FIG. 70 is a cross-sectional view showing the structure of this semiconductor device, which is a modification of the structure shown in FIG. 55.

The present embodiment is a modification of the 28th embodiment, and aims at simplifying the circuit configuration. Specifically, as shown in FIG. 70, a line portion between the first gate electrode 55 and the terminal G connected to a gate drive circuit (not shown) is electrically connected to the second gate electrode 60 with a resistor R interposed.

(35th Embodiment)

A semiconductor device according to a 35th embodiment of the present invention will now be described.

Figure 71:
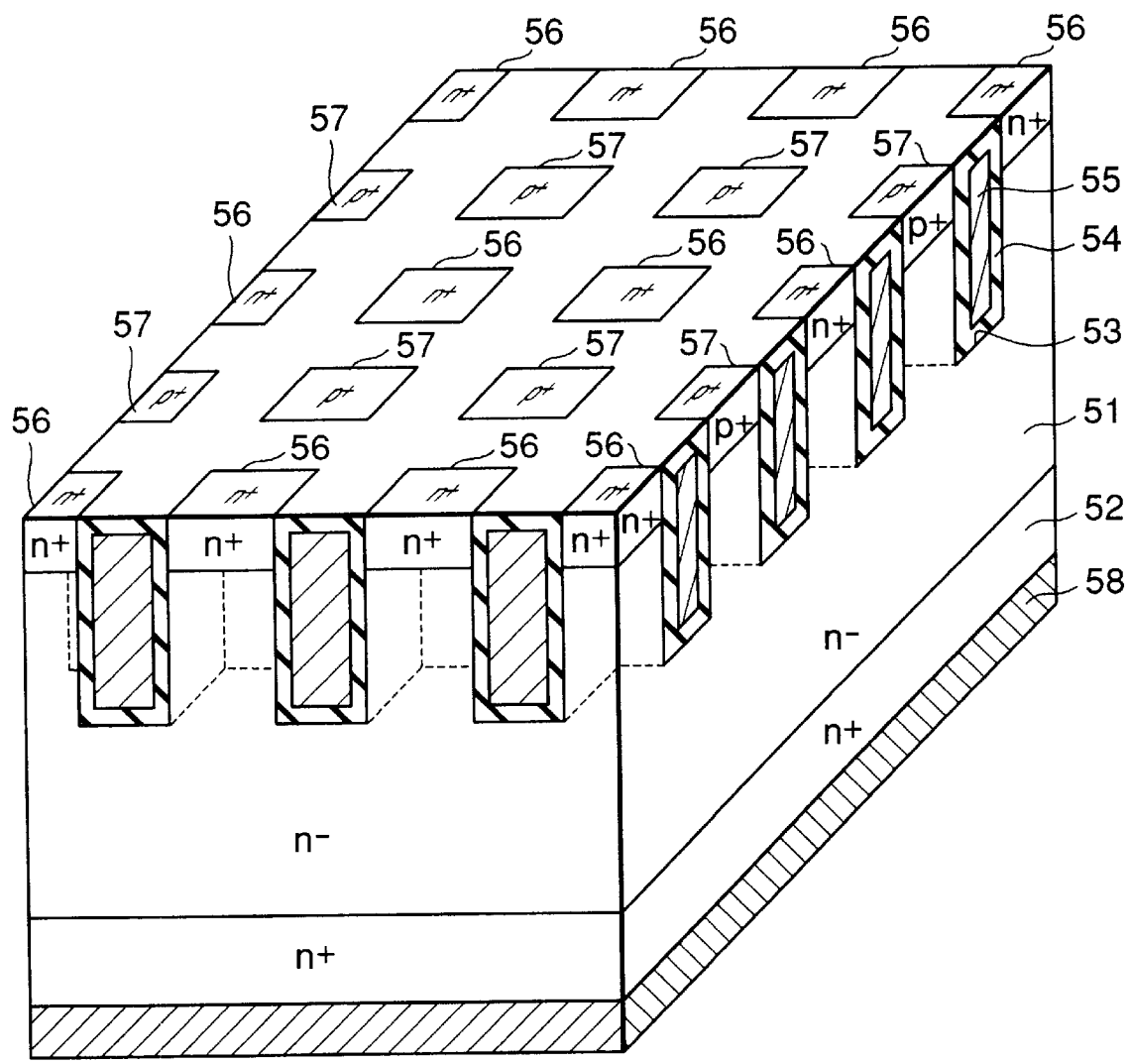
FIG. 71 is a perspective cross-sectional view showing the structure of a semiconductor device according to a 35th embodiment of the invention.

FIG. 71 is a perspective cross-sectional view showing the structure of this semiconductor device. FIG. 71 is associated with the cross-sectional view of any one of FIGS. 55 and 65 through 70.

The present embodiment defines the plan-view structure of any one of the 28th to 34th embodiments. Specifically, as shown in FIG. 71, trenches 53 are formed in a lattice, and inter-trench regions are provided among the trenches 53 in row and column directions on the face of the sheet of FIG. 71. The n+ type source layers 56 are arranged in the row direction and also the p+ type injection layers 57 are arranged in the row direction, such that the n+ type source layers 56 and p+ type injection layers 57 are alternately arranged in the column direction.

(36th Embodiment)

A semiconductor device according to a 36th embodiment of the present invention will now be described.

Figure 72:
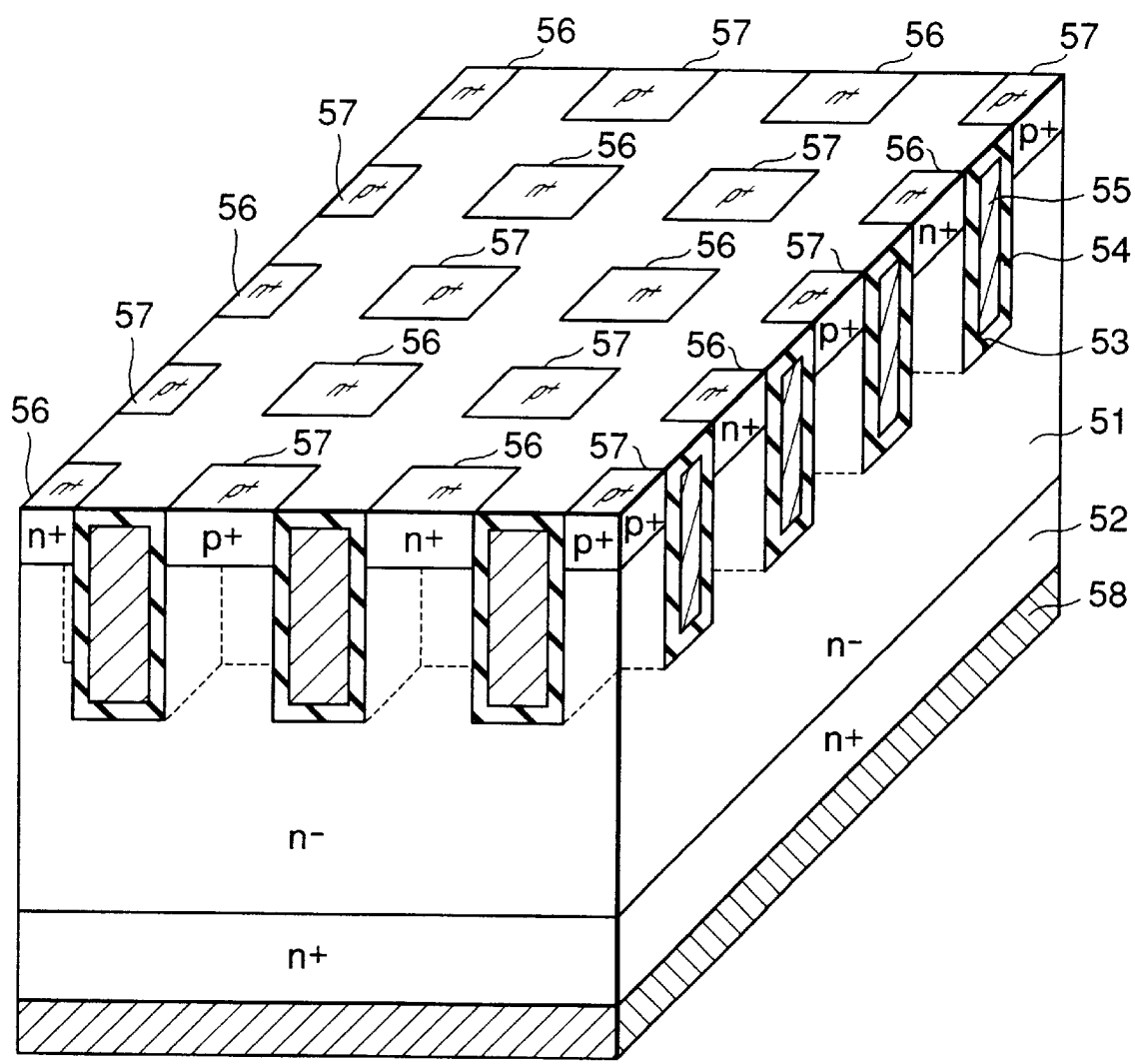
FIG. 72 is a perspective cross-sectional view showing the structure of a semiconductor device according to a 36th embodiment of the invention.

FIG. 72 is a perspective cross-sectional view showing the structure of this semiconductor device. FIG. 72 is associated with the cross-sectional view of any one of FIGS. 55 and 65 through 70.

The present embodiment defines the plan-view structure of any one of the 28th to 34th embodiments. Specifically, as shown in FIG. 72, trenches 53 are formed in a lattice, and inter-trench regions are provided among the trenches 53 in row and column directions on the face of the sheet of FIG. 71. The n+ type source layers 56 and p+ type injection layers 57 are alternately arranged in each row, and also the n+ type source layers 56 and p+ type injection layers 57 are alternately arranged in each column.

(37th Embodiment)

A semiconductor device according to a 37th embodiment of the present invention will now be described.

Figure 73:
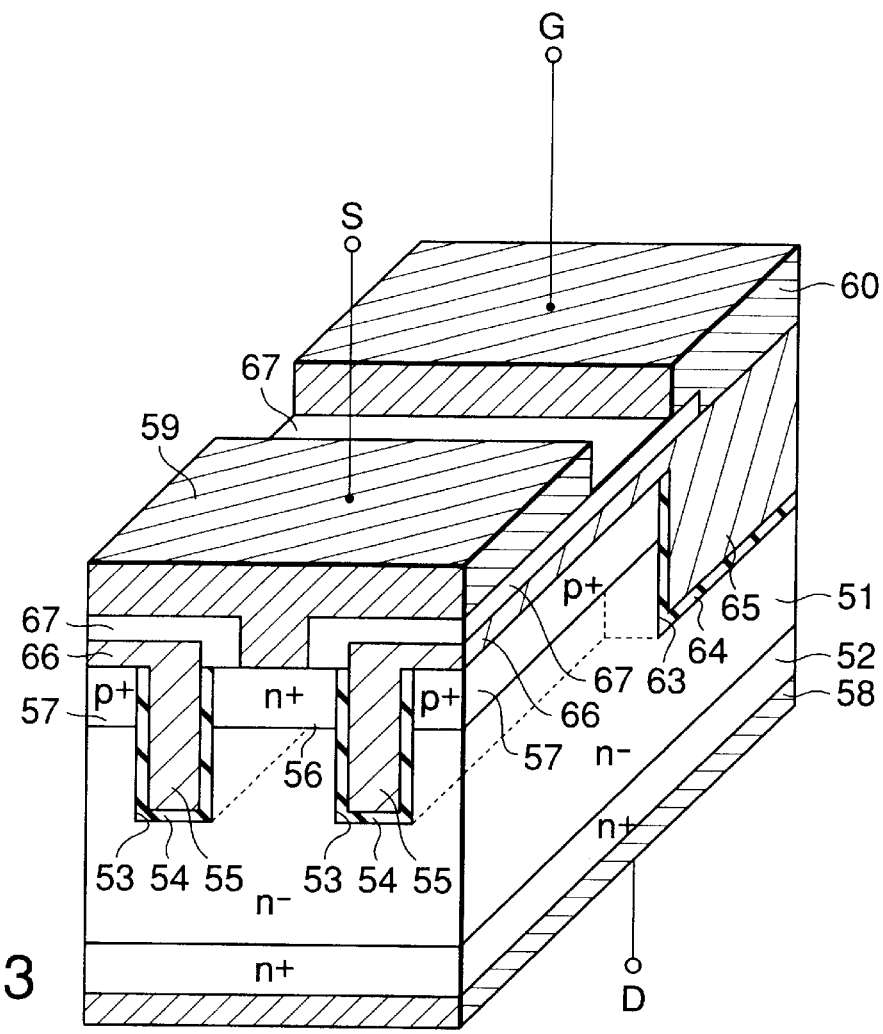
FIG. 73 is a perspective cross-sectional view showing the structure of a semiconductor device according to a 37th embodiment of the invention.
Figure 74:
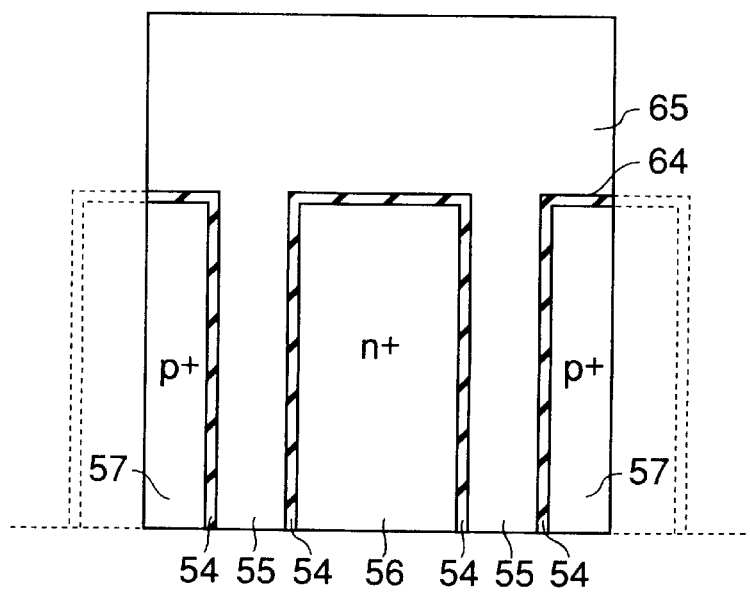
FIG. 74 is a plan view showing the structure of a surface portion of a semiconductor layer in the 37th embodiment.

FIG. 73 is a perspective cross-sectional view showing the structure of this semiconductor device, and FIG. 74 is a plan view showing a surface structure of a semiconductor layer of this semiconductor device. FIGS. 73 and 74 show a modification of the structure shown in FIG. 55.

The present embodiment is a modified structure of the 28th embodiment, and aims at integrating the first and second gate electrodes 55 and 60 and facilitating the formation of the source electrode 59 and second gate electrode 60. Specifically, as shown in FIG. 73, a buried electrode 65 is formed away from the inter-trench regions, and above the n− type base layer 51 and below the second gate electrode 60, with a trench 63 and an insulating film 64 interposed. The buried electrode 65 is put in contact with the first gate electrode 55 via a region above the p+ type injection layer 57. A connection path between the buried electrode 65 and first gate electrode 55 is put in indirect contact via an insulating film 67.

(38th Embodiment)

A semiconductor device according to a 38th embodiment of the present invention will now be described.

Figure 75:
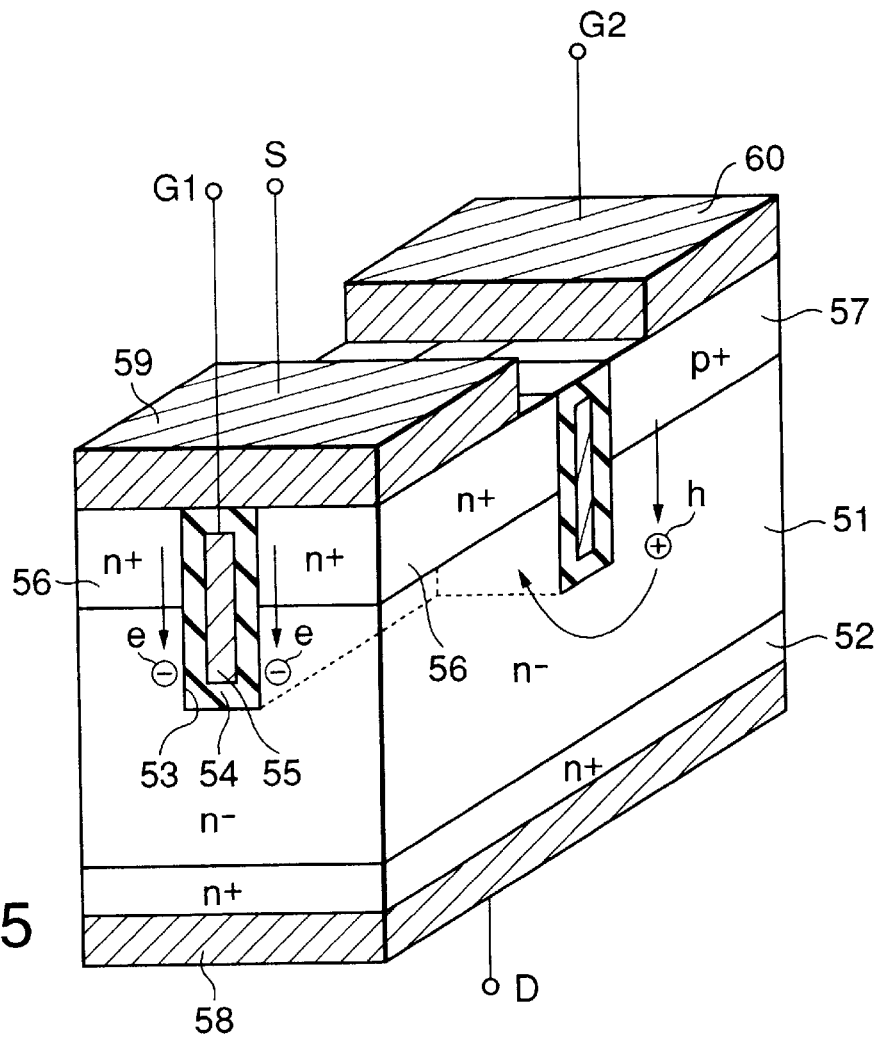
FIG. 75 is a perspective cross-sectional view showing the structure of a semiconductor device according to a 38th embodiment of the invention.
Figure 76:
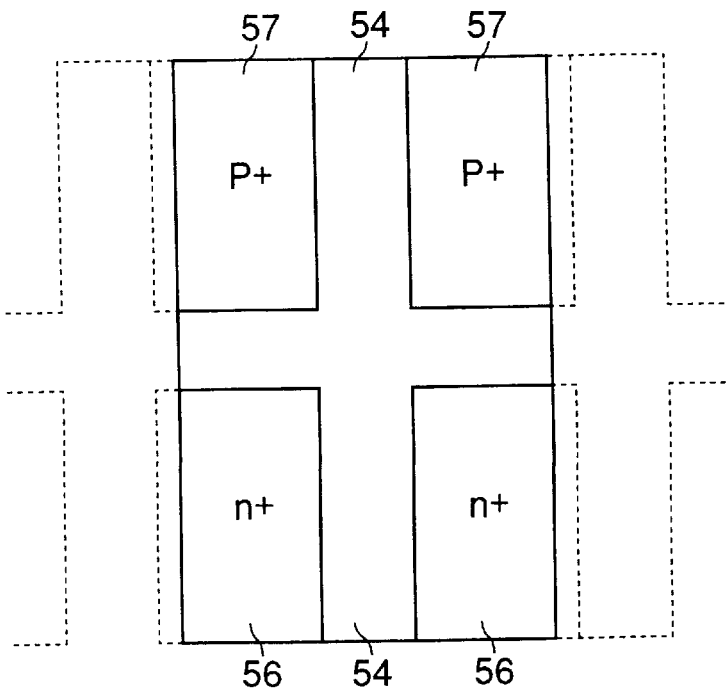
FIG. 76 is a plan view showing the structure of a surface portion of a semiconductor layer in the 38th embodiment.
Figure 77:
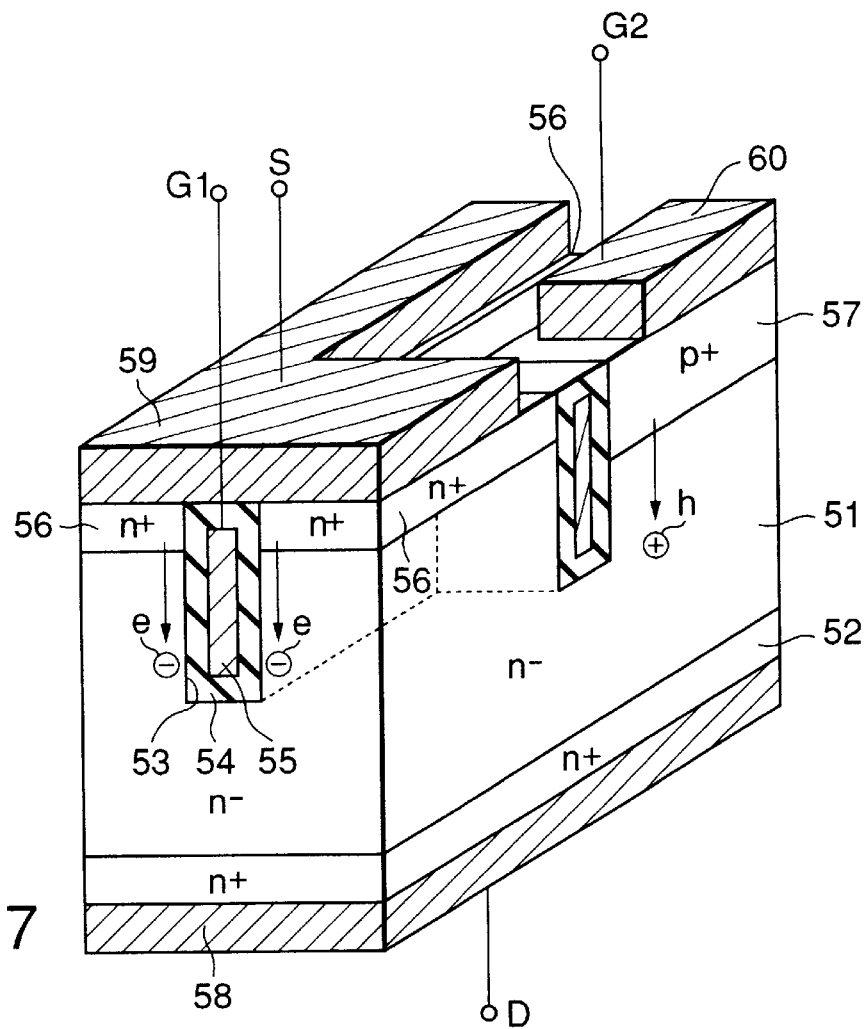
FIG. 77 is a perspective cross-sectional view showing a modified structure of the semiconductor device according to the 38th embodiment.
Figure 78:
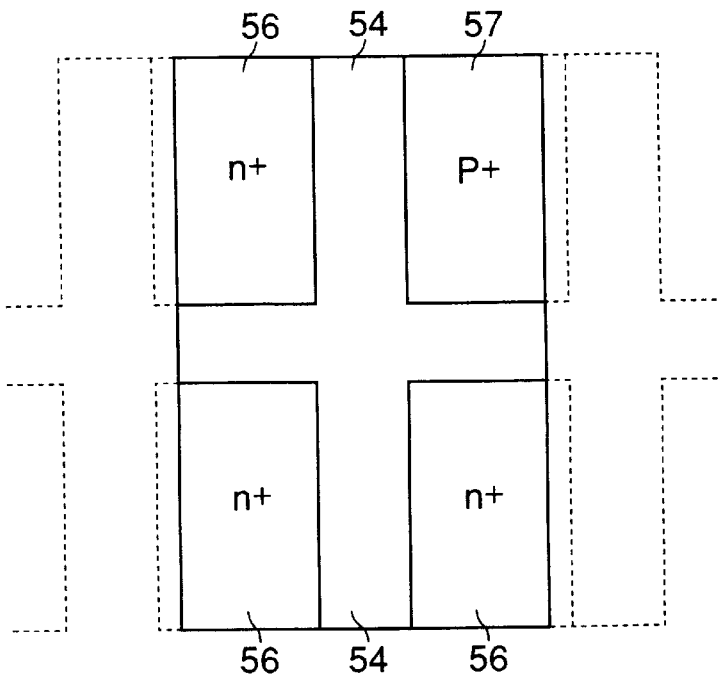
FIG. 78 is a plan view showing the modified structure of the surface portion of the semiconductor layer in the 38th embodiment.

FIG. 75 is a perspective cross-sectional view showing the structure of this semiconductor device, and FIG. 76 is a plan view showing a surface structure of a semiconductor layer of this semiconductor device. FIGS. 75 and 76 show a modification of the structure shown in FIG. 55.

The present embodiment is a modified structure of the 28th embodiment, and aims at increasing an electrode wiring pattern width and facilitating the formation of the source electrode and second gate electrode. Specifically, as shown in FIGS. 75 and 76, one source electrode 59 is provided on a plurality of n+ type source layers 56, and one second gate electrode 60 is provided on a plurality of p+ type injection layers 57.

In the above structure, the ratio in number of the n+ type source layers 56 to the p+ type injection layers 57 may be set at a desired value, for example, 3:1.

(39th Embodiment)

A semiconductor device according to a 39th embodiment of the present invention will now be described.

Figure 79:
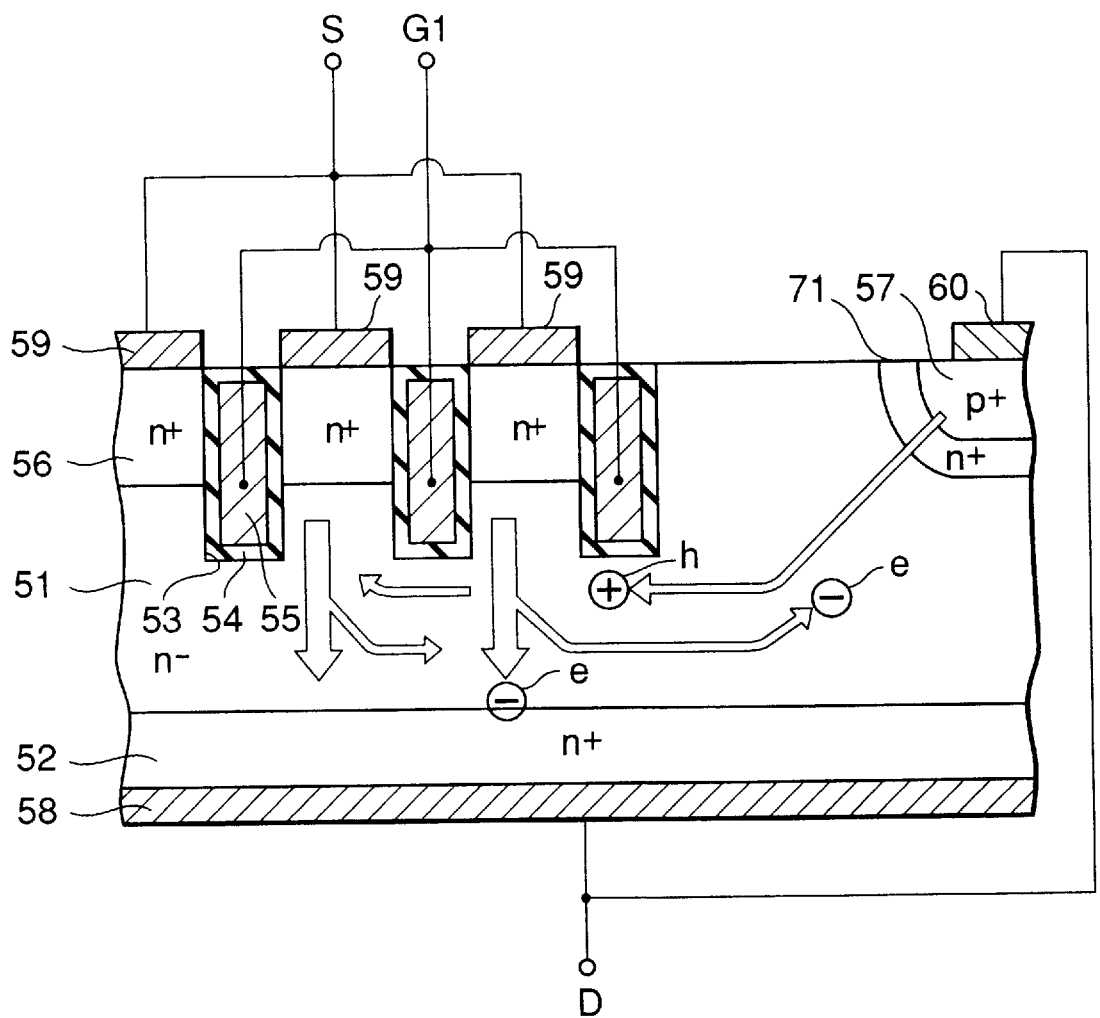
FIG. 79 is a cross-sectional view showing the structure of a semiconductor device according to a 39th embodiment of the invention.

FIG. 79 is a cross-sectional view showing the structure of this semiconductor device, which is a modification of the structure shown in FIG. 55.

The present embodiment is a modification of the 28th embodiment and aims at increasing the amount of injected electrons per unit area and facilitating the gate drive control. Specifically, as shown in FIG. 79, the p+ type injection layer 57 is not provided in the inter-trench region but is provided selectively in a surface portion of the n− type base layer 51 away from the trench 53. An n+ type buffer layer 71 for suppressing broadening of a depletion layer from the n+ type source layer 56 is formed between the p+ type injection layer 57 and n− type base layer 51. The n+ type buffer layer 71, however, may be dispensed with.

The second gate electrode 60 is formed on the p+ type injection layer 57. The second gate electrode 60 is connected to the drain electrode 58 and a drain-side circuit (not shown).

With the above structure, too, the amount of injected electrons per unit area can be increased and the gate drive control facilitated, in addition to the advantages of the 28th embodiment.

(40th Embodiment)

Figure 80:
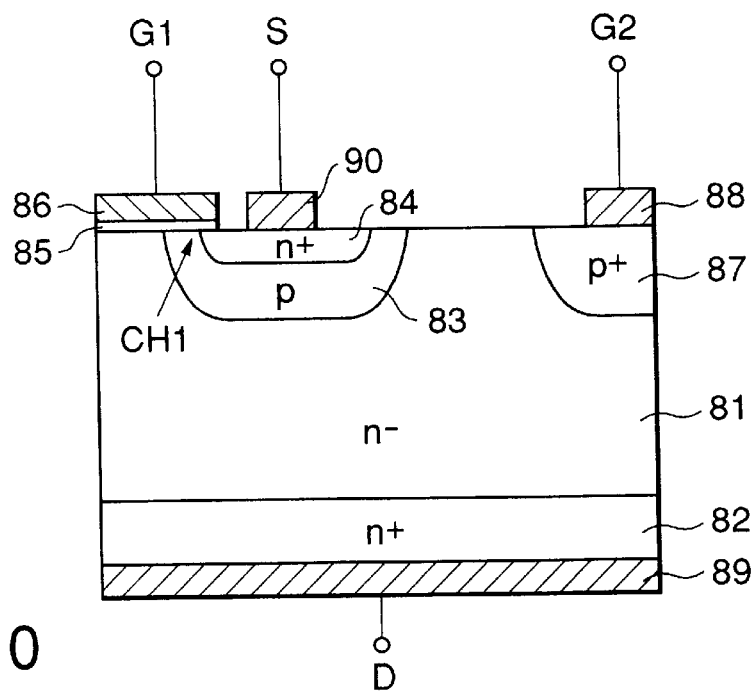
FIG. 80 is a cross-sectional view showing the structure of a semiconductor device according to a 40th embodiment of the invention.

FIG. 80 is a cross-sectional view showing the structure of a semiconductor device according to a 40th embodiment of the invention. In this semiconductor device, a high-concentration n+ type drain layer 82 is formed on one surface of a high-resistance n− type base layer 81. A p type base layer 83 is selectively formed on the other surface of the n− type base layer 81. An n+ type source layer 84 is formed in the p type base layer 83.

A first gate electrode 86 is provided on the p type base layer 83 between the n− type base layer 81 and n+ type source layer 84, with a gate insulating film 85 interposed between the first gate electrode 86 and p type base layer 83. These gate electrode 86, gate insulating film 85, p type base layer 83, n− type base layer 81 and n+ type source layer 84 constitute an electron injecting MOSFET having a channel region CH1.

A p+ type injection layer 87 is formed in a surface portion of the n− type base layer 81 at a predetermined distance from the p type base layer 83. This predetermined distance is set to correspond to, for example, a hole diffusion length.

On the other hand, a drain electrode 89 is formed on the n+ type drain layer 82, and a source electrode 90 is formed on the n+ type source layer 84. A second gate electrode 88 is formed on the p+ type injection layer 87.

Figure 81:
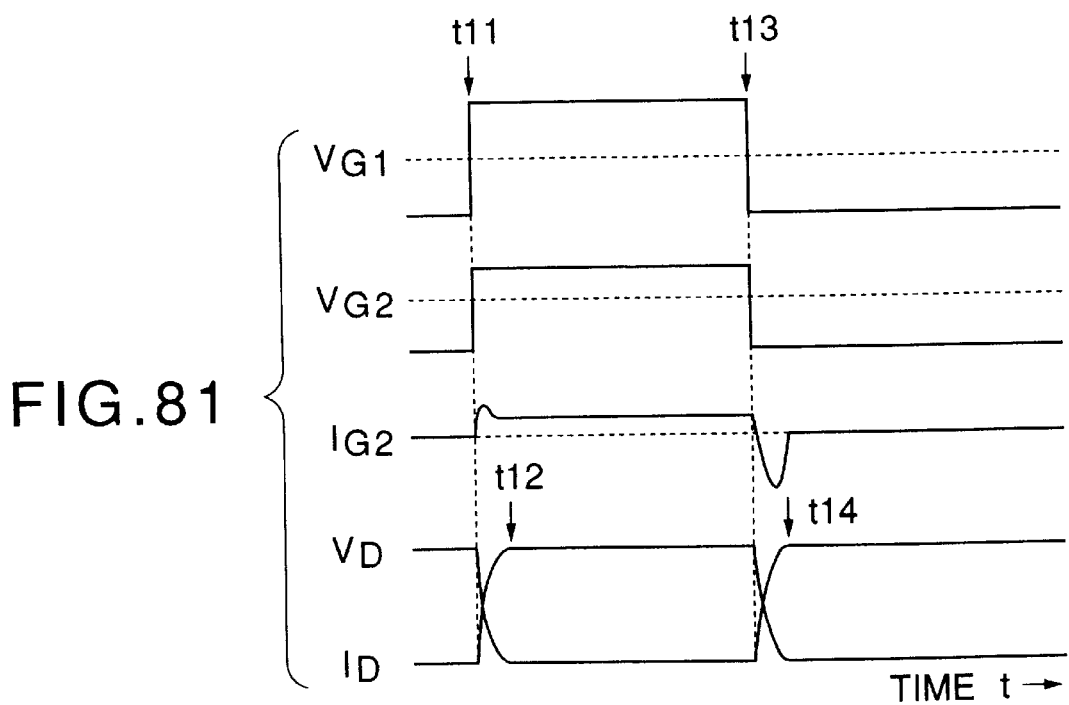
FIG. 81 is a timing chart for describing the operation in the 40th embodiment.

The operation of this semiconductor device will now be described with reference to a timing chart of FIG. 81. In FIG. 81, the respective lines indicate, from above, a gate voltage $V_{G1}$ of first gate electrode 86, a gate voltage $V_{G2}$ of second gate electrode 88, a gate current $I_{G2}$ of second gate electrode 88, a drain voltage $V_D$, and a drain current $I_D$.

Figure 82:
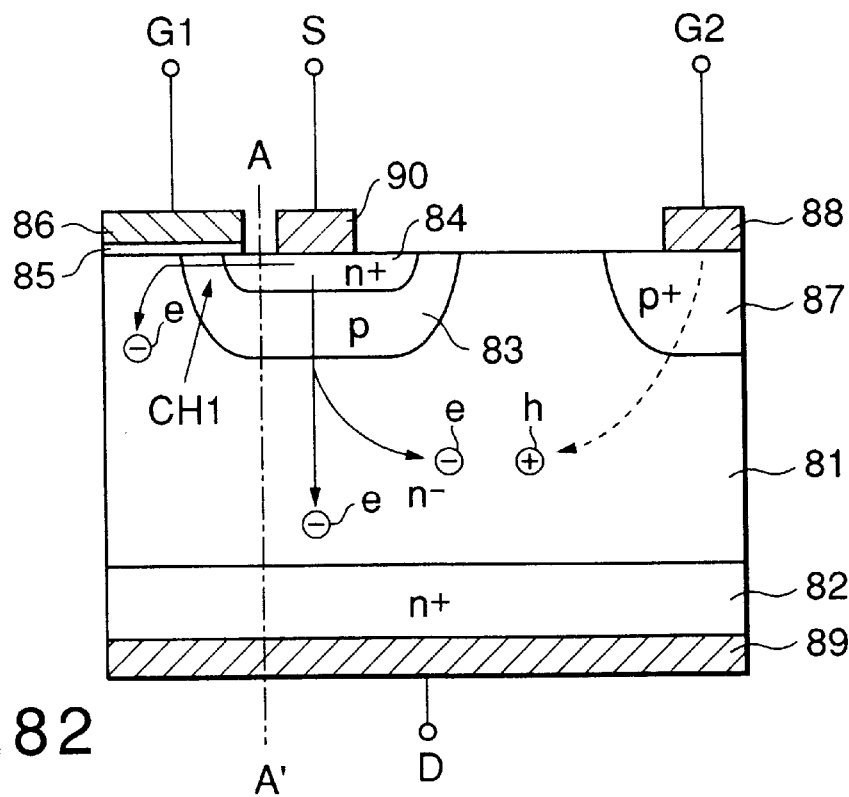
FIG. 82 shows a flow of carriers in the 40th embodiment.

At the time of turn-on (time $t=t_{11}$), a positive voltage which is positive relative to the source is applied to the first and second gate electrodes 86 and 88. Accordingly, as shown in FIG. 82, electrons e are injected from the n+ type source layer 84 into the n− type base layer 81 via the n-channel CH1 below the first gate electrode 86. At the same time, holes h are injected from the p+ type injection layer 87 into the n− type base layer 81. Thus, the semiconductor device is turned on (time $t=t_{12}$). As a result, the potential of the p type base layer 83 rises above a built-in voltage of a pn junction, and electrons e are directly injected from the n+ type source layer 84 into the p type base layer 83.

Consequently, a conductivity modulation occurs in the n− type base layer 81, and the device is rendered conductive at a low on-voltage. At this time, a hole current injected from the second gate electrode 88 entirely flows into the n− type base layer 81, unlike the conventional device.

Figure 83:
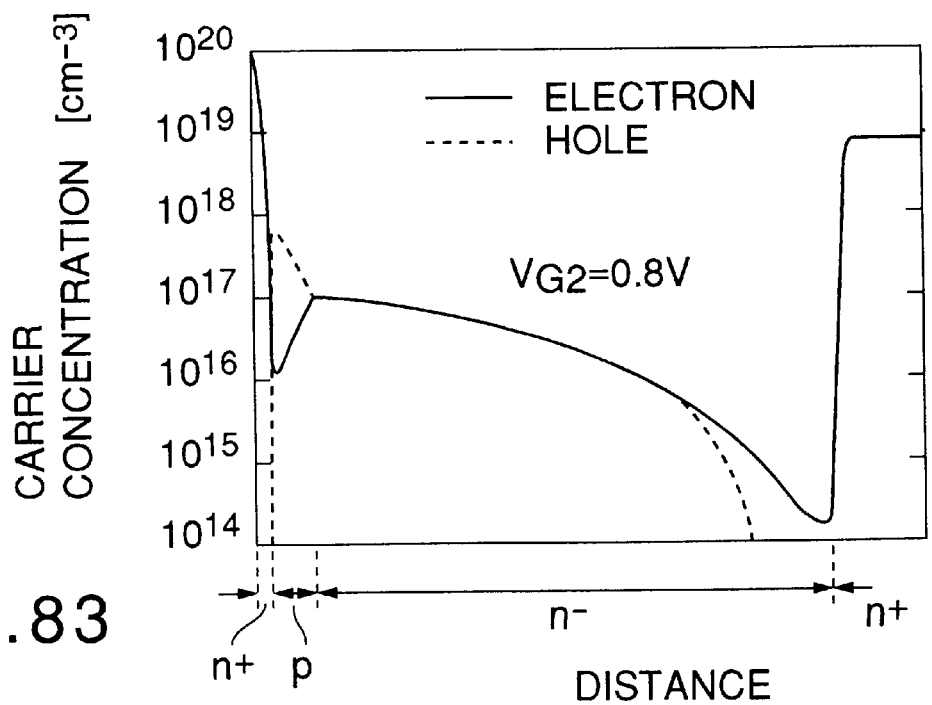
FIG. 83 shows a carrier concentration distribution in the on-state in the 40th embodiment.

In addition, since the p+ type injection layer 87 is formed at a predetermined distance from the p type base layer 83, holes h are injected deep into the n− type base layer 81 and a conductivity modulation occurs, as FIG. 83 shows a carrier concentration distribution along line A–A' in FIG. 82.

Figure 84:
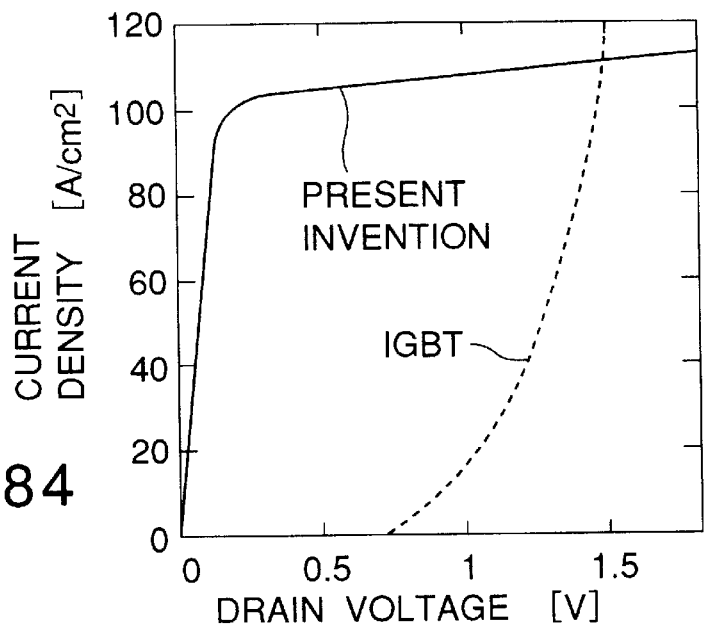
FIG. 84 is a graph comparing the current/voltage characteristics of the semiconductor device according to the 40th embodiment and those of the conventional IGBT.

According to the above mechanism of the present invention, the on-voltage is more decreased than in the conventional device. In other words, a gate current necessary for obtaining the same on-voltage as in the conventional device is decreased, and a current gain (DC amplification factor: $h_{FS}=I_D/I_G$) can be increased. For example, as shown in FIG. 84, a voltage drop due to a pn junction of an ordinary IGBT does not occur, and a current starts from zero voltage. Therefore, a low on-voltage is obtained.

Figure 85:
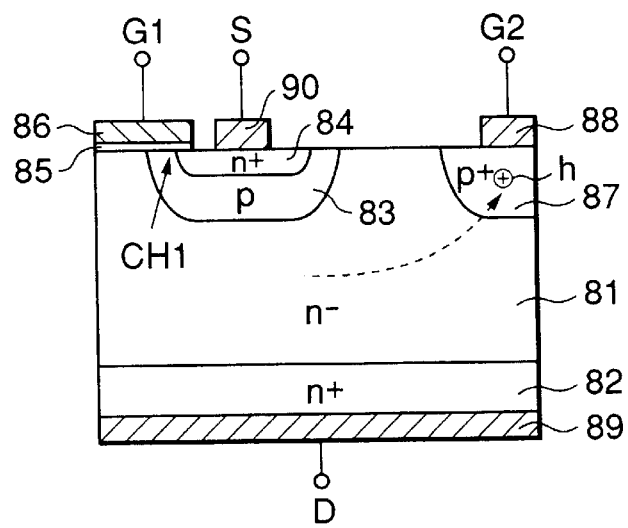
FIG. 85 shows a flow of carriers in the turn-off state in the 40th embodiment.

On the other hand, at the time of turn-off (time $t=T_{13}$), a negative voltage is applied to the first and second gate electrodes 86 and 88. Thereby, as shown in FIG. 85, the holes h accumulated in the n− base layer 81 are discharged from the gate electrode 88 to the outside of the device via the p+ type injection layer 87.

With the discharge of holes h, the potential of the p type base layer 83 lowers below the built-in voltage of pn junction. As a result, the electron injection from the n+ type source layer 84 is stopped, and the device is turned off (time t=$t_{14}$).

At this time, unlike the conventional device, a negative voltage exceeding a base/emitter breakdown voltage can be applied to the second gate electrode 88. Therefore, a semiconductor device having a higher turn-off performance than the conventional device can be achieved.

According to the 40th embodiment as described above, both carriers of electrons e and holes h are accumulated in a deep region of the n− type base layer 81 in the turn-on state and the conductivity modulation occurs. Thus, a high current gain (DC amplification factor $h_{FS}$) can be achieved.

At the turn-off time, a negative voltage exceeding a base/emitter breakdown voltage can be applied to the second gate electrode 88. Therefore, a high turn-off performance can be achieved.

Figure 86:
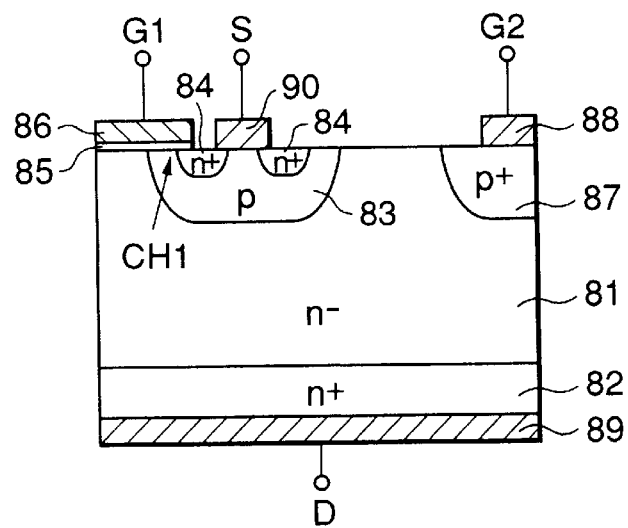
FIG. 86 shows a modified structure of the 40th embodiment.

The same advantages can be obtained even if the present embodiment is modified, as shown in FIG. 86, such that n+ source layers 84 are selectively formed in a surface portion of the p+ type base layer 83 and the source electrode is put in contact with both p+ type base layer 83 and n+ type source layers 84.

(41st Embodiment)

Figure 87:
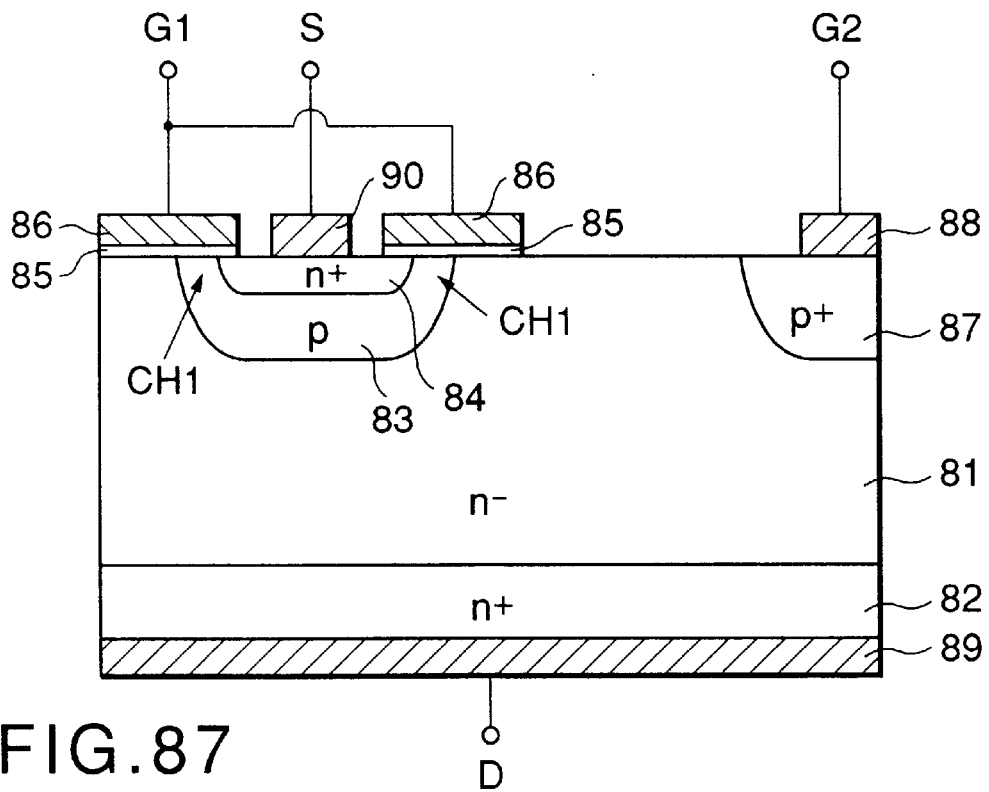
FIG. 87 is a cross-sectional view showing the structure of a semiconductor device according to a 41st embodiment of the invention.

FIG. 87 is a cross-sectional view showing the structure of a semiconductor device according to a 41st embodiment of the present invention. The present embodiment is a modified structure of the 40th embodiment. The 41st embodiment has MOS structures comprising gate insulating films 85 and first gate electrode 86 on both sides of the n+ source layer 84. With this structure, too, the same advantages as with the 40th embodiment can be obtained.

Figure 88:
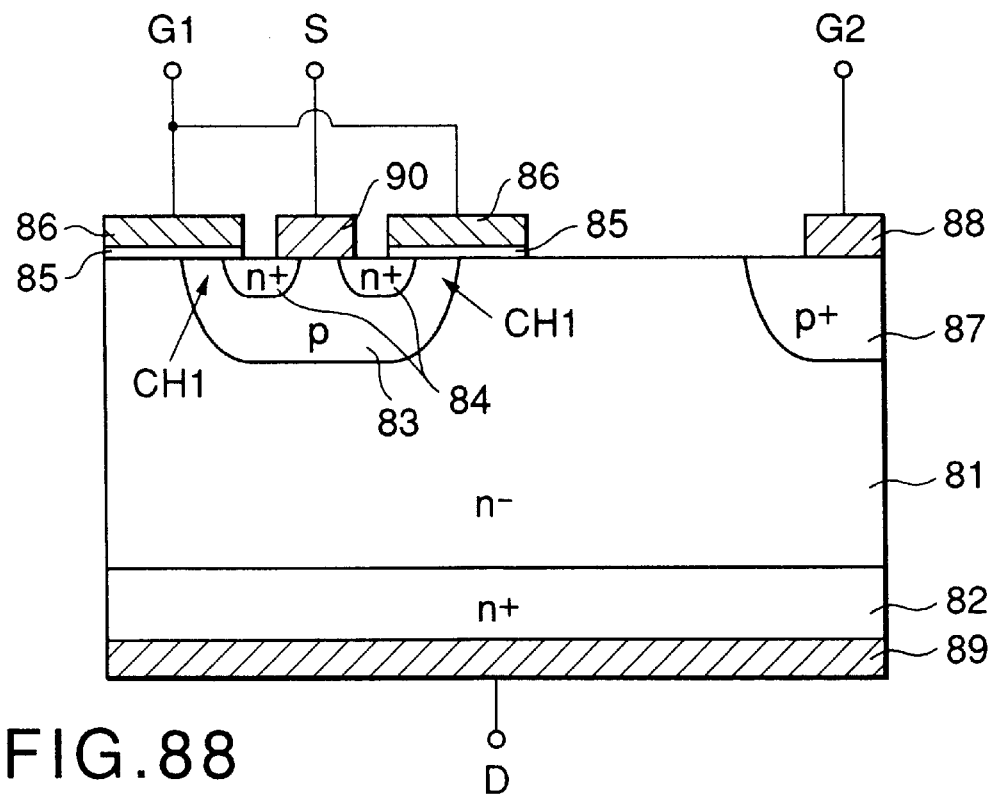
FIG. 88 is a cross-sectional view showing a modified structure of the 41st embodiment.

Similarly, the same advantages can be obtained even if n+ source layers 84 are selectively formed in a source portion of the p+ base layer 83, as shown in FIG. 88, and the source electrode is put in contact with both p+ base layer 83 and n+ source layers 84.

(42nd Embodiment)

Figure 89:
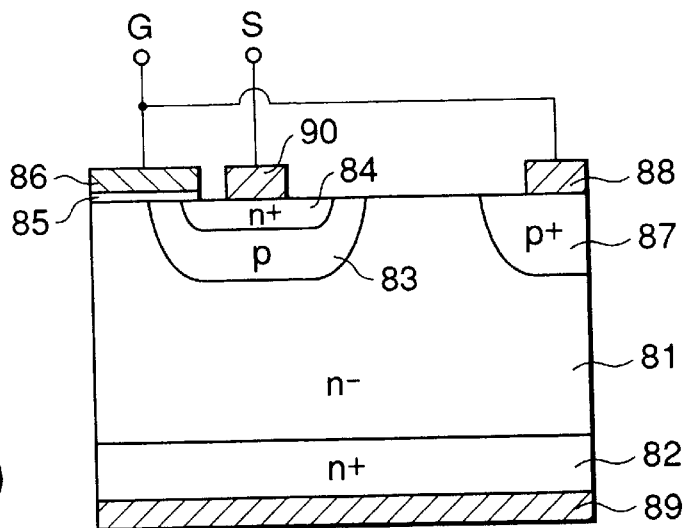
FIG. 89 is a cross-sectional view showing the structure of a semiconductor device according to a 42nd embodiment of the invention.

FIG. 89 is a cross-sectional view showing the structure of a semiconductor device according to a 42nd embodiment of the present invention. The present embodiment is a modified structure of the 40th embodiment. The first and second gate electrodes 86 and 88 are electrically connected to each other. Thereby, the semiconductor device can be turned on/off with use of a single gate electrode terminal G. Therefore, the drive circuit can be simplified, in addition to the advantages of the 40th embodiment.

(43rd Embodiment)

Figure 90:
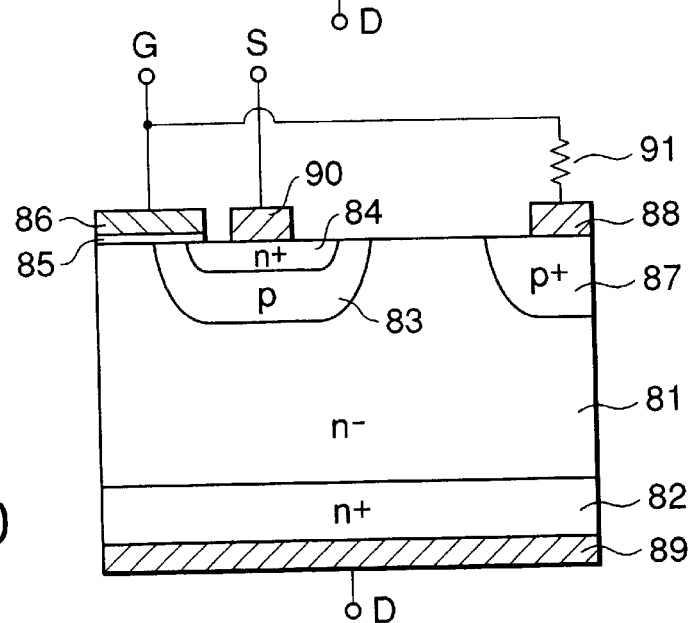
FIG. 90 is a cross-sectional view showing the structure of a semiconductor device according to a 43rd embodiment of the invention.

FIG. 90 is a cross-sectional view showing the structure of a semiconductor device according to a 43rd embodiment of the present invention. The present embodiment is a modified structure of the 40th embodiment. The second gate electrode 88 is connected via a resistor 91 to the gate electrode terminal G to which the first gate electrode 86 is also connected.

With this simple structure using the single gate electrode terminal G, too, the values of voltages applied to the first gate electrode 86 and second gate electrode 88 are set at desired values by controlling the resistance value of the resistor 91. Needless to say, the advantages of the 40th embodiment can be obtained in this case, too.

(44th Embodiment)

Figure 91:
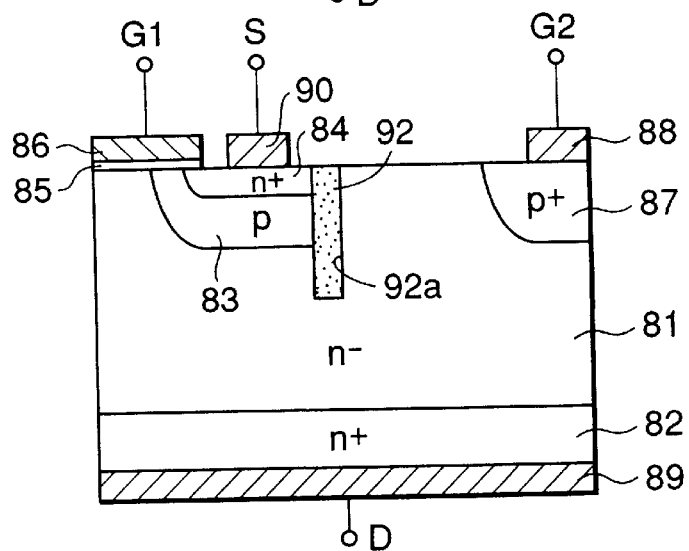
FIG. 91 is a cross-sectional view showing the structure of a semiconductor device according to a 44th embodiment of the invention.

FIG. 91 is a cross-sectional view showing the structure of a semiconductor device according to a 44th embodiment of the present invention. The present embodiment is a modified structure of the 40th embodiment. A trench 92*a* is formed at that portion of the p type base layer 83, which is closer to the p+ type injection layer 87 and is located between the n+ type source layer 84 and n− type base layer 81, and a barrier layer 92 formed of an insulating film is buried in the trench 92*a*. The depth of the barrier layer 92 is made greater than, at least, the depth of the p type base layer 83.

In addition to the advantages of the 40th embodiment, this structure can bring about the following advantages. Since holes injected from the p+ type injection layer 87 in the turn-on state reach the p type base layer 83 via a deep portion of the n− type base layer 81, the conductivity modulation is promoted and the current gain is increased.

Figure 92:
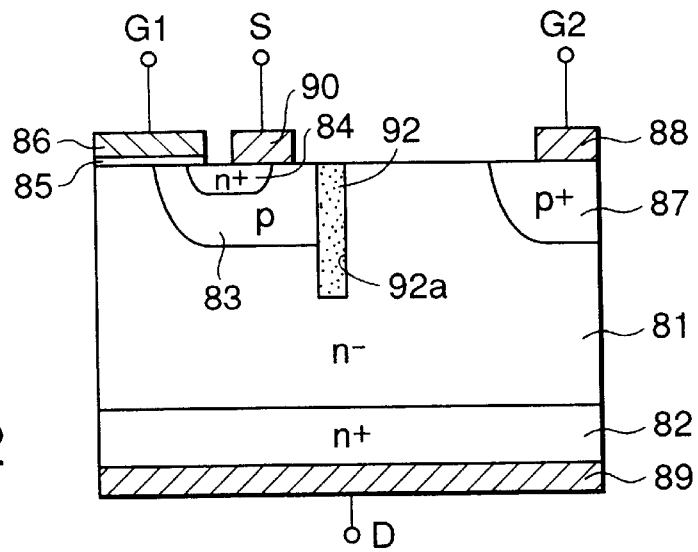
FIG. 92 is a cross-sectional view showing a modified structure of the 44th embodiment.

The same advantage can be obtained even when the present embodiment is modified, as shown in FIG. 92, such that the n+ type source layer 84 is selectively formed at the surface of the p+ type base layer 83 and the source electrode is put in contact with both p+ type base layer 83 and n+ type source layer 84.

(45th Embodiment)

Figure 93:
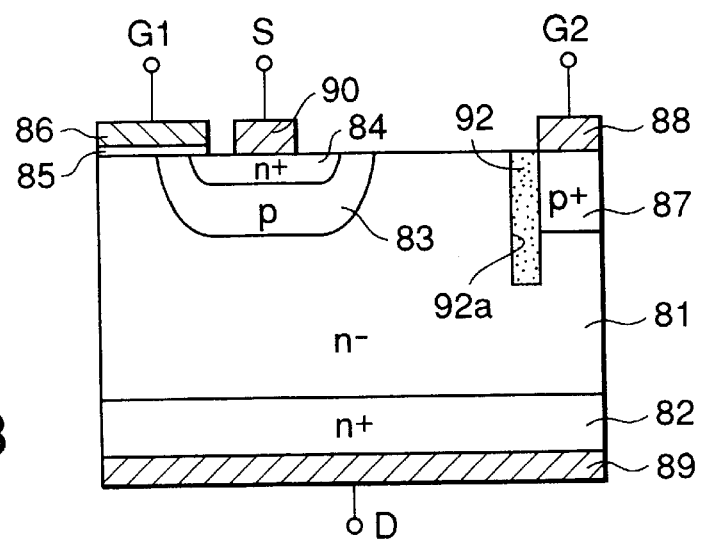
FIG. 93 is a cross-sectional view showing the structure of a semiconductor device according to a 45th embodiment of the invention.

FIG. 93 is a cross-sectional view showing the structure of a semiconductor device according to a 45th embodiment of the present invention. The present embodiment is a modified structure of the 40th embodiment. A trench 92*a* deeper than the p+ type injection layer 87 is formed at a source-side end portion of the p+ type injection layer 87, and a barrier layer 92 formed of an insulating film is buried in the trench 92*a*.

In addition to the advantages of the 40th embodiment, this structure can bring about the following advantages. Since holes injected from the p+ type injection layer 87 in the turn-on state reach a deep portion of the n− type base layer 81, the conductivity modulation is promoted and the current gain is increased.

(46th Embodiment)

Figure 94:
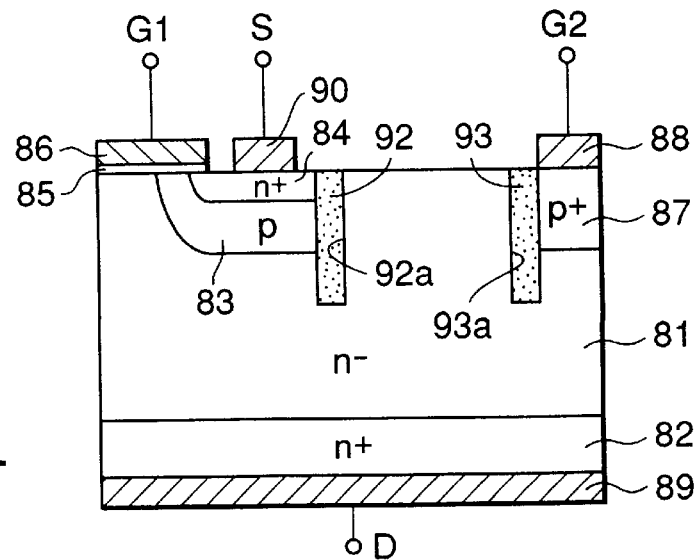
FIG. 94 is a cross-sectional view showing the structure of a semiconductor device according to a 46th embodiment of the invention.

FIG. 94 is a cross-sectional view showing the structure of a semiconductor device according to a 46th embodiment of the present invention. The present embodiment is a combination of the 44th and 45th embodiments. The structure of this embodiment comprises a first barrier layer 92 buried in the trench 92*a* formed at that end portion of the p type base layer 83, which is closer to the p+ type injection layer 87, and a second barrier layer 93 buried in the trench 93*a* formed at that end portion of the p+ type injection layer 87, which is closer to the p type base layer.

With this structure, too, the same advantages as with the 44th and 45th embodiments can be obtained.

(47th Embodiment)

Figure 95:
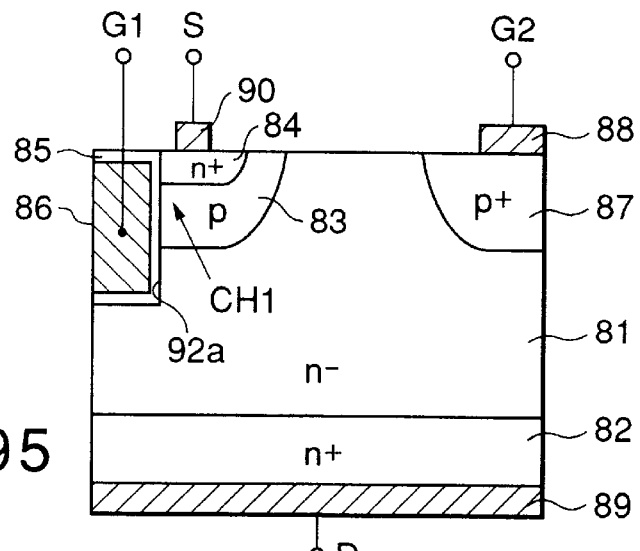
FIG. 95 is a cross-sectional view showing the structure of a semiconductor device according to a 47th embodiment of the invention.

FIG. 95 is a cross-sectional view showing the structure of a semiconductor device according to a 47th embodiment of the present invention. In this embodiment, a trench 92*a* is formed in a surface portion of the n− type base layer 81 so as to be in contact with the p type base layer 83 and n+ type source layer 84, and a first gate electrode 86 is buried in the trench 92*a* with a gate insulating film 85 interposed. By the provision of the first gate electrode 86, an electron injecting MOSFET having a channel region CH1 at a side portion of the p type base layer 83 which adjoins the gate insulating film 85 is constituted.

By virtue of this trench structure, the channel density is increased. Thus, the concentration of electrons/holes injected in the n− type base layer 81 is increased and the on-voltage is further decreased, and the current gain can be increased. Needless to say, like the 40th embodiment, a negative voltage exceeding a base/emitter breakdown voltage can be applied to the second gate electrode 88 at the time of turn-off. Therefore, a high turn-off performance can be achieved.

Figure 96:
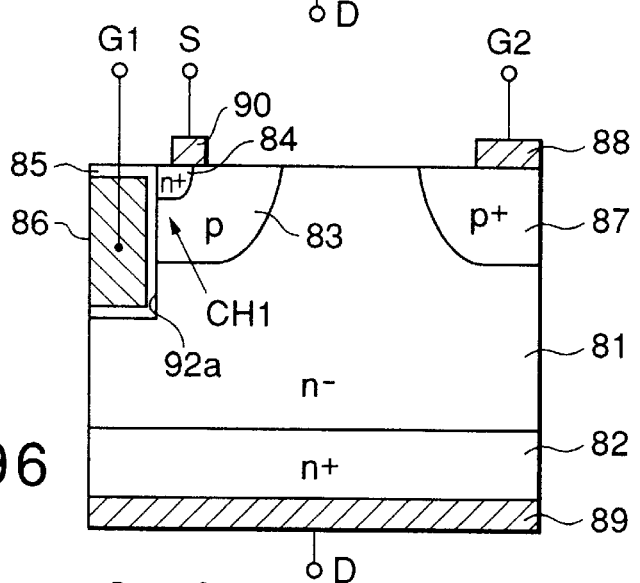
FIG. 96 is a cross-sectional view showing a modified structure of the 47th embodiment.

The same advantages can be obtained even if the present embodiment is modified, as shown in FIG. 96, such that the n+ type source layer 84 is selectively formed at the surface of the p+ type base layer 83, and the source electrode is put in contact with both p+ type base layer 83 and n+ type source layer 84.

(48th Embodiment)

Figure 97:
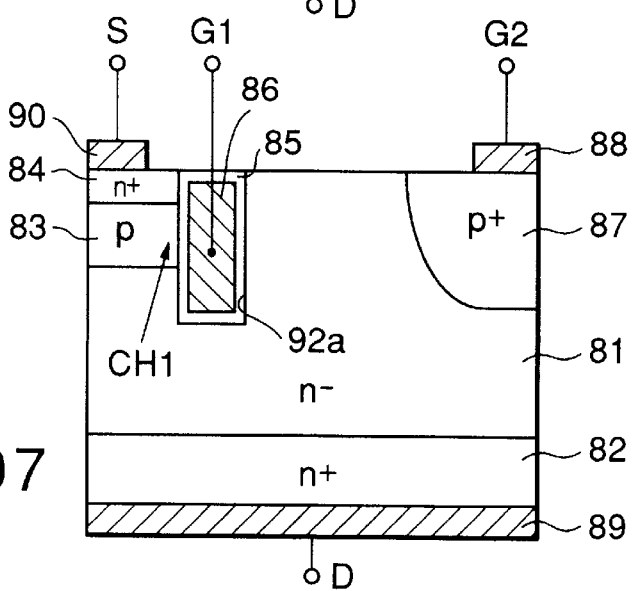
FIG. 97 is a cross-sectional view showing the structure of a semiconductor device according to a 48th embodiment of the invention.

FIG. 97 is a cross-sectional view showing the structure of a semiconductor device according to a 48th embodiment of the present invention. The present embodiment is a modified structure of the 47th embodiment. The position of the trench structure comprising the trench 92a, gate insulating film 85 and first gate electrode 86 is changed.

Specifically, the trench 92a extending from the n+ type source layer 84 via the p type base layer 83 to the n– type base layer 81 is formed in a surface portion of the n– type base layer 81, which is opposed to the p+ type injection layer 87. With this structure, too, the same advantages as with the 47th embodiment can be obtained. In addition, since this trench structure serves as a barrier layer to holes injected from the p+ type injection layer 87, the holes can be injected into a deeper portion of the n– type base layer 81, and the current gain can be increased.

Figure 98:
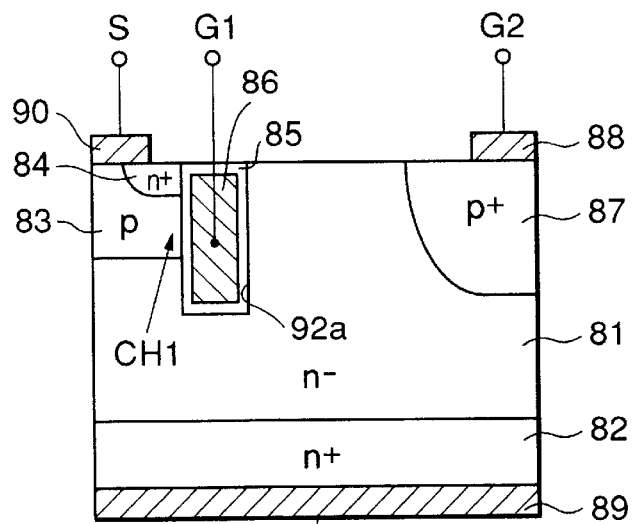
FIG. 98 is a cross-sectional view showing a modified structure of the 48th embodiment.

The same advantages can be obtained even if the present embodiment is modified, as shown in FIG. 98, such that the n+ type source layer 84 is selectively formed at the surface of the p+ type base layer 83, and the source electrode is put in contact with both p+ type base layer 83 and n+ type source layer 84.

(49th Embodiment)

Figure 99:
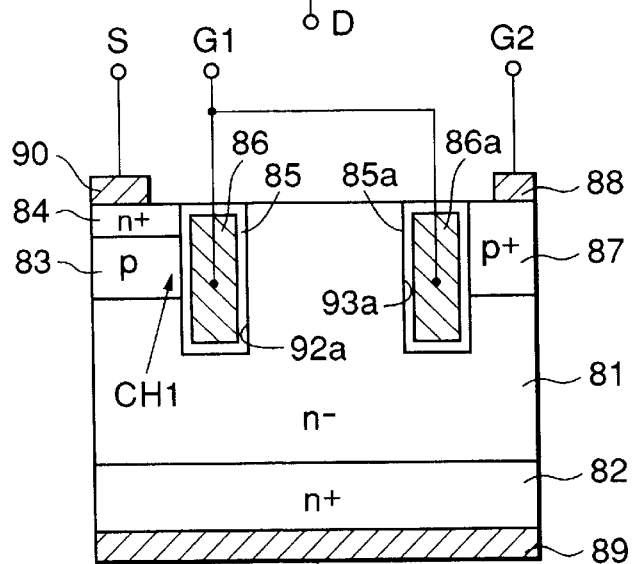
FIG. 99 is a cross-sectional view showing the structure of a semiconductor device according to a 49th embodiment of the invention.

FIG. 99 is a cross-sectional view showing the structure of a semiconductor device according to a 49th embodiment of the present invention. The present embodiment is a modified structure of the 48th embodiment. A second trench structure comprising a trench 93a, a gate insulating film 85a and a gate electrode 86a is formed at the surface of the n– type base layer 81 so as to be in contact with a source-side end portion of the p+ type injection layer 87. This gate electrode 86a is electrically connected to the aforementioned first gate electrode 86.

With this structure, the current gain can be more increased than in the 48th embodiment.

(50th Embodiment)

Figure 100:
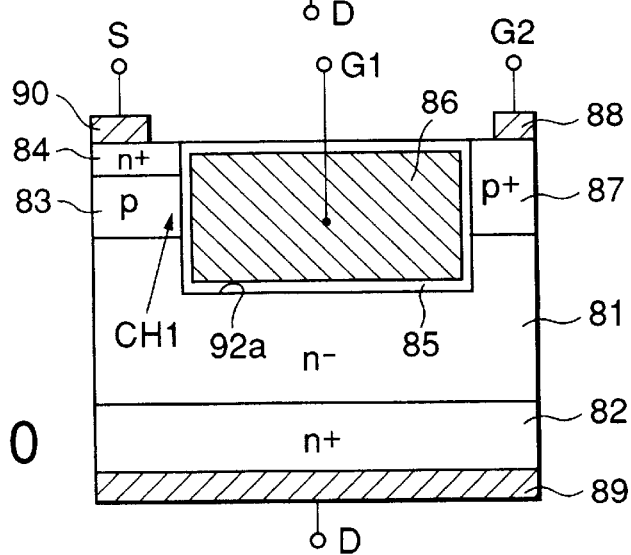
FIG. 100 is a cross-sectional view showing the structure of a semiconductor device according to a 50th embodiment of the invention.

FIG. 100 is a cross-sectional view showing the structure of a semiconductor device according to a 50th embodiment of the present invention. The present embodiment is a modified structure of the 49th embodiment. A trench structure comprising the trench 92a, gate insulating film 85 and first gate electrode 86 is formed in a semiconductor region between the n+ type source layer 84 and p+ type injection layer 87 so as to extend through the p type base layer 83 and p+ type injection layer 87 into the n– type base layer 81.

With this structure, too, like the 49th embodiment, the channel density is enhanced by the trench structure and the holes can be injected deep by the trench structure opposed to the p+ type injection layer 87.

(51st Embodiment)

Figure 101:
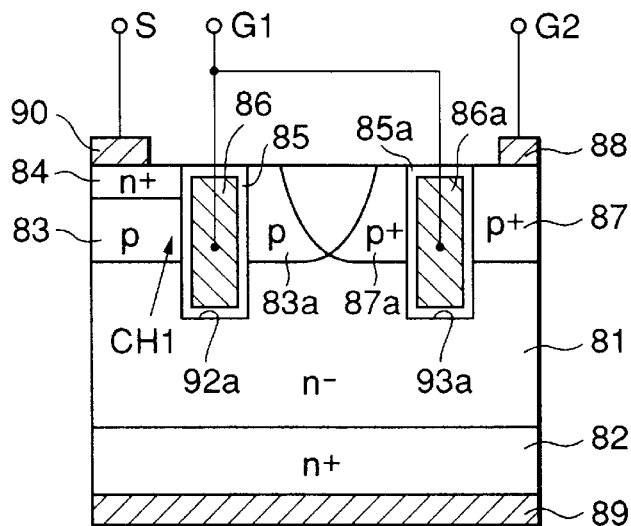
FIG. 101 is a cross-sectional view showing the structure of a semiconductor device according to a 51st embodiment of the invention.

FIG. 101 is a cross-sectional view showing the structure of a semiconductor device according to a 51st embodiment of the present invention. The present embodiment is a modified structure of the 49th embodiment. A horizontally diffused portion 83a of p type base layer 83 and a horizontally diffused portion 87a of p+ type injection layer 87 are formed between the two gate electrodes 86 and 86a functioning as barrier layers. Thus, in addition to the advantage of the 49th embodiment, the manufacturing method is simplified.

(52nd Embodiment)

Figure 102:
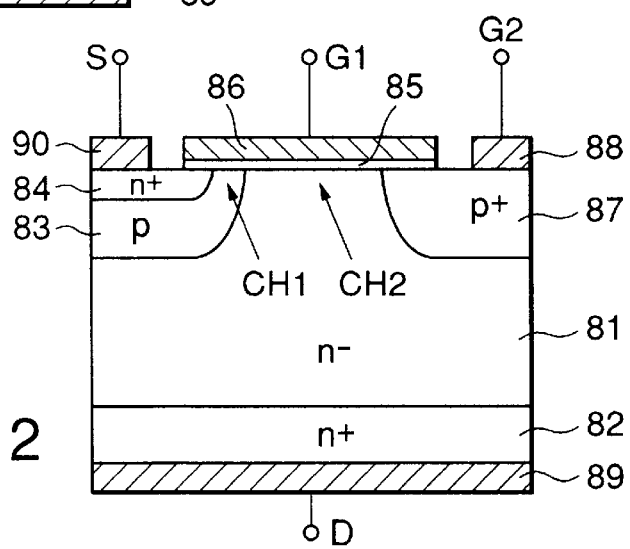
FIG. 102 is a cross-sectional view showing the structure of a semiconductor device according to a 52nd embodiment of the invention.

FIG. 102 is a cross-sectional view showing the structure of a semiconductor device according to a 52nd embodiment of the present invention. The present embodiment is a modification of the 40th embodiment. A ate insulating film 85 and a first gate electrode 86 are provided on a region comprising the p type base layer 83 and n– base layer 81 between the p+ type injection layer 87 and n+ type source layer 84.

Specifically, an electron injecting n-channel MOSFET having a channel region CH1 is constituted by the first gate electrode 86, n+ type source layer 84 and n– type base layer 81. A potential fixing p– cannel MOSFET having a channel region CH2 is constituted by the first gate electrode 86, p type base layer 83 and p+ type injection layer 87. The p+ type injection layer 87 and p type base layer 83 are spaced apart from each other by a predetermined distance corresponding, for example, to a diffusion length of holes h. A second gate electrode 88 is formed on the p+ injection layer 87.

Figure 103:
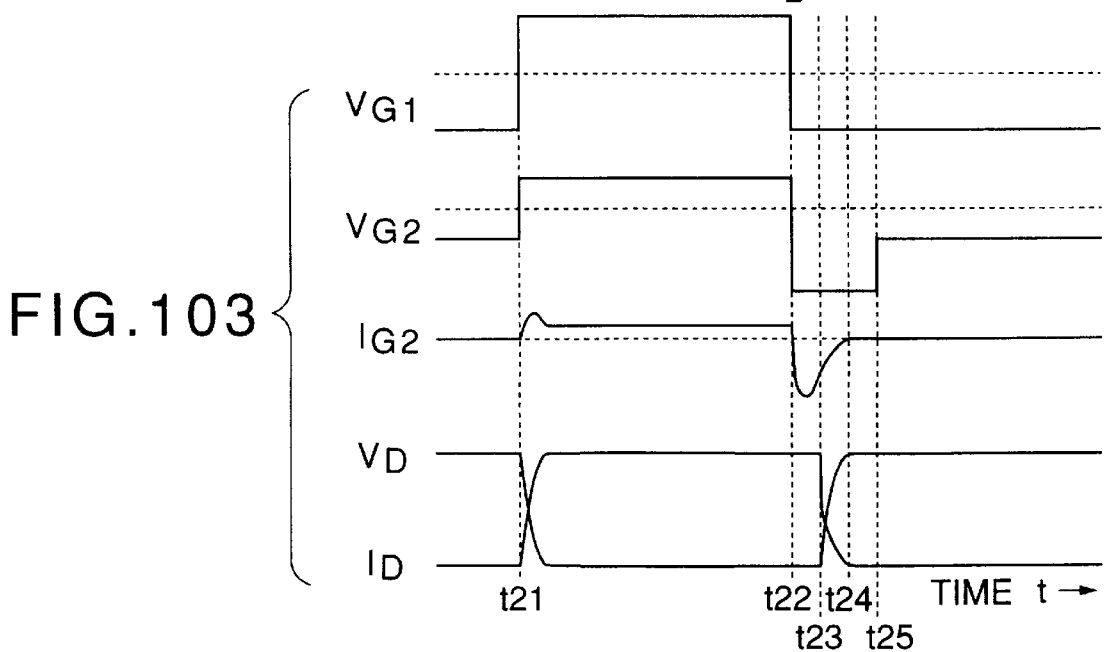
FIG. 103 is a flow chart for describing the operation of the 52nd embodiment.

The operation of this semiconductor device will now be described with reference to a timing chart of FIG. 103. In FIG. 103, the respective lines indicate, from above, a gate voltage $V_{G1}$ of first gate electrode 86, a gate voltage $V_{G2}$ of second gate electrode 88, a gate current $I_{G2}$ of second gate electrode 88, a drain voltage $V_D$, and a drain current $I_D$.

Figure 104:
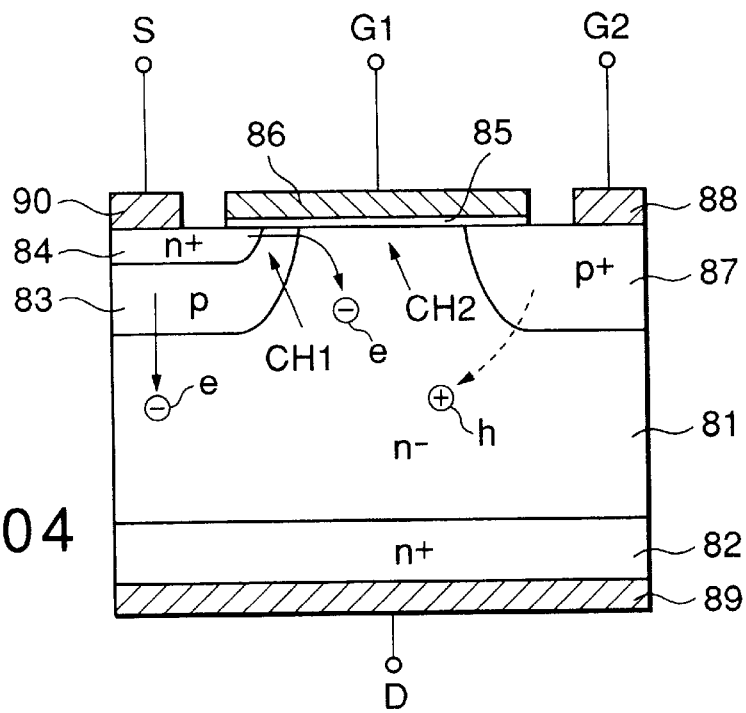
FIG. 104 shows a flow of carriers in the 52nd embodiment.

At the time of turn-on (time $t=t_{21}$), a positive voltage which is positive relative to the source is applied to the first and second gate electrodes 86 and 88. Accordingly, as shown in FIG. 104, electrons e are injected from the n+ type source layer 84 into the n– type base layer 81 via the n-channel CH1 below the first gate electrode 86. At the same time, holes h are injected from the p+ type injection layer 87 into the n– type base layer 81. Thus, the semiconductor device is turned on.

Accordingly, the potential of the p type base layer 83 rises above a built-in voltage of a pn junction, and electrons e are directly injected from the n+ type source layer 84 into the p type base layer 83.

Figure 105:
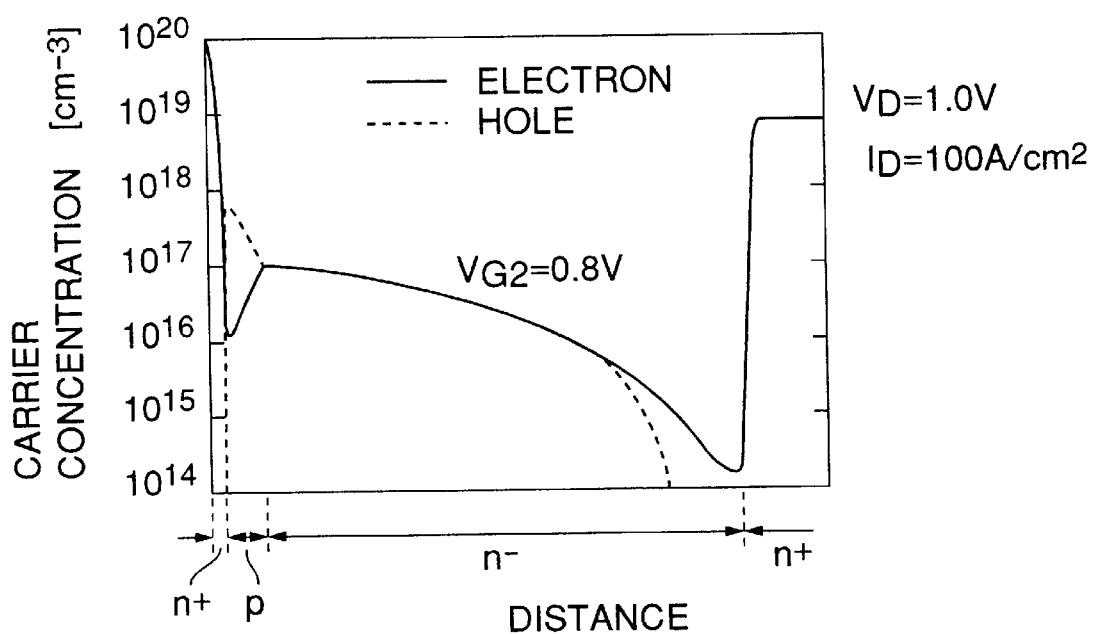
FIG. 105 shows a carrier concentration distribution in the on-state in the 52nd embodiment.

As a result, a conductivity modulation occurs in the n– type base layer 81, and the device is rendered conductive at a low on-voltage. At this time, a hole current injected from the second gate electrode 88 entirely flows into the n– type base layer 81, unlike the conventional device. In addition, since the p+ type injection layer 87 is formed at a predetermined distance from the p type base layer 83, holes h are injected deep into the n– type base layer 81, as shown in FIG. 105, and a conductivity modulation occurs.

Figure 106:
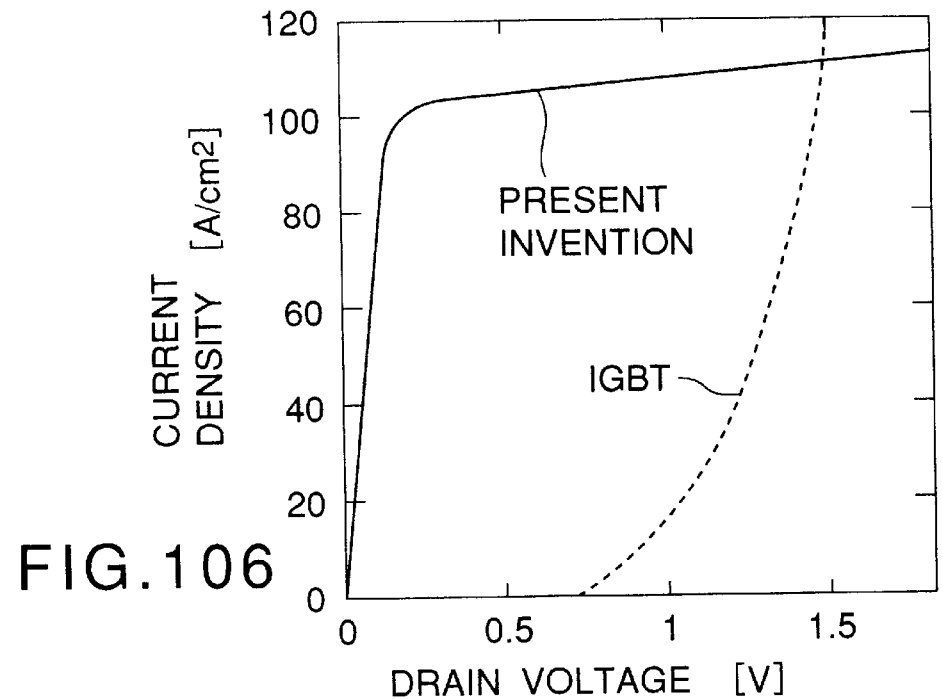
FIG. 106 is a graph comparing the current/voltage characteristics of the semiconductor device according to the 52nd embodiment and those of the conventional IGBT.

According to the above mechanism of the present invention, the on-voltage is more decreased than in the conventional device. For example, as shown in FIG. 106, a voltage drop due to a pn junction of an ordinary IGBT does not occur, and a current starts from zero voltage. Therefore, a low on-voltage is obtained.

Figure 107:
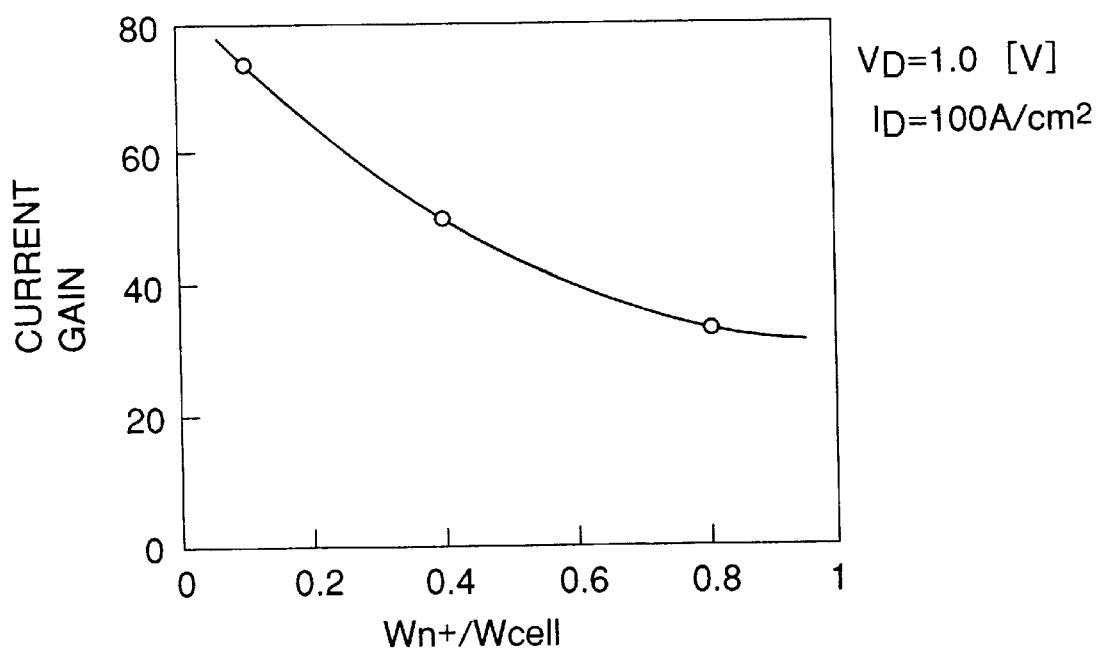
FIG. 107 shows an n-type source width dependency of a current gain in the 52nd embodiment.

In other words, a gate current necessary for obtaining the same on-voltage as in the conventional device is decreased, and a current gain (DC amplification factor: $h_{FS}=I_D/I_G$) can be increased. For example, FIG. 107 shows the dependency of the current gain of the semiconductor device shown in FIG. 102 upon the width of the n+ type source layer 84. According to the inventors' researches, the current gain depends greatly on both the ratio (Wn+/Wcell) of the width of n+ type source layer 84 to the width of cell and the ratio (Wp+/Wcell) of the width of p+ type injection layer 87 to the width of cell. In this invention, both the width of n+ type source layer 84 and the width of p+ type injection layer 87 can be reduced, a high current gain can be achieved.

Figure 108:
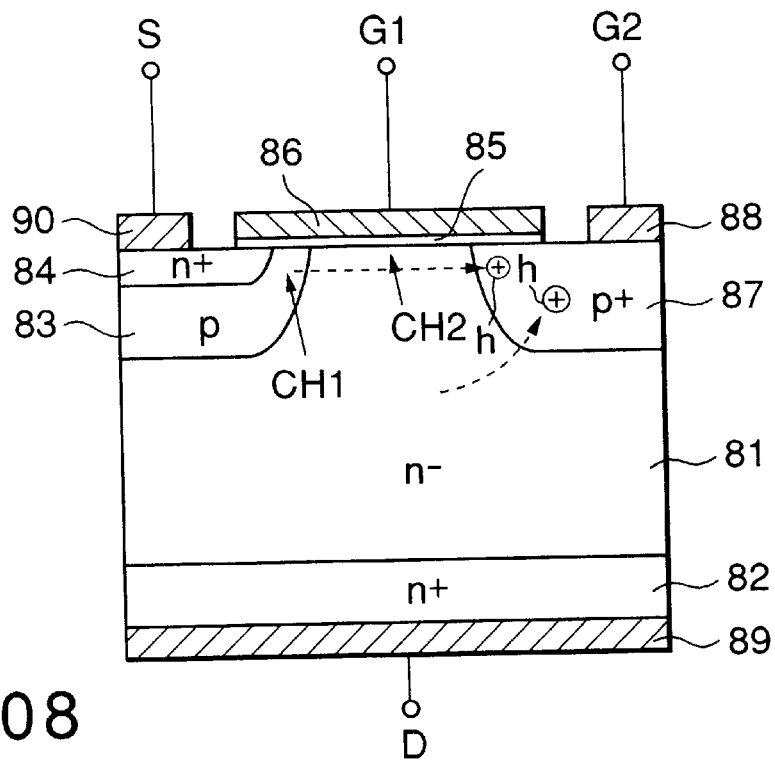
FIG. 108 shows a flow of carriers in the turn-off state in the 52nd embodiment.

On the other hand, at the time of turn-off (time t=T$_{22}$), a negative voltage is applied to the first and second gate electrodes 86 and 88. Thereby, as shown in FIG. 108, the holes h accumulated in the n− base layer 81 are discharged from the gate electrode 88 to the outside of the device via the p+ type injection layer 87. With the discharge of holes h, the potential of the p type base layer 83 lowers below the built-in voltage of pn junction. As a result, the electron injection from the n+ type source layer 84 is stopped, and the device is turned off (time t=t$_{23}$ to t$_{24}$).

At this turn-off time, unlike the conventional device, a negative voltage exceeding a base/emitter breakdown voltage can be applied to the second gate electrode 88. Moreover, holes h are discharged via the channel CH2. Therefore, a semiconductor device having a higher turn-off performance than the conventional device can be achieved.

In the turn-off state following the turn-off time, a negative voltage which is negative relative to the source is applied to the first and second gate electrodes 86 and 88 (time t=t$_{25}$ and thereafter). Thereby, the potential of the p type base layer 83 is fixed at a negative level through the p-channel region CH2 under first gate electrode 86 and the p+ type injection layer 87. Thus, an erroneous trigger due to noise can be prevented.

According to the 52nd embodiment as described above, both carriers of electrons e and holes h are accumulated in a deep region of the n− type base layer 81 in the turn-on state and the conductivity modulation occurs. Thus, a high current gain (DC amplification factor) can be achieved.

At the turn-off time, a negative voltage exceeding a base/emitter breakdown voltage can be applied to the second gate electrode 88, and holes h are discharged via the p-channel MOSFET. Therefore, a high turn-off performance can be achieved.

In the turn-off state, the negative voltage which is negative relative to the source is applied to the first and second gate electrodes 86 and 88, and thereby the potential of the p type base layer 83 is fixed at a negative level. Thus, an erroneous trigger due to noise can be prevented.

Figure 109:
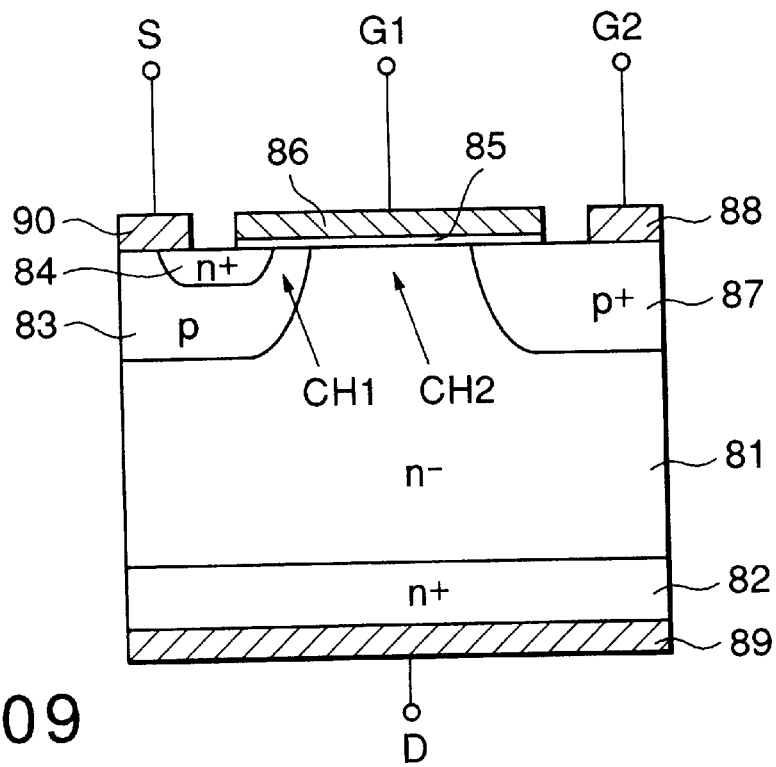
FIG. 109 is a cross-sectional view showing a modified structure of the 52nd embodiment.

The same advantages can be obtained even if the present embodiment is modified, as shown in FIG. 109, such that n+ source layer 84 is selectively formed in a surface portion of the p+ type base layer 83 and the source electrode is put in contact with both p+ type base layer 83 and n+ type source layers 84.

(53rd Embodiment)

Figure 110:
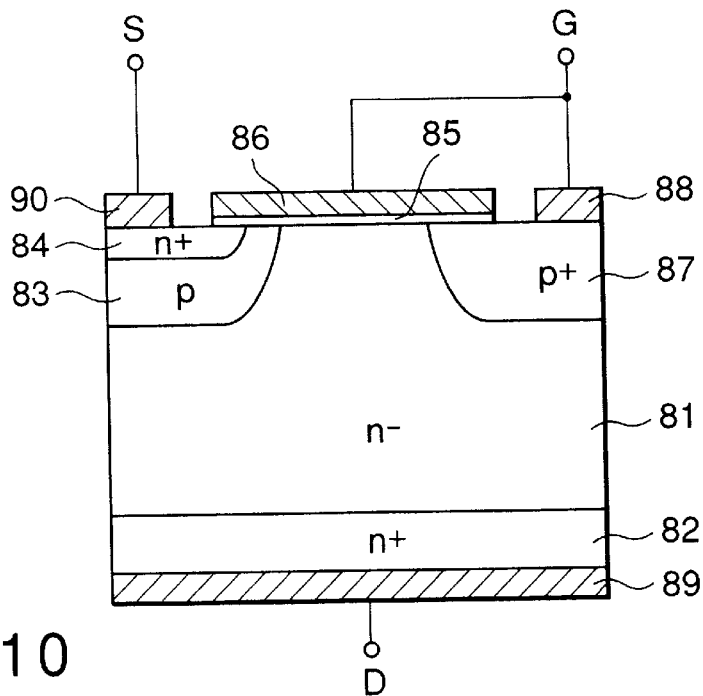
FIG. 110 is a cross-sectional view showing the structure of a semiconductor device according to a 53rd embodiment of the invention.

FIG. 110 is a cross-sectional view showing the structure of a semiconductor device according to a 53rd embodiment of the present invention. In this embodiment, the first and second gate electrodes 86 and 88 are electrically connected to the gate electrode terminal G.

Figure 111:
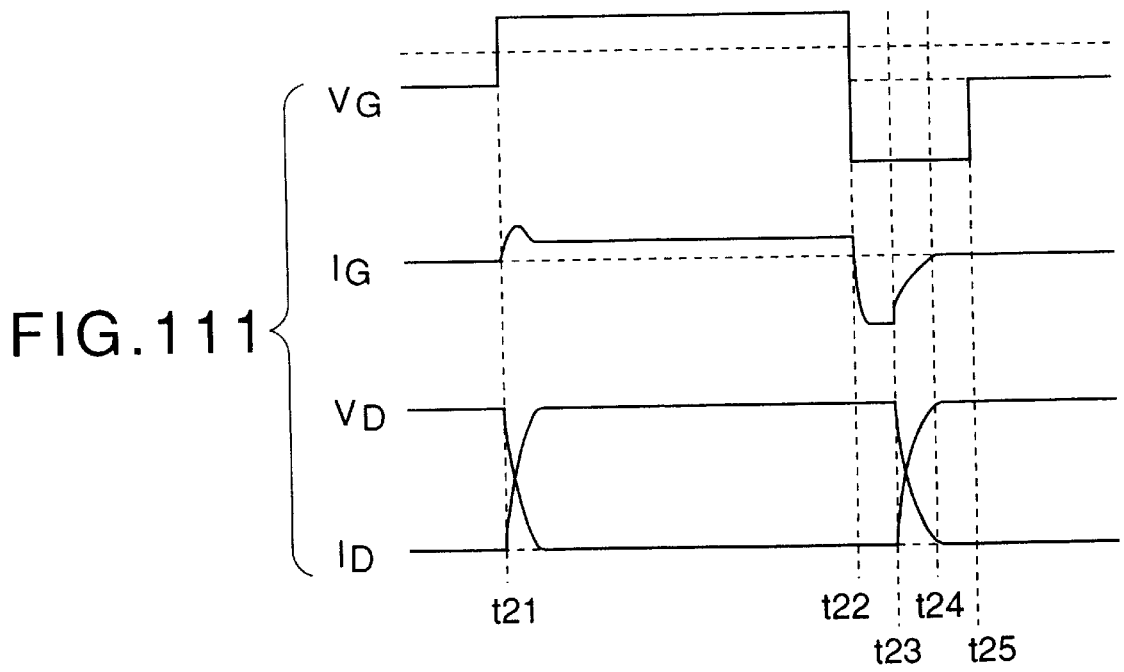
FIG. 111 is a timing chart for describing the operation in the 53rd embodiment.

The switching operation of this semiconductor device is performed by a gate driving method according to a timing chart of FIG. 111. In FIG. 111, the respective lines indicate, from above, a gate voltage V$_G$ of first and second gate electrodes 86 and 88, a gate current I$_G$ of second gate electrode 88, a drain voltage V$_D$, and a drain current I$_D$.

The gate voltage V$_G$ is set at the same value as V$_{G1}$ at the turn-on time and in the turn-on state, with the same timing as V$_{G2}$ in the 52nd embodiment, and at the same value as V$_{G2}$ at the turn-off time and in the turn-off state.

According to the present embodiment, the device can be controlled by using the single gate electrode terminal G. Therefore, the drive circuit can be simplified.

(54th Embodiment)

Figure 112:
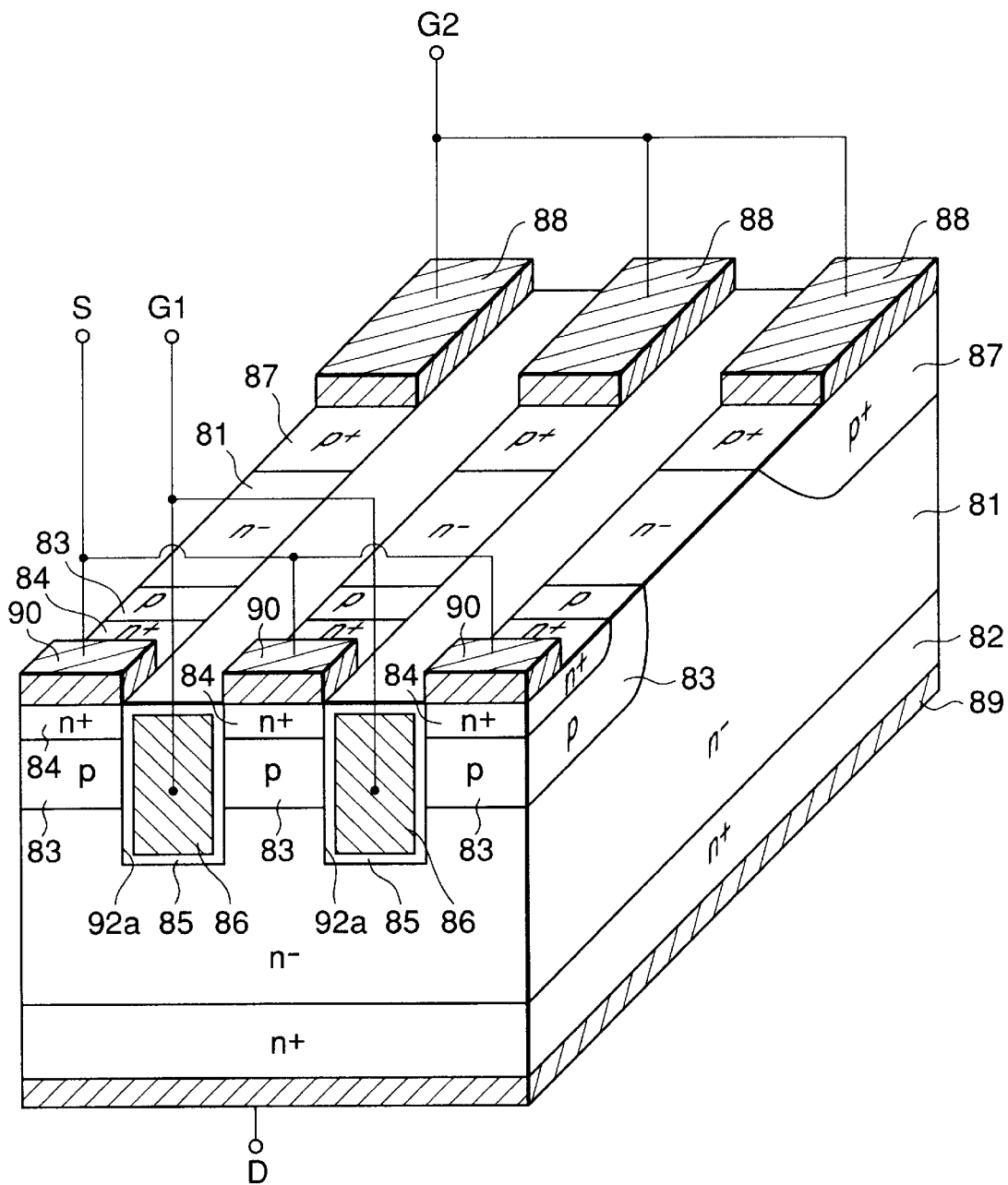
FIG. 112 is a perspective cross-sectional view showing the structure of a semiconductor device according to a 54th embodiment of the invention.

FIG. 112 is a perspective cross-sectional view showing the structure of a semiconductor device according to a 54th embodiment of the present invention. This embodiment relates to a modification of the trench structure. In the manufacturing process, striped p type base layers 83 and p+ type injection layers 87 are selectively formed at the surface of the n− type base layer 81 and are spaced apart from each other by a predetermined distance. Striped n+ source layers 84 are selectively formed at the surfaces of the p type base layers 83.

A plurality of trenches 92a constituting the trench structures are formed in the n+ type source layers 84, p type base layers 83, n− type base layers 81 and p+ type injection layers 87 in directions perpendicular to the extension of the striped p type base layers 83 and p+ type injection layers 87. The depth of each trench 92a is greater than each of the p type base layers 83 and p+ type injection layers 87. A first gate electrode 86 is buried in each trench 92a with a gate insulating film 85 interposed therebetween.

A second gate electrode 88 is formed on the p+ type injection layer 87, and a source electrode 90 is formed on the n+ type source layer 84. On the other hand, a drain electrode 89 is formed at the other surface of the n− type base layer 81 with an n+ type drain layer 82 interposed.

With this structure, too, the channel density can be increased by the trench structure, similarly with the above-described case.

Figure 113:
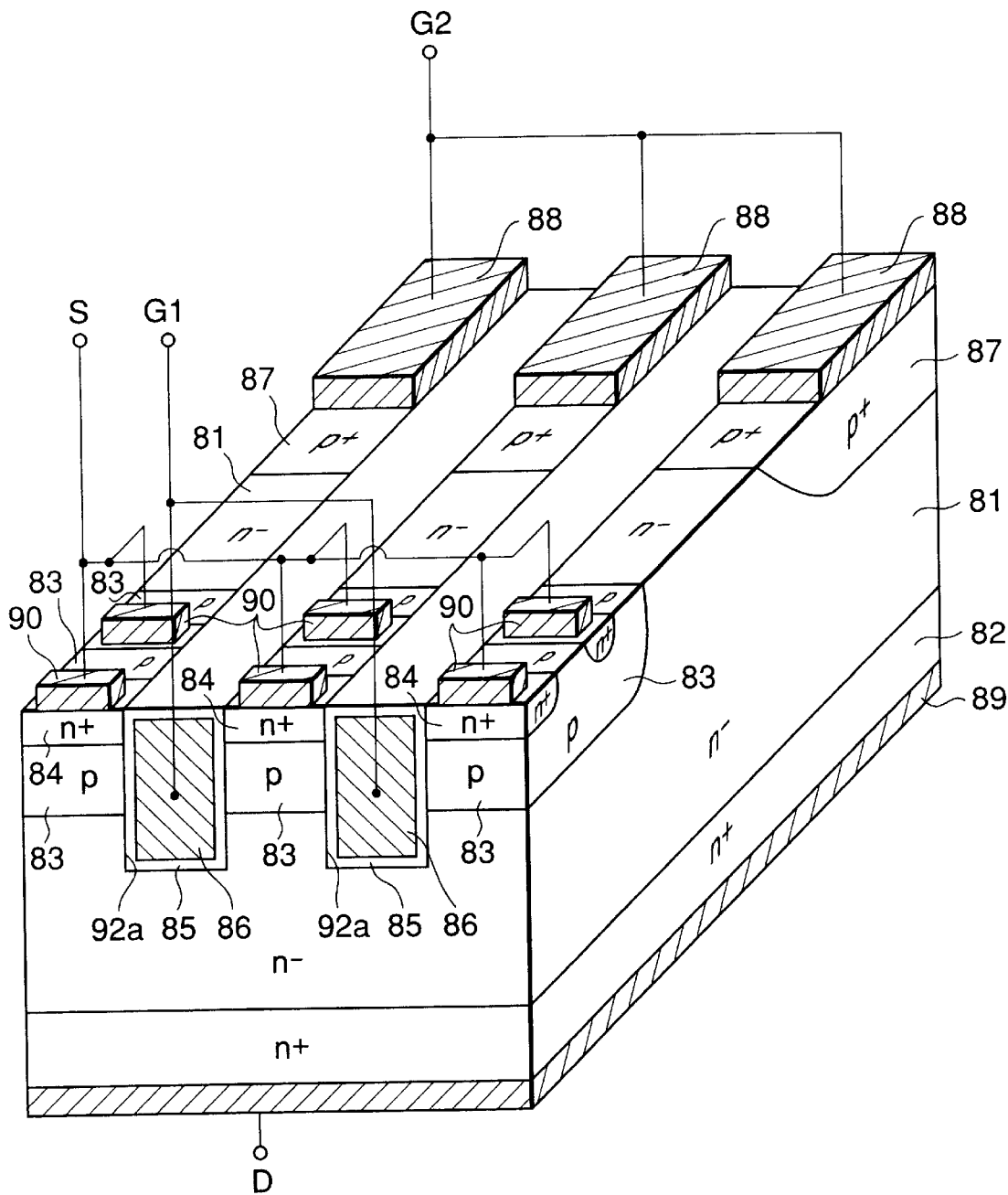
FIGS. 113 to 117 are perspective cross-sectional views showing modified structures of the 54th embodiment.

The present embodiment may be modified, as shown in FIG. 113, such that the n+ source layers 84 are selectively formed at the surface of the p+ type base layer 83 in a direction perpendicular to the longitudinal direction of the trench 92a, and the source electrode is put in contact with the n+ type source layers 84.

Figure 114:
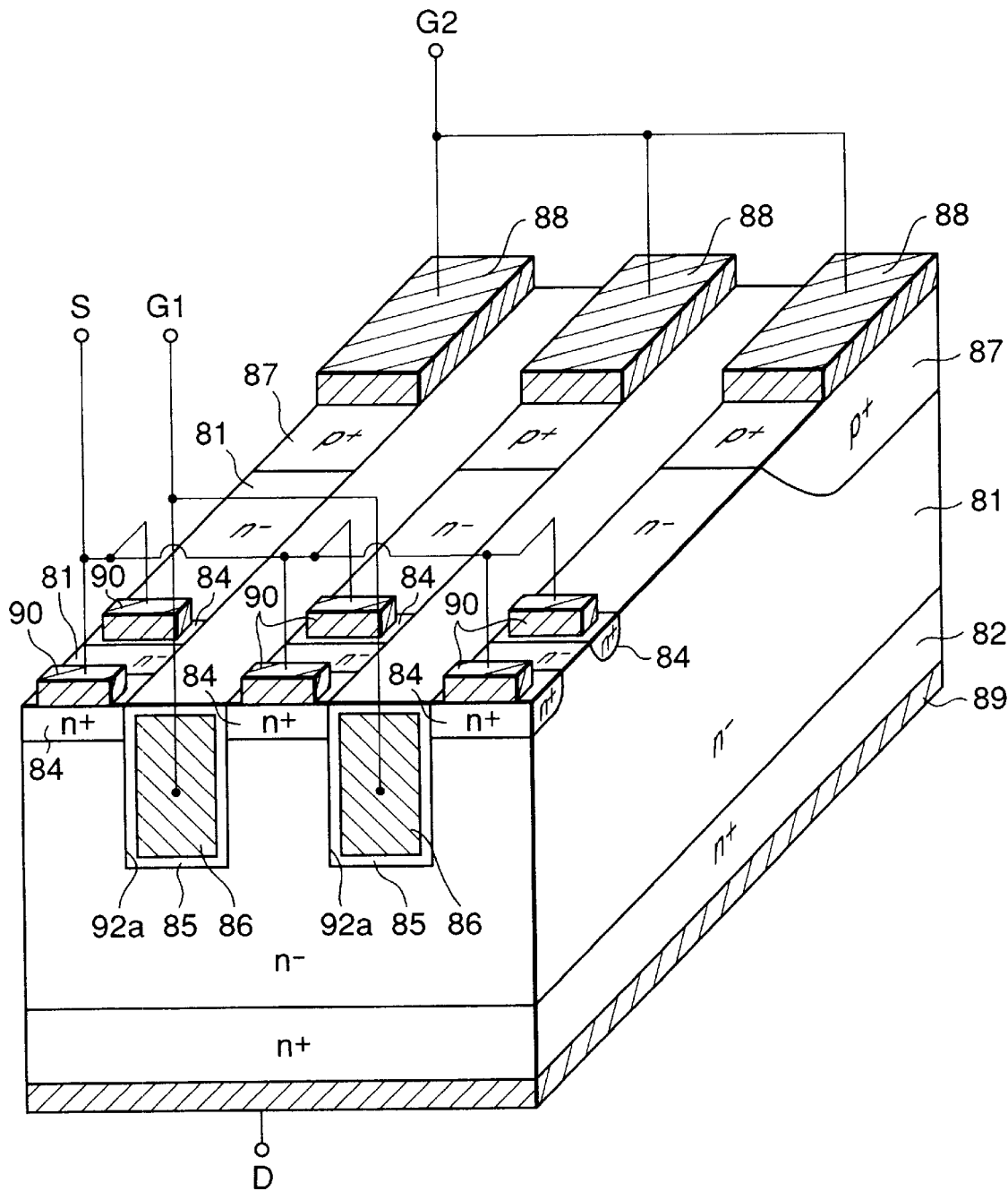

The present embodiment may be modified, as shown in FIG. 114, such that the n+ source layers 84 are selectively formed at the surface of the n− type base layer 81 in a direction perpendicular to the longitudinal direction of the trench 92a, and the source electrode is put in contact with the n+ type source layers 84.

Figure 115:
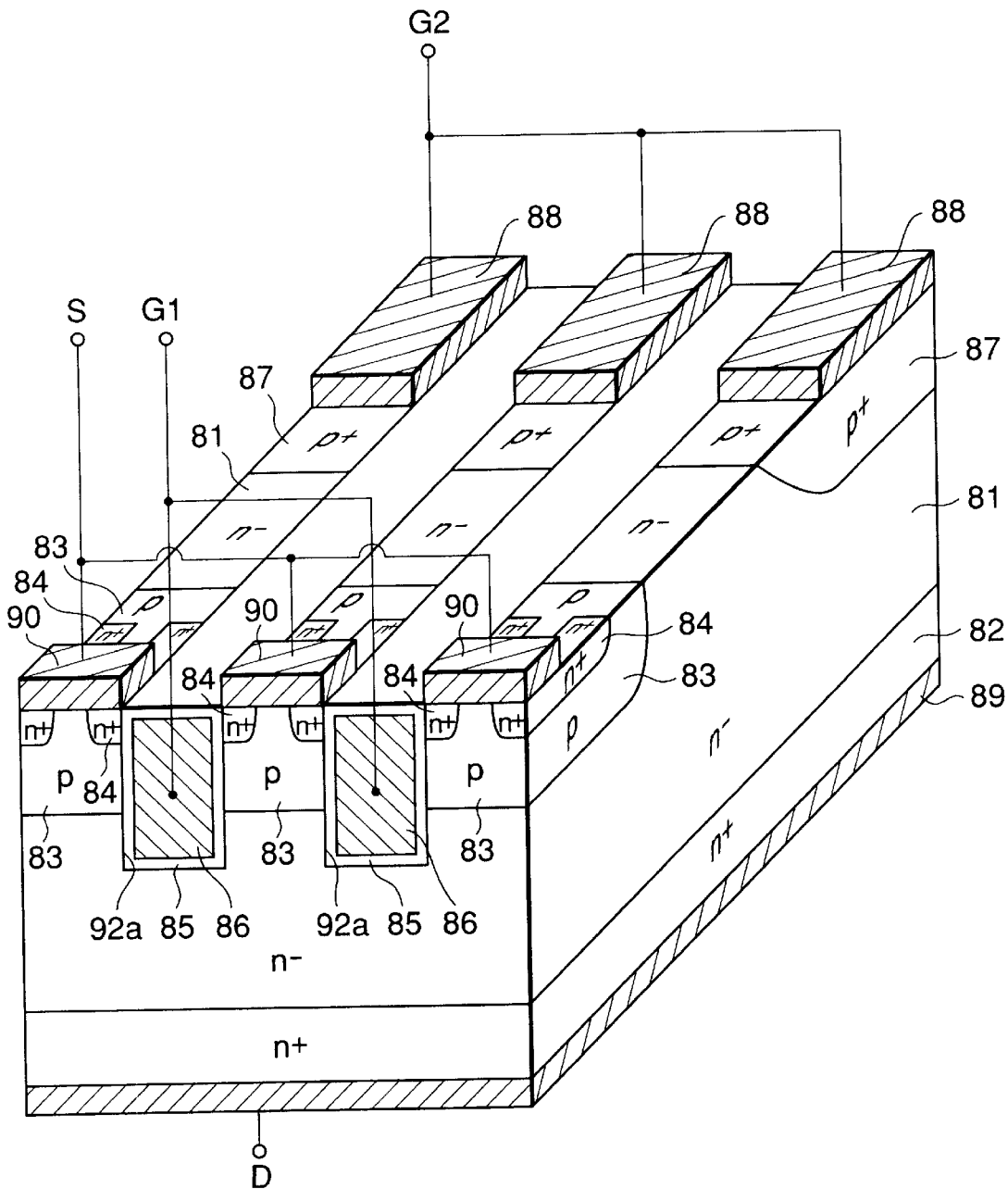

The present embodiment may be modified, as shown in FIG. 115, such that the n+ source layers 84 are selectively formed at the surface of the p+ type base layer 83 in parallel to the trench 92a, and the source electrode is put in contact with both n+ type source layers 84.

Figure 116:
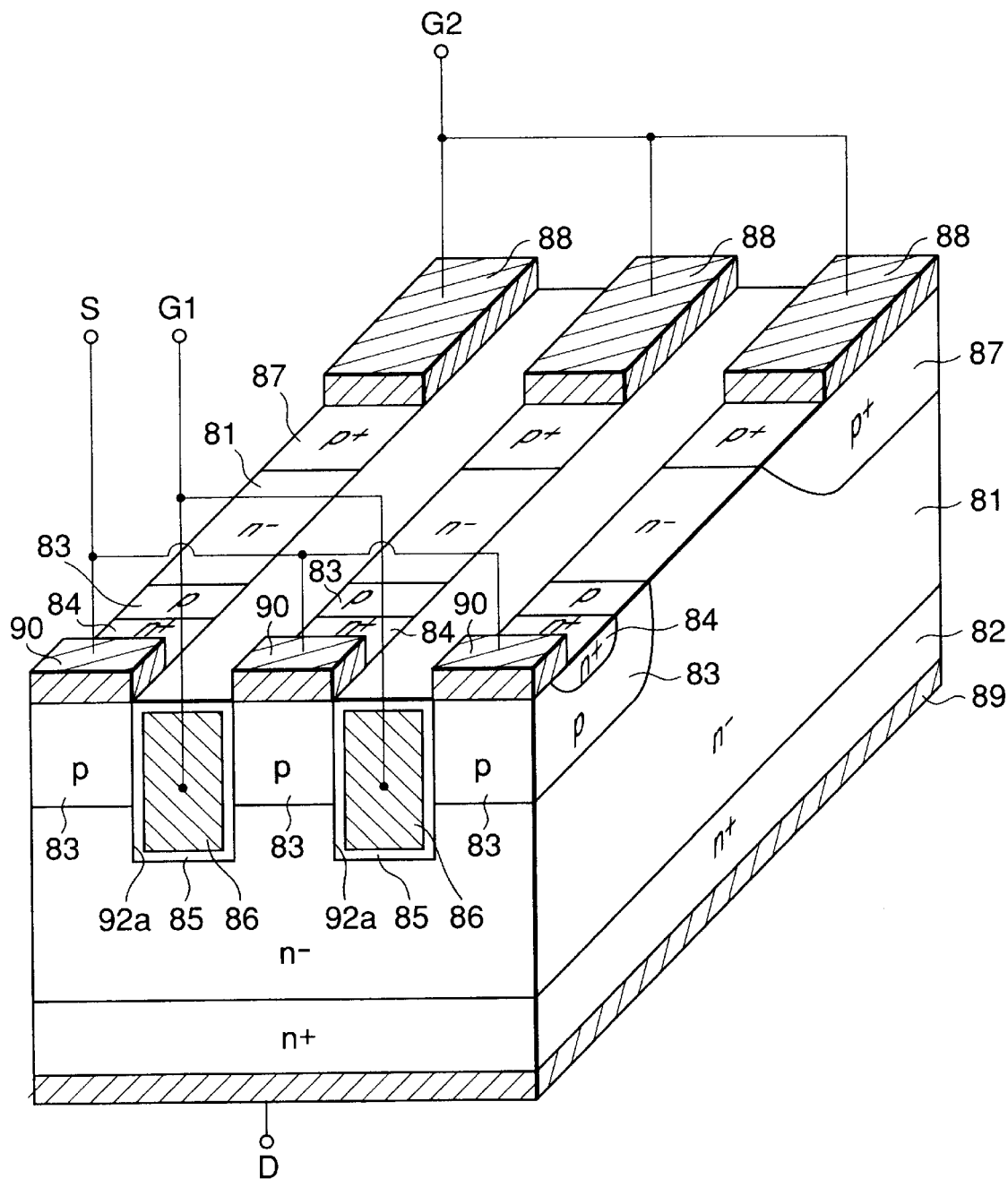

The present embodiment may be modified, as shown in FIG. 116, such that the n+ source layer 84 is selectively formed at the surface of the p+ type base layer 83, and the source electrode is put in contact with the p+ type base layer 83 and n+ type source layers 84.

Figure 117:
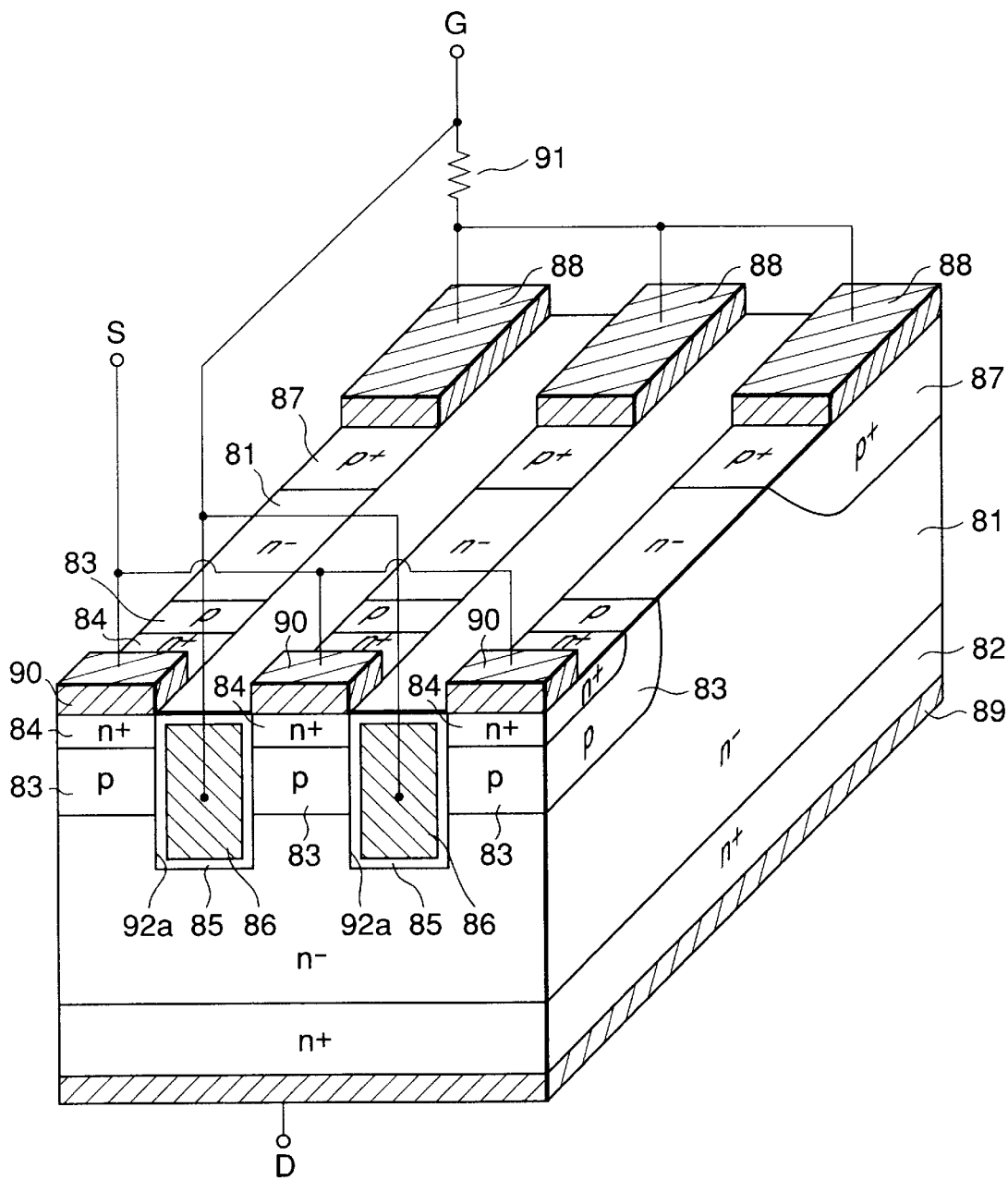

Furthermore, this embodiment and its modifications may adopt such a wiring structure that a line portion between the first gate electrode 86 and the terminal G connected to a gate drive circuit (not shown) is electrically connected to the second gate electrode 88 with a resistor 91 interposed, as shown representatively in FIG. 117. According to this modified wiring structure, like the structure shown in FIG. 90, the gate driving is simplified and a voltage applied to the first and second gate electrodes 86 and 88 can be easily adjusted by means of the resistor. (55th to 59th Embodiments)

The 55th through 59th embodiments of the present invention, which will be described below, relate to semiconductor devices applied to an inverter apparatus. Each semiconductor device is, for example, a power transistor T2 functioning as a main switching element. The semiconductor device is connected to a gate drive circuit 94 and includes a reverse-parallel freewheel diode. Specifically, each semiconductor device has a switching function when a forward bias is applied, and has conduction characteristics when a reverse bias is applied.

As shown in circuit block diagrams of FIGS. 118 and 119, a source-side reverse electromotive force is detected by a determination circuit 95 and an operation for setting the gate terminal G of power transistor T2 in a turn-on state is performed. Specific structures are disclosed in the 55th to 59th embodiments. With reference to the drawings showing the structures of 55th to 59th embodiments, the determination circuit 95 corresponds to a portion excluding the basic structure of a main switching element shown in FIG. 120 and being electrically connected to source-side wiring.

Figures 121, 122, 123:
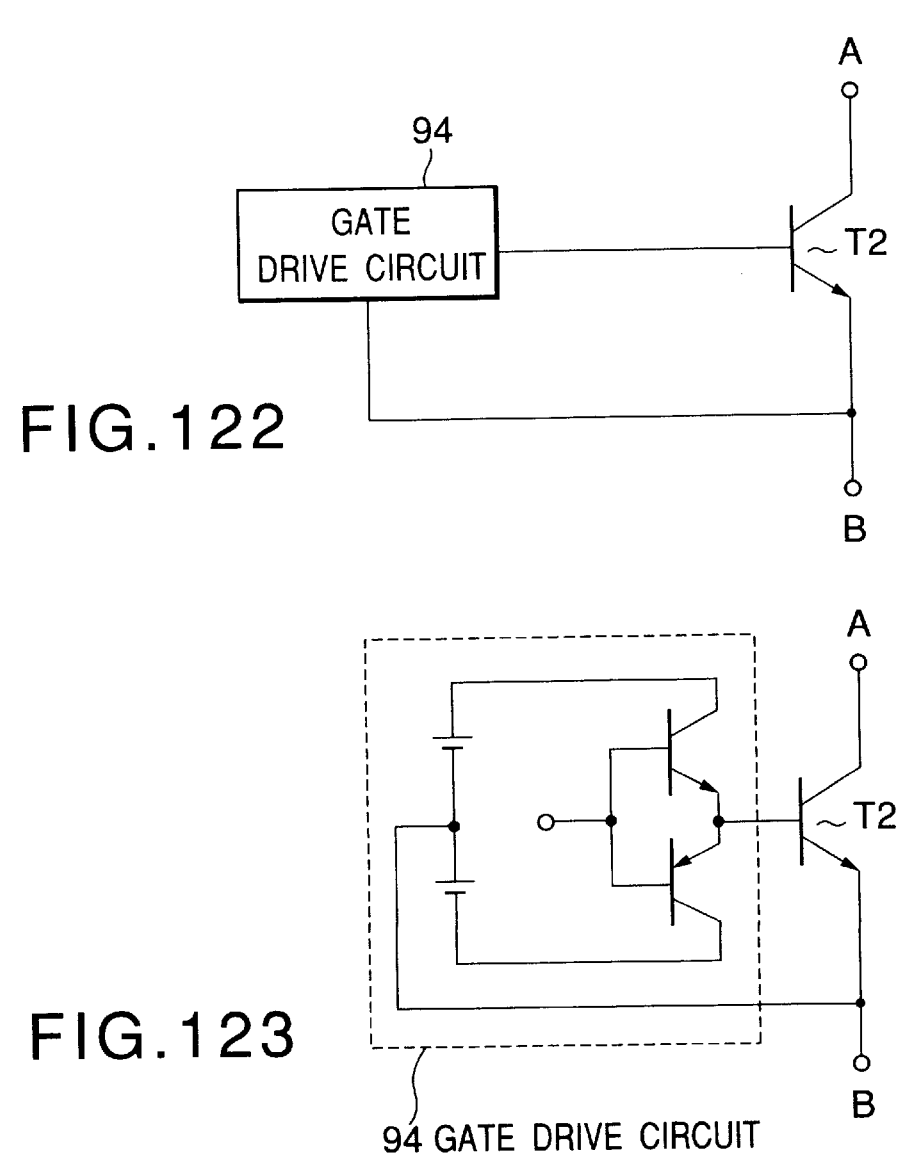
FIG. 121 is a circuit block diagram showing a function of the semiconductor device according to the present invention.
FIG. 122 is a circuit block diagram showing a function of the semiconductor device according to the present invention.
Figures 124, 125:
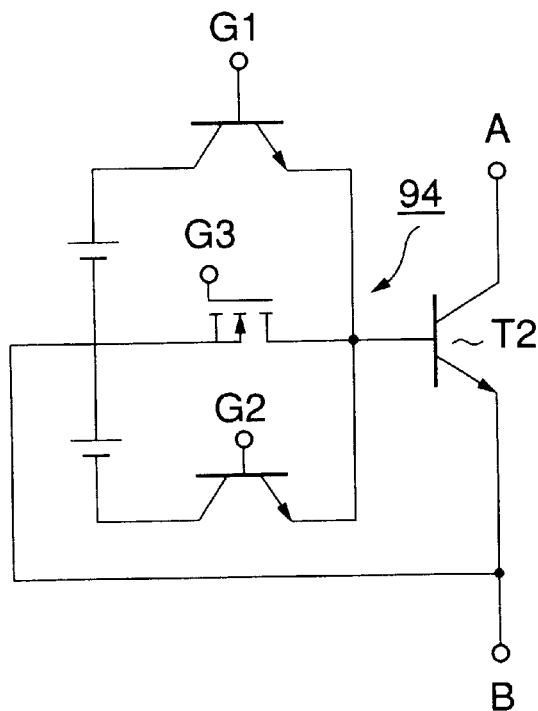

A second determination circuit 96 shown in FIG. 119 has a function of shutting off a gate drive signal from the gate drive circuit 94, when the source potential $V_S$ at the point-B of the power transistor T2 is higher than the drain potential $V_D$ at the point-A($V_S>V_D$) thereof. As is shown in FIG. 121, when the determination circuit 95 has detected a source-side reverse electromotive force, the gate drive circuit 94 may turn on the gate of power transistor T2. In addition, as shown in FIG. 122, the determination circuit 95 may be built in the gate drive circuit 94. FIG. 123 shows a basic structure of the gate drive circuit 94 applicable to the circuits shown in FIGS. 118, 119, 121 and 122. FIG. 124 shows a basic structure of the gate drive circuit 94 suitable for the circuit shown in FIG. 122.

(55th Embodiment)

FIG. 125 is a cross-sectional view showing the structure of a semiconductor device according to a 55th embodiment of the present invention. This semiconductor device is a modification of the structure shown in FIG. 80, etc. A first p+ type injection layer 87*a* is selectively formed at the surface of the n– type base layer 81 on one side of the p type base layer 83, and a second p+ type injection layer 87*b* is selectively formed at the n– type base layer 81 on the other side of the p type base layer 83.

The first and second p+ type injection layers 87*a* and 87*b* are spaced apart from the p type base layer 83 by a predetermined distance corresponding approximately to the length of diffusion of holes h. A first gate electrode 86 is formed on the first p+ type injection layer 87*a*, and a second gate electrode 88 is formed on the second p+ type injection layer 87*b*. A diode 101 is electrically connected between the second gate electrode 88 and source electrode 90 so that current may flow forwardly from the source electrode 90 to the second gate electrode 88. The diode 101 has the function of the determination circuit 95 shown in FIG. 118.

Figure 126:
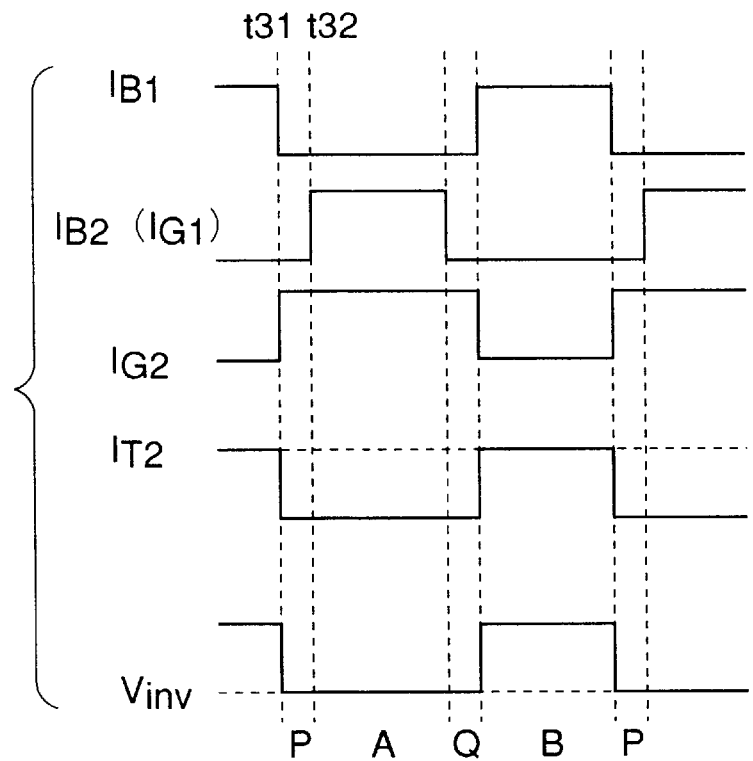

The operation of this semiconductor device will now be described with reference to the timing chart of FIG. 126. The respective lines in FIG. 126 indicate, from above, a base (gate) current $I_{B1}$ input to a semiconductor device of an upper arm (hereinafter referred to as "upper-arm device"), a base current $I_{B2}$ ((IG1) or a gate current to first gate electrode 86) input to a semiconductor device of a lower arm (hereinafter referred to as "lower-arm device"), a gate current $I_{G2}$ flowing through the second gate electrode 88 of the lower-arm device, a main current $I_{T2}$ flowing through the lower-arm device, and an output voltage $V_{INV}$ supplied to a load. Although described in detail below, the main current $I_{T2}$ of the lower-arm device flows reversely in synchronism with the turn-off state of the base current $I_{B1}$ of the upper-arm device.

When the upper-arm device is turned on (time t<$t_{31}$), a voltage which is negative relative to the source potential is applied to the first gate electrode 86 of the lower-arm device. Thereby, the lower-arm device is kept in the on-state, with the drain electrode 89 positively biased and the source electrode 990 negatively biased.

When the upper-arm device is turned off (time t=$t_{31}$), a reverse electromotive force occurs due to an induction load, and the drain electrode 89 of the lower-arm device is negatively biased while the source electrode 90 is positively biased.

Accordingly, the same positive voltage as applied to the source electrode 90 is applied to the second gate electrode 88 of the lower-arm device via the diode 101. In addition, the voltage of the source electrode 90 and second gate electrode 88 is increased, and a pn junction between the second p+ type injection layer 87*b* and n– type base layer 81 is forwardly biased. As a result, holes h are injected from the second p+ type injection layer 87*b* into the n– type base layer 81, and the semiconductor device is reversely turned on.

Consequently, the potential of the p type base layer 83 rises and exceeds the built-in voltage of the pn junction and electrons e are directly injected from the n+ type drain layer 82 to the p type base layer 83 via the n– type base layer 81.

As a result, a conductivity modulation occurs in the n– type base layer 81, and the device is rendered conductive at a low on-voltage. Further, after a predetermined dead time has passed since the upper-arm device was turned off, a voltage which is positive relative to the drain is applied to the first gate electrode 86 (time t=$t_{32}$) and thus the device can be rendered conductive at a still lower on-voltage. At this time, all hole current injected from the first gate electrode 86 and second gate electrode 88 entirely flows into the n– type base layer 81, unlike the conventional bipolar transistor.

Furthermore, since the first and second p+ type injection layers 87*a* and 87*b* are formed at predetermined distances from the p type base layer 83, the holes h are injected into a deep portion of the n– type base layer 81 and a conductivity modulation occurs.

By virtue of the above mechanism, in the present embodiment, the on-voltage is much more decreased than in the case where the conventional bipolar transistor is reversely rendered conductive. In other words, a necessary gate current is reduced, and a current gain (DC amplification factor: $h_{FS}=I_D/I_G$) is increased.

Figure 127:
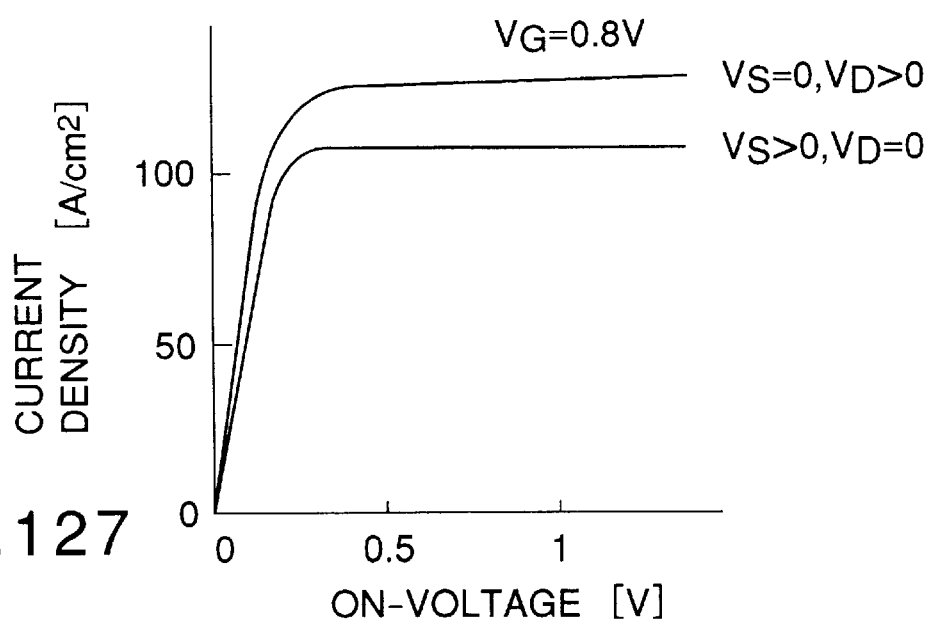

FIG. 127 show on-characteristics of a forward current and a reverse current in the semiconductor device shown in FIG. 125. As is shown in FIG. 127, unlike the IGBT, no voltage drop due to a pn junction occurs and a current starts from zero voltage. Therefore, a low on-voltage can be obtained. Moreover, since the first and second p+ type injection layers 87*a* and 87*b* are spaced apart from the p type base layer 83 by predetermined distances, the on-characteristics of the reverse current are almost equal to those of the forward current.

Figure 128:
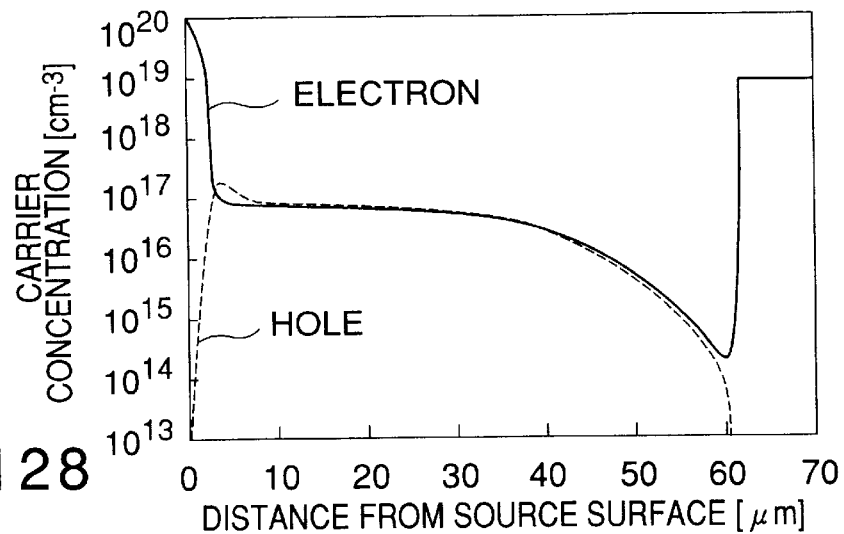
Figure 129:
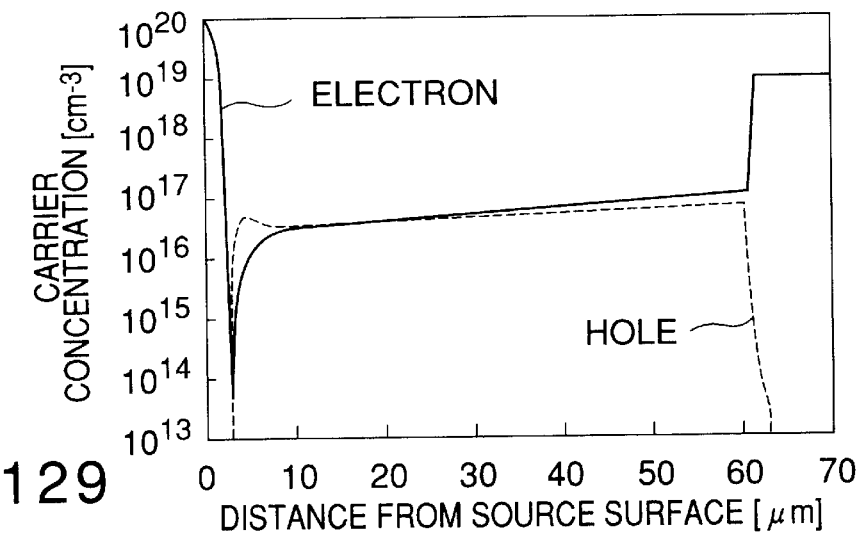

FIG. 128 and FIG. 129 show carrier distributions in forwardly and reversely turned-on states. It is understood that in either case electrons e and holes h are injected in a deep portion of the n– type base layer 81 and a conductivity modulation occurs.

According to the present embodiment, as described above, the semiconductor device has the function of the reverse-parallel freewheel diode, the switching function in the forward current path direction, and the conduction characteristics in the reverse current path direction. Accordingly, if a reverse electromotive force occurs due to an induction load, the semiconductor device is automatically turned on in the reverse current path direction. Therefore, the reverse-parallel freewheel diode can be dispensed with, and a small-sized, high-performance semiconductor device with high current density and high operation speed can be provided.

(56th Embodiment)

Figure 130:
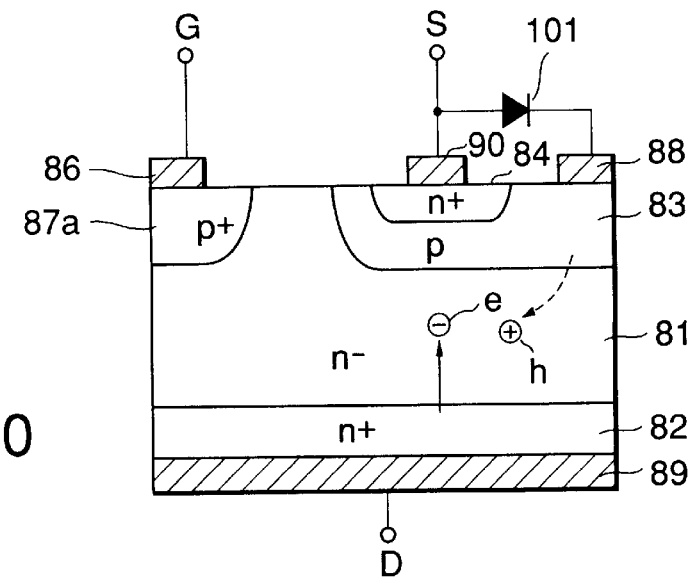

FIG. 130 is a cross-sectional view showing the structure of a semiconductor device according to a 56th embodiment of the present invention. This embodiment is a modification of the 55th embodiment of the invention. In this embodiment, the area of the p type base layer 83 is expanded to include the second p+ type injection layer 87b. With this structure, too, the same advantages as with the 55th embodiment can be obtained.

(57th Embodiment)

Figure 131:
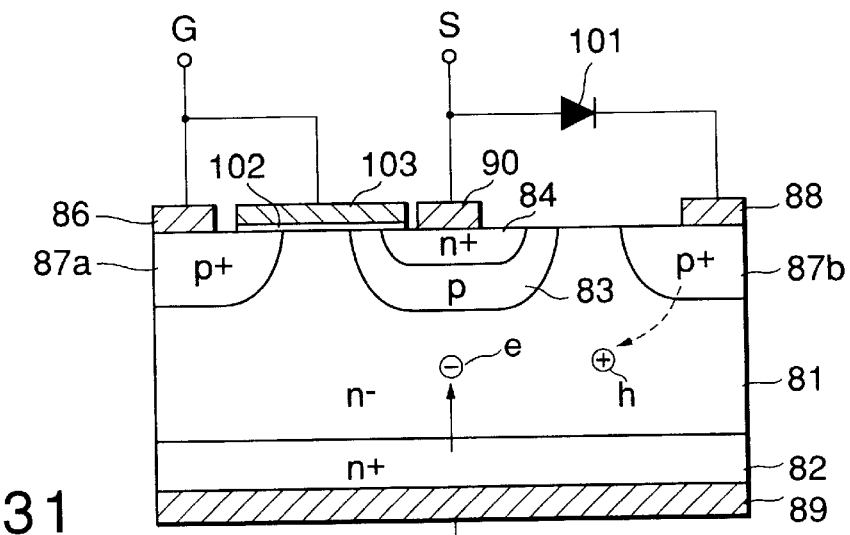

FIG. 131 is a cross-sectional view showing the structure of a semiconductor device according to a 57th embodiment of the invention. This embodiment is a modification of the 55th embodiment, and the operations at the time of turn on/off are modified. Specifically, a gate electrode 103 is provided over the p type base layer 83 and n− type base layer 81, which are located between the first p+ type injection layer 87a and n+ type source layer 84, with a gate insulating film 102 interposed.

With this structure, if a positive voltage is applied to the gate electrodes 86 and 103 at the time of turn-on in the state in which a positive voltage is applied to the drain electrode 89 and a negative voltage is applied to the source electrode 90, the polarity of a surface portion of the p type base layer 83 below the gate electrode 103 is reversed and this surface portion becomes a channel. Electrons e are injected from the n+ type source layer 84 into the n− type base layer 81 via the channel. At the same time, the positive voltage applied to the gate electrode 86 causes holes h to be injected from the p+ type injection layer 87a into the n− type base layer 81. Thereby, a conductivity modulation occurs in the n- type base layer 81, and a source-drain path is rendered conductive at a low voltage.

On the other hand, like the structure shown in FIG. 102, at the time of turn-off, a negative voltage is applied to both gate electrodes 86 and 103. The holes h accumulated in the n− base layer 81 are discharged to the outside of the device via the p+ type injection layer 87a. With the discharge of holes h, the potential of the p type base layer 83 lowers below the built-in voltage of pn junction. As a result, the electron injection from the n+ type source layer 84 is stopped, and the device is turned off.

Similarly with the structure shown in FIG. 102, in the turn-off state following the turn-off time, a negative voltage which is negative relative to the source is applied to both gate electrodes 86 and 103. Thereby, the potential of the p type base layer 83 is fixed at a negative level through the p-channel region CH2 under the gate electrode 103 and the p+ type injection layer 87a. Thus, an erroneous trigger due to noise can be prevented.

As regards the reverse conduction state, the same operations as in the 55th embodiment are performed and the same advantages are obtained.

(58th Embodiment)

Figure 132:
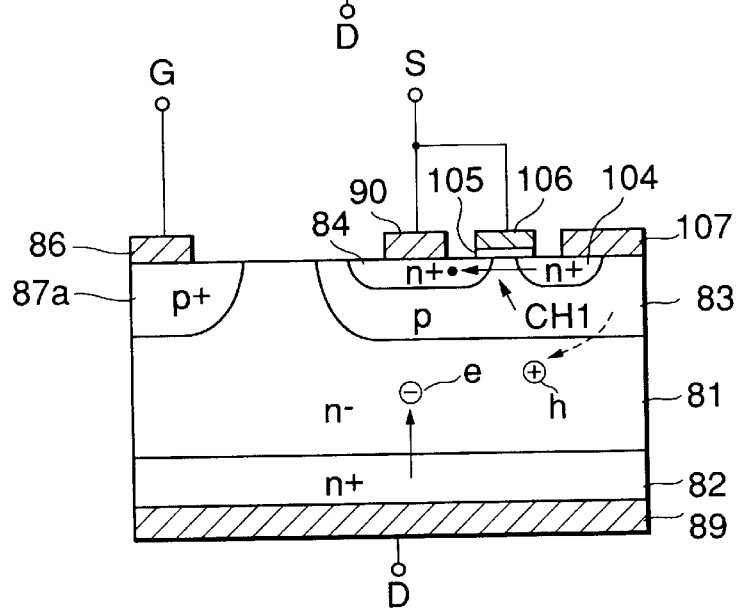

FIG. 132 is a cross-sectional view showing the structure of a semiconductor device according to a 58th embodiment of the invention. In this semiconductor device, unlike the structure shown in FIG. 125, the diode 101 is not provided, and the p type base layer 83 is formed to integrally include the second p+ type injection layer 87b. An n+ type layer 104 is formed in the p type base layer 83 at a position away from the n+ type source layer 84 by a predetermined distance. A second gate electrode 106 is formed over the p type base layer 83 between the n+ type source layer 84 and n+ type layer 104, with a gate insulating film 105 interposed. An n-channel MOSFET having a channel region CH1 is constituted by the second gate electrode 106, gate insulating film 105, n+ type source layer 84, p type base layer 83 and n+ type layer 104. An electrode 107 is formed on the n+ type layer 104 so as to be short-circuited to the p type base layer 83.

The operation of this semiconductor device will now be described.

The operation in the turn-on state is the same as stated above. Specifically, in the state in which the drain electrode 89 is positively biased and the source electrode 90 is negatively biased, the first gate electrode 86 is positively biased. Thereby, holes h are injected from the first gate electrode 86 into the n− type base layer 81 via the p+ type injection layer 87a. Accordingly, the potential of the p type base layer 83 rises and exceeds the built-in voltage of the pn junction, and electrons e are directly injected from the n+ type drain layer 82 to the p type base layer 83 via the n− type base layer 81. As a result, a conductivity modulation occurs in the n− type base layer 81, and the semiconductor device is rendered conductive at a low on-voltage.

If the upper-arm device is turned off while the lower-arm device is turned off, a reverse electromotive force occurs due to an induction load and the drain electrode 89 of the lower-arm device is negatively biased. In addition, the source electrode 90 and second gate electrode 106 are positively biased. The voltages of the source electrode 90 and second gate electrode 106 rise and the voltage of the surface of the p type base layer 83 below the second gate electrode 106 exceeds the threshold value. Consequently, the channel region CH1 is rendered conductive, and the pn junction of the p type base layer 83 and n− type base layer 81 is forwardly biased, and holes h are injected from the p type base layer 83 into the n− type base layer 81. Thus, the semiconductor device is reversely turned on.

Accordingly, the potential of the p type base layer 83 rises and exceeds the built-in voltage of the pn junction, and electrons e are directly injected from the n+ type drain layer 82 to the p type base layer 83 via the n− type base layer 81. As a result, a conductivity modulation occurs in the n− type base layer 81, and the semiconductor device is rendered conductive at a low on-voltage.

As has been described above, according to the present invention, the n-channel MOSFET structure, which is rendered conductive if the source potential rises, is formed at the surface of the p type base layer 83. In addition, the electrode 107 is provided between the n+ type layer 104 and p type base layer 83 of the n-channel MOSFET structure. Thus, when the reverse electromotive force due to the induction load is applied to the second gate electrode 106, the n− channel MOSFET is rendered conductive, the electrode 107 has a positive potential relative to the drain, and the holes h are injected from the p type base layer 83 into the n− type base layer 81. Therefore, the device can be turned on in the reverse current direction.

(59th Embodiment)

Figure 133:
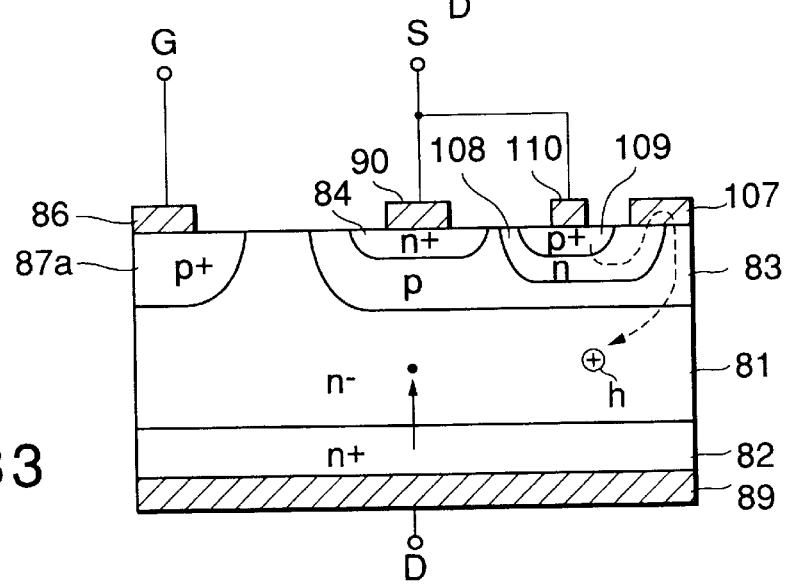

FIG. 133 is a cross-sectional view showing the structure of a semiconductor device according to a 59th embodiment of the invention. This embodiment is a modification of the 58th embodiment. Specifically, in place of the n-channel MOSFET structure, an n type layer 108 is selectively formed in a surface portion of the p type base layer 83 separately from the n+ type source layer 84, and a p type layer 109 is selectively formed at the surface of the n type layer 108. A detection electrode 110 is formed on the p type layer 109. The detection electrode 110 is electrically connected to the source electrode 90 via a wiring layer. An electrode 107 for short-circuiting the n type layer 108 and p type base layer 83 is formed on an interface portion thereof.

A pn diode comprising the detection electrode 110, p type layer 109 and n type layer 108; a pn diode comprising the electrode 107, p type base layer 83, n− type base layer 81 and n+ type drain layer 82; and a drain electrode 89 are formed in the named order from above.

With the above structure, if the source electrode 90 is positively biased at the time of turn-off, the pn diode comprising the p type layer 109 and n type layer 108 is rendered conductive, and the electrode 107 is biased positively relative to the drain. Thereby, a positive voltage is applied to the p type base layer, holes h are injected from the p type base layer 83 into the n– type base layer 81, and a hole current flows.

Subsequently, like the above-described case, electrons e are injected from the drain layer 82 into the n– type base layer 81, a conductivity modulation occurs in the n– type base layer 81, and the device is turned on in the reverse current direction.

According to the present embodiment, as described above, the pn diode having the source on the forward bias side is formed in the p type base layer 83. Thus, like the structure shown in FIG. 125, the semiconductor device having conduction characteristics in the reverse current direction can be achieved. Needless to say, this device has an ordinary switching function in the forward current direction.

(60th Embodiment)

Figure 134:
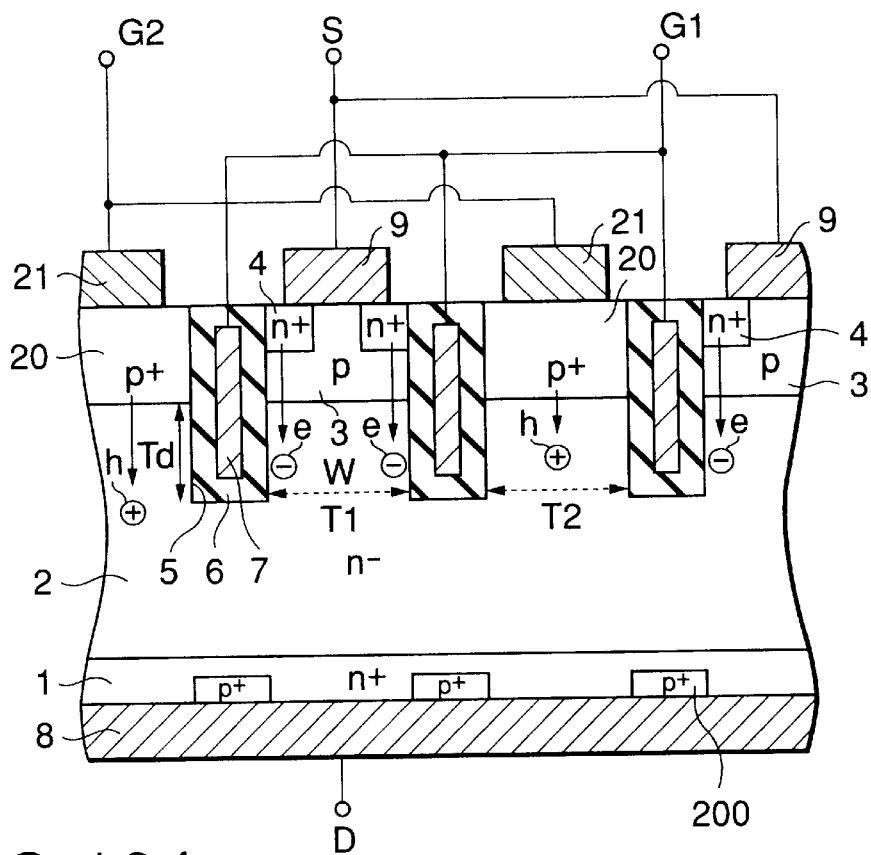

FIG. 134 is a cross-sectional view showing the structure of a semiconductor device according to a 60th embodiment of the present invention. This embodiment is a modification of the first embodiment. Specifically, as shown in FIG. 134, high-concentration p+ type layers 200 are selectively formed in a surface portion of the n+ type drain layer 1 so as to be in contact with the drain electrode 8. Since the p+ type layers 200 may be formed anywhere at the interface between the n+ type drain layer 1 and drain electrode 8, the regions of formation of p+ type layers 200 are not limited to those shown in FIG. 134. Although the plan-view shapes of p+ type layers 200 are not shown, the p+ type layers 200 may have desired plan-view shapes, for example, dot-like shapes, striped shapes, short-striped shaped, etc.

The advantageous effects of the 60th embodiment will now be described in comparison with the device of the first embodiment. The device of the first embodiment has a carrier distribution in the on-state, as shown in FIG. 105. The on-state voltage at this time is 1 V. If a voltage is further applied to the device, a carrier-free high electric field layer forms on the drain side, as shown in FIG. 135. If the applied voltage is increased, an electric current sharply increases, as shown in FIG. 136, and the device is broken. In other words, in the device of the first embodiment, a high electric current concentrates on the drain side, and the device may be destroyed.

On the other hand, the device of the 60th embodiment has the high-concentration p+ type layers 200 at a drain-side portion thereof. When a on-state voltage is low, holes are not injected. However, when the on-state voltage rises to a predetermined level, holes are injected and a substantially fixed carrier distribution, as shown in FIG. 137, is obtained. Specifically, according to the device of the present embodiment, a voltage is applied to the entire body of the n– type base layer 2 because of such a substantially fixed carrier distribution, and thus a high electric-field region does not form and the device is not easily destroyed.

When the n+ type drain layer 1 and p+ type layers 200 are designed, it will suffice, for example, to set the concentration of that portion of the n+ type drain layer 1, which is in contact with the p+ type layer 200, at $1 \times 10^{17}$ cm$^{-2}$ or more, and to set the width of the p+ type layer 200 at about 10 μm or less, so that holes may not be injected in a conductive state in which a turn-on voltage is low.

According to the present embodiment, as has been described above, in addition to the advantages of the first embodiment, the breakdown voltage can be increased since the applied voltage is distributed to the entirety of the n– type base layer 2.

The drain structure of the present embodiment is applicable not only to the first embodiment but also to the second to 59th embodiments. In each embodiment, the breakdown voltage of the device can be remarkably increased.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

We claim:

1. A semiconductor device comprising:
   a high-resistance first-conductivity-type base layer;
   a first-conductivity-type drain layer formed on one surface of the first-conductivity-type base layer;
   a second-conductivity-type base layer formed at the other surface of the first-conductivity-type base layer;
   a first-conductivity-type source layer formed at one surface of the second-conductivity-type base layer;
   a second-conductivity-type injection layer formed at said other surface of the first-conductivity-type base layer in a region different from a region where the second-conductivity-type base layer is formed;
   a trench formed at said other surface of the first-conductivity-type base layer between the second-conductivity-type base layer and the second-conductivity-type injection layer so as to extend from a surface of the first-conductivity-type source layer through the second-conductivity-type base layer into the first-conductivity-type base layer, the trench serving as a carrier barrier between the second-conductivity-type injection layer and the first-conductivity-type source layer;
   a first gate electrode buried in the trench with an insulating film interposed;
   a first main electrode formed on the first-conductivity-type drain layer;
   a second main electrode formed on the first-conductivity-type source layer; and
   a second gate electrode formed on the second-conductivity-type injection layer.

2. The semiconductor device according to claim 1, wherein a second-conductivity type layer is selectively formed in a surface portion of the first-conductivity type drain layer, which is in contact with the first main electrode.

3. The semiconductor device according to claim 1, wherein the first and second gate electrodes are electrically connected to each other.

4. A semiconductor device according to claim 1, wherein the second main electrode is in contact with a first-conductivity-type semiconductor layer including the first-conductivity-type source layer, but the second main electrode is not in contact with a second-conductivity-type semiconductor layer including the second-conductivity-type base layer.

5. A semiconductor device according to claim 1, wherein the trench has a plurality of trench side portions, and wherein a width of the second-conductivity-type base layer between the trench side portions is less than a width of the second-conductivity-type injection layer between the trench side portions.

6. A semiconductor device comprising:
   a high-resistance first-conductivity-type base layer;

a first-conductivity-type drain layer formed on one surface of the first-conductivity-type base layer;

a second-conductivity-type base layer formed at the other surface of the first-conductivity-type base layer;

a first-conductivity-type source layer formed at one surface of the second-conductivity-type base layer;

a first gate electrode formed at the second-conductivity-type base layer between the first-conductivity-type base layer and the first-conductivity-type source layer, with a gate insulating film interposed;

a second-conductivity-type injection layer formed at said other surface of the first-conductivity-type base layer in a region spaced apart from the second-conductivity-type base layer by a predetermined distance;

a first main electrode formed on the first-conductivity-type drain layer;

a second main electrode formed on the first-conductivity-type source layer; and a second gate electrode formed on the second-conductivity-type injection layer, wherein the second main electrode is in contact with a first-conductivity-type semiconductor layer including the first-conductivity-type source layer, but the second main electrode is not in contact with a second-conductivity-type semiconductor layer including the second-conductivity-type base layer.

7. The semiconductor device according to claim 6, wherein the first gate electrode is provided on the second-conductivity-type base layer and the first-conductivity-type base layer between the first-conductivity-type source layer and the second-conductivity-type injection layer, with the gate insulating film interposed.

8. A semiconductor device comprising:

a high-resistance first-conductivity-type base layer;

a first-conductivity-type drain layer formed on one surface of the first-conductivity-type base layer;

a second-conductivity-type base layer formed at the other surface of the first-conductivity-type base layer;

a first-conductivity-type source layer formed at one surface of the second-conductivity-type base layer;

first gate electrode formed at the second-conductivity-type base layer between the first-conductivity-type base layer and the first-conductivity-type source layer, with a gate insulating film interposed;

a second-conductivity-type injection layer formed at said other surface of the first-conductivity-type base layer in a region spaced apart from the second-conductivity-type base layer by a predetermined distance;

a first main electrode formed on the first-conductivity-type drain layer;

a second main electrode formed on the first-conductivity-type source layer; and a second gate electrode formed on the second-conductivity-type injection layer, wherein the first gate electrode is buried in a trench extending from a surface of the first-conductivity-type source layer through the second-conductivity-type base layer into the first-conductivity-type base layer, with said gate insulating film interposed.

9. A semiconductor device according to claim 8, wherein the second main electrode is in contact with a first-conductivity-type semiconductor layer including the first-conductivity-type source layer, but the second main electrode is not in contact with a second-conductivity-type semiconductor layer including the second-conductivity-type base layer.

10. A semiconductor device comprising:

a high-resistance first-conductivity type base layer;

a first-conductivity-type drain layer formed on one surface of the first-conductivity-type base layer;

a second-conductivity-type base layer formed at the other surface of the first-conductivity-type base layer;

a first-conductivity-type source layer formed at one surface of the second-conductivity-type base layer;

a second-conductivity-type injection layer formed at said other surface of the first-conductivity-type base layer in a region spaced apart from the second-conductivity-type base layer by a predetermined distance;

a first main electrode formed on the first-conductivity-type drain layer;

a second main electrode formed on the first-conductivity-type source layer; and a gate electrode formed on the second-conductivity-type injection layer, wherein the second main electrode is in contact with a first-conductivity-type semiconductor layer including the first-conductivity-type source layer, but the second main electrode is not in contact with a second-conductivity-type semiconductor layer including the second-conductivity-type base layer.

* * * * *

UNITED STATES PATENT AND TRADEMARK OFFICE
CERTIFICATE OF CORRECTION

PATENT NO. : 6,114,727
DATED : September 5, 2000
INVENTOR(S) : Tsuneo Ogura, et al.

Page 1 of 1

It is certified that error appears in the above-identified patent and that said Letters Patent is hereby corrected as shown below:

On the title page, item [54], and at the top of Column 1, the title should be:

— [54] SEMICONDUCTOR POWER MOSFET DEVICE WITH CHARGE CARRIER INJECTION —

And also on the title page, item [30], Foreign Priority Information, the second priority date should read as follows:

Jan. 9, 1997 [JP]................................9-001765
Sep.18, 1997 [JP] ...............................9-270367

Signed and Sealed this

Fifth Day of June, 2001

*Attest:*

*Attesting Officer*

NICHOLAS P. GODICI

*Acting Director of the United States Patent and Trademark Office*